United States Patent
Hata et al.

(10) Patent No.: US 8,062,829 B2
(45) Date of Patent: Nov. 22, 2011

(54) CHEMICALLY AMPLIFIED RESIST COMPOSITION AND CHEMICALLY AMPLIFIED RESIST COMPOSITION FOR IMMERSION LITHOGRAPHY

(75) Inventors: Mitsuhiro Hata, Toyonaka (JP); Yusuke Fuji, Ibaraki (JP); Takayuki Miyagawa, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 180 days.

(21) Appl. No.: 12/395,963

(22) Filed: Mar. 2, 2009

(65) Prior Publication Data

US 2009/0220890 A1    Sep. 3, 2009

(30) Foreign Application Priority Data

Mar. 3, 2008   (JP) .................. 2008-052069

(51) Int. Cl.
*G03F 7/004* (2006.01)
*G03F 7/30* (2006.01)

(52) U.S. Cl. .............. 430/270.1; 430/326; 430/330; 430/905; 430/910; 430/921

(58) Field of Classification Search .......... 430/270.1, 430/326, 330, 905, 910, 921
See application file for complete search history.

(56) References Cited

U.S. PATENT DOCUMENTS

| 7,078,562 | B2 * | 7/2006 | Furukawa et al. | 560/219 |
| 7,368,218 | B2 * | 5/2008 | Hatakeyama et al. | 430/270.1 |
| 2001/0026901 | A1 | 10/2001 | Maeda et al. | |
| 2005/0158662 | A1 * | 7/2005 | Furukawa et al. | 430/281.1 |
| 2007/0184382 | A1 * | 8/2007 | Yamaguchi et al. | 430/270.1 |
| 2007/0218403 | A1 | 9/2007 | Maeda et al. | |
| 2009/0023878 | A1 | 1/2009 | Maeda et al. | |

FOREIGN PATENT DOCUMENTS

| JP | 11-52575 A | 2/1999 |
| JP | 2000-26446 A | 1/2000 |
| JP | 2006-16379 A | 1/2006 |

* cited by examiner

*Primary Examiner* — John Chu
(74) *Attorney, Agent, or Firm* — Birch, Stewart, Kolasch & Birch, LLP

(57) ABSTRACT

A chemically amplified resist composition, comprising: a resin which includes a structural unit having an acid-labile group in a side chain, a structural unit represented by the formula (I) and a structural unit having a polycyclic lactone structure, and which is soluble in an organic solvent and insoluble or poorly soluble in an alkali aqueous solution but rendered soluble in an alkali aqueous solution by the action of an acid; and an acid generator represented by the formula (II).

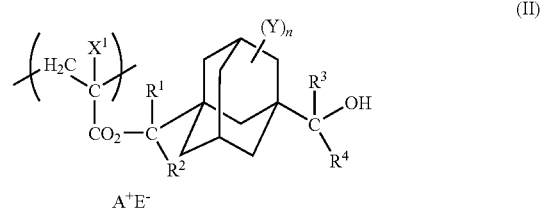

wherein $X^1$ represents a hydrogen atom, a $C_1$ to $C_4$ alkyl group, etc., Y in each occurrence independently represent a hydrogen atom or an alkyl group, and n is an integer of 1 to 14, $R^1$ to $R^4$ independently represent a hydrogen atom, an alkyl group, etc., and $A^+$ represents an organic counterion, $E^-$ represents $CF_3SO_3-$, $C_2F_5SO_3-$, $C_4F_9SO_3-$, etc., $Y^1$ and $Y^2$ independently represent a fluorine atom or a $C_1$ to $C_6$ perfluoroalkyl group.

12 Claims, No Drawings

CHEMICALLY AMPLIFIED RESIST COMPOSITION AND CHEMICALLY AMPLIFIED RESIST COMPOSITION FOR IMMERSION LITHOGRAPHY

BACKGROUND OF THE INVENTION

1. Field of the Invention

The present invention relates to a chemically amplified resist composition and a chemically amplified resist composition for immersion lithography, and more specifically relates to a chemically amplified positive resist composition and a chemically amplified positive resist composition for immersion lithography which are used in semiconductor microfabrication.

2. Background Information

Lithographic exposure sources that are used in semiconductor microfabrication include g rays (wavelength of 436 nm), i rays (wavelength of 365 nm), KrF excimer lasers (wavelength of 248 nm), ArF excimer lasers (wavelength of 193 nm), $F_2$ excimer lasers (wavelength of 157 nm), and extreme ultraviolet light (EUV) (wavelength of 13.5 nm). Immersion lithography, on the other hand, is another technique in which resolution and depth of focus are improved without changing the exposure wavelength. In immersion lithography, the space between the lens and photoresist is filled with a medium having a greater refractive index than air, thereby allowing a lens with a greater numerical aperture to be used.

In this type of lithographic process, a chemically amplified resist is normally used when a KrF or lower shortwave length light source is employed, and functional resin compositions which have been provided with a variety of repeating unit structures for better etching resistance, alkali development, substrate adhesion, and the like have been developed. The use of monomers with an adamantane structure has been proposed as unit structures in starting materials for functional resin compositions in order to ensure adequate resolution, line edge roughness, and the like in particular Patent Document: Japanese Patent Laid-open Publication No. 2006-16379 etc.

SUMMARY OF THE INVENTION

An object of the present invention is to provide a chemically amplified resist composition, as well as a chemically amplified resist composition for immersion lithography.

The present invention provides

<1> A chemically amplified resist composition, comprising:
a resin which includes
a structural unit having an acid-labile group in a side chain,
a structural unit represented by the formula (I):

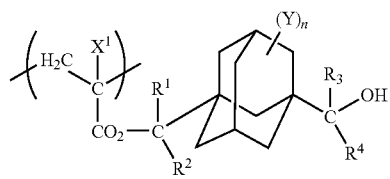

(I)

wherein $X^1$ represents a hydrogen atom, a $C_1$ to $C_4$ alkyl group, or a $C_1$ to $C_4$ perfluoroalkyl group, Y in each occurrence independently represent a hydrogen atom or an alkyl group, and n is an integer of 1 to 14, $R^1$, $R^2$, $R^3$ and $R^4$ independently represent a hydrogen atom, an alkyl group, or a haloalkyl group, and a structural unit having a polycyclic lactone structure,
and which is soluble in an organic solvent and insoluble or poorly soluble in an alkali aqueous solution but rendered soluble in an alkali aqueous solution by the action of an acid; and an acid generator represented by the formula (II):

$A^+E^-$ (II)

wherein $A^+$ represents an organic counterion, $E^-$ represents $CF_3SO_3-$, $C_2F_5SO_3-$, $C_4F_9SO_3-$, $N(SO_2C_2F_5)_2-$, $N(SO_2C_4F_9)_2-$, $N(SO_2C_6H_5)_2-$, $C(SO_2CF_3)_3-$, $R^{21}O(CO)C(Y^1)(Y^2)SO_3-$ wherein $R^{21}$ represents an optionally substituted $C_1$ to $C_{30}$ hydrocarbon group, in which at least one methylene group may be optionally substituted with a carbonyl group or an oxygen atom, and $Y^1$ and $Y^2$ independently represent a fluorine atom or a $C_1$ to $C_6$ perfluoroalkyl group;

<2> The chemically amplified resist composition of <1>, wherein the structural unit having the polycyclic lactone structure is at least one structual unit selected from the group consisting of a structual units represented by the formulae (IVa), (IVb) and (IVc),

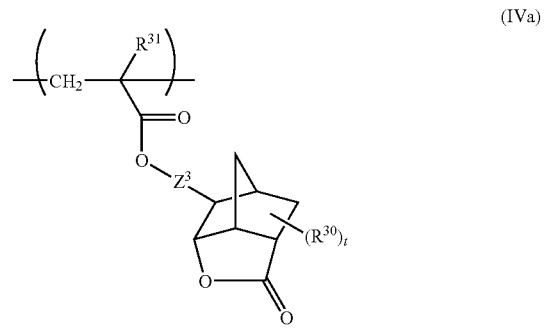

(IVa)

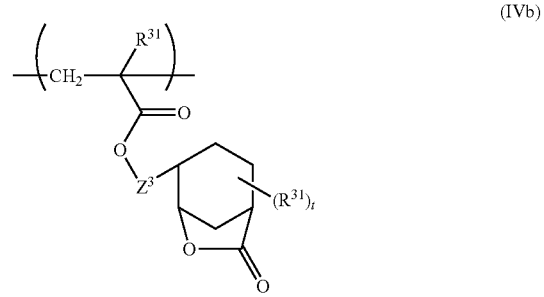

(IVb)

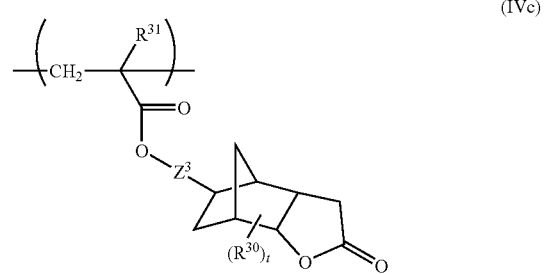

(IVc)

wherein $R^{30}$ in each occurrence represent a $C_1$ to $C_4$ alkyl, a carboxyl group or a cyano group, $R^{31}$ represents a $C_1$ to $C_4$ alkyl group, t represents an integer of 0 to 3, $Z^3$ represents a single bond or a $-[CH_2]_k-COO-$ group, and k represents an integer of 1 to 4;

<3> The chemically amplified resist composition of <1> or <2>, wherein the acid generator is at least one compound selected from the group consisting of a compound represented by the formula (VI),

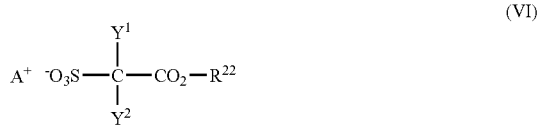

(VI)

Wherein $R^{22}$ represents an optionally substituted $C_1$ to $C_{20}$ liner or branched chain hydrocarbon group or an optionally substituted $C_3$ to $C_{30}$ cyclic hydrocarbon group, wherein at lest one methylene group in the hydrocarbon group and the cyclic hydrocarbon group may be optionally substituted with a carbonyl group or an oxygen atom, $A^+$ represents an organic counterion, and $Y^1$ and $Y^2$ independently represent a fluorine atom or a $C_1$ to $C_6$ perfluoroalkyl group;

<4> The chemically amplified resist composition any one of <1> to <3>, wherein the $A^+$ of the formula (II) is at least one cation selected from the group consisting of a cation represented by the formulae (VIIa), (VIIb), (VIIc) and (VIId);

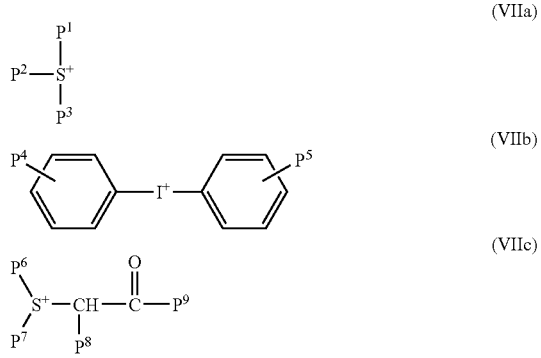

(VIIa)

(VIIb)

(VIIc)

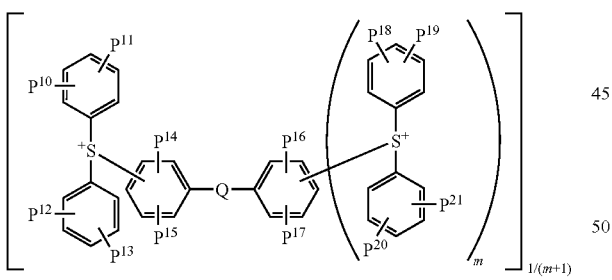

(VIId)

wherein $P^1$ to $P^3$ independently represent a $C_1$ to $C_{30}$ alkyl group or a $C_3$ to $C_{30}$ cyclic hydrocarbon group, and when $P^1$ to $P^3$ are alkyl groups, they may have one or more substituents comprising a hydroxyl group, a $C_1$ to $C_{12}$ alkoxy group, or a $C_3$ to $C_{12}$ cyclic hydrocarbon group, and when $P^1$ to $P^3$ are cyclic hydrocarbon groups, they may have one or more substituents comprising a hydroxyl group, a $C_1$ to $C_{12}$ alkyl group, or a $C_1$ to $C_{12}$ alkoxy group;

$P^4$ and $P^5$ independently represent a hydrogen atom, a hydroxyl group, a $C_1$ to $C_{12}$ alkyl group or a $C_1$ to $C_{12}$ alkoxy group, $P^6$ and $P^7$ independently represent a $C_1$ to $C_{12}$ alkyl group or a $C^3$ to $C_{12}$ cycloalkyl group, or $P^6$ and $P^7$ are bonded to form a divalent $C_3$ to $C_{12}$ hydrocarbon group, $P^8$ is a hydrogen atom, and $P^9$ represents a $C_1$ to $C_{12}$ alkyl group, a $C_3$ to $C_{12}$ cycloalkyl group, or an optionally substituted aromatic cyclic group, or $P^8$ and $P^9$ are bonded to form a divalent $C^3$ to $C_{12}$ hydrocarbon group.

$P^{10}$ to $P^{21}$ independently represent a hydrogen atom, a hydroxyl group, a $C_1$ to C12 alkyl group or a $C_1$ to $C_{12}$ alkoxy group, Q represents a sulfur atom or an oxygen atom, m represents 0 or 1;

<5> The chemically amplified resist composition any one of <1> to <4>, wherein the $A^+$ of the formula (II) is at least one cation selected from the group consisting of a cation represented by the formulae (VIIe), (VIIf) and (VIIg);

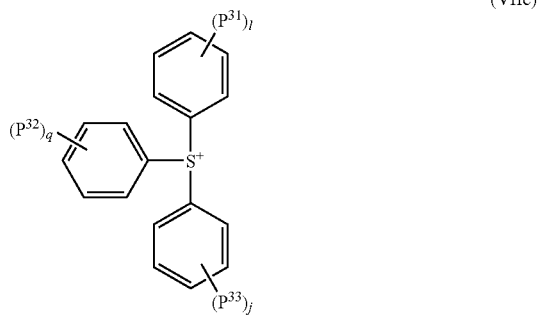

(VIIe)

(VIIf)

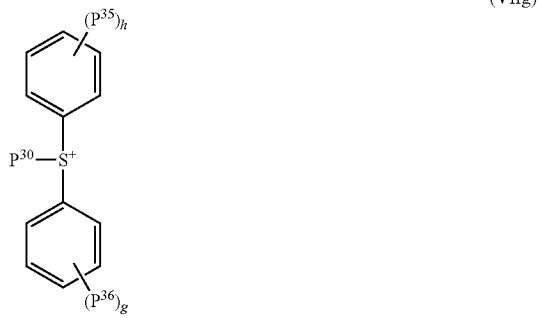

(VIIg)

wherein $P^{28}$ to $P^{30}$ independently represent a $C_1$ to $C_{20}$ alkyl group or a $C_3$ to $C_{30}$ cyclic hydrocarbon group other than phenyl, and when $P^{28}$ to $P^{30}$ are alkyl groups, they may have at least one substituent selected from the group consisting of a hydroxyl group, a $C_1$ to $C_{12}$ alkoxy group, and a $C_3$ to $C_{12}$ cyclic hydrocarbon group, and when $P^{28}$ to $P^{30}$ are cyclic hydrocarbon groups, they may have at least one substituent selected from the group consisting of a hydroxyl group, a $C_1$ to $C_{12}$ alkyl group, and a $C_1$ to $C_{12}$ alkoxy group, $P^{31}$ to $P^{36}$ independently represent a hydroxyl group, a $C_1$ to $C_{12}$ alkyl group, a $C_1$ to $C_{12}$ alkoxy group, or a $C_3$ to $C_{12}$ cyclic hydrocarbon group, and l, q, j, i, h and g independently represent an integer of 0 to 5;

<6> The chemically amplified resist composition any one of <1> to <5>, wherein the $A^+$ of the formula (II) is a cation represented by the formula (VIIh);

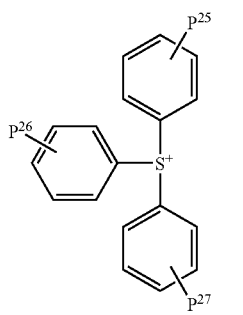

(VIIh)

wherein $P^{25}$ to $P^{27}$ independently represent a hydrogen atom, a hydroxyl group, a $C_1$ to $C_{12}$ alkyl group, or a $C_1$ to $C_{12}$ alkoxy group;

<7> The chemically amplified resist composition any one of <1> to <6>, wherein the $A^+$ of the formula (II) is a cation represented by the formula (VIIi);

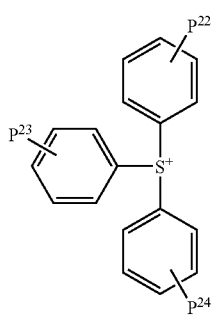

(VIIi)

wherein $P^{22}$ to $P^{24}$ independently represent a hydrogen atom, or a $C_1$ to $C_4$ alkyl group;

<8> The chemically amplified resist composition any one of <1> to <7>, wherein the resin further comprises a structural unit represented by the formula (V),

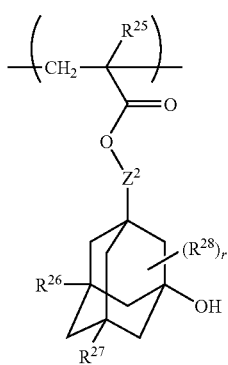

(V)

wherein $R^{25}$ represents a hydrogen atom or a methyl group, $R^{26}$ and $R^{27}$ independently represent a hydrogen atom, a methyl group, or a hydroxyl group, $R^{28}$ represents a methyl group, r represents an integer of 0 to 12, $Z^2$ represents a single bond or a $—[CH_2]_k—COO—$ group, and k represents an integer of 1 to 4;

<9> The chemically amplified resist composition any one of <1> to <8>, which further contains a basic compound;

<10> A chemically amplified resist composition for immersion lithography comprising a chemically amplified resist composition any one of <1> to <8>. <11> A method of using a chemically amplified resist composition any one of <1> to <8> for immersion lithography.

The chemically amplified resist composition of the present invention provides a good resist pattern.

DETAILED DESCRIPTION OF THE PREFERRED EMBODIMENTS

The chemically amplified resist composition of the present invention comprises at least a resin with specific structural units and a specific acid generator.

The resin constituting the chemically amplified resist composition of the present invention comprises at least three structural units, which include a structural unit having an acid-labile group in a side chain, a structural unit represented by the formula (I) above, and a structural unit having a polycyclic lactone structure. The resin has the characteristic of being soluble in organic solvents and insoluble or poorly soluble in alkali aqueous solution but of being rendered soluble in alkali aqueous solution through the action of an acid.

The "acid-labile group" in the resin means a group that is cleaved or tends to be cleaved by the action of an acid, particularly an acid produced from an acid generator described below, and, are not particularly limited to, may be any group having such properties. Also, "soluble in organic solvent" means soluble enough that less than 100 mL of organic solvent is generally sufficient to dissolve 1 g or 1 mL of the resist composition of the present invention, although this can vary, depending on the solvent type, concentration, and the like. Further, "insoluble or poorly soluble in alkali aqueous solution" means a solubility requiring about 100 mL or more of alkali aqueous solution generally used as a developer, in order to dissolve generally 1 g or 1 mL of the resist composition of the present invention, although this can vary, depending on the alkali aqueous solution type, concentration, and the like. "Soluble in alkali aqueous solution" means soluble enough that less than 100 mL alkali aqueous solution is sufficient to dissolve 1 g or 1 mL of the resist composition of the present invention.

Examples of resin structural units having an acid-labile group in a side chain include, but are not particularly limited to, one or more structural units represented by the formulas (IIIa) or (IIIb).

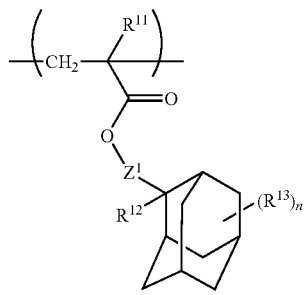

(IIIa)

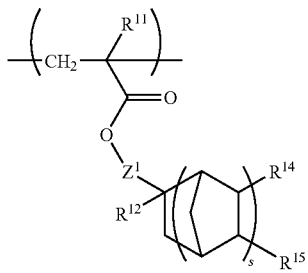

(IIIb)

wherein $R^{11}$ represents a hydrogen atom or a methyl group. $R^{12}$ represents a $C_1$ to $C_8$ alkyl group or a $C_3$ to $C_8$ cycloalkyl group, $R^{13}$ in each occurrence independently represent a hydrogen atom or a methyl group, n represents an integer of 1 to 14, $R^{14}$ and $R^{15}$ independently represent a hydrogen atom or a monovalent $C_1$ to $C_8$ hydrocarbon group, or $R^{14}$ and $R^{15}$ may be bonded together to form a divalent $C_1$ to $C_8$ hydrocarbon group which forms a ring together with the carbon atoms to which $R^{14}$ and $R^{15}$ are bonded, or $R^{14}$ and $R^{15}$ may be bonded together to form a double bond between the carbon atoms to which $R^{14}$ and $R^{15}$ are bonded, and the carbon atom included in a mono- or divalent hydrocarbon group may be optionally substituted with a hetero atom, s represents an integer of 1 to 3, $Z^1$ represents a single bond or a —[$CH_2$]$_k$—COO— group, and k represents an integer of 1 to 4.

Examples of the alkyl group include methyl, ethyl, n-propyl, iso-propyl, n-butyl, sec-butyl, tert-butyl, pentyl, hexyl, octyl, and 2-ethylhexyl groups. Examples of the alkoxyl group include methoxy, ethoxy, propoxy, butoxy, hexyloxy, octyloxy, and 2-ethylhexyloxy groups, and a $C_1$ to $C_8$ alkyl group is preferred.

Examples of the cycloalkyl group include cyclopropyl, cyclobutyl, cyclopentyl, cyclohexyl, cycloheptyl, adamantyl, and bicyclohexyl groups, and a $C_3$ to $C_8$ cycloalkyl group is preferred.

Examples of the hydrocarbon group include a saturated chain hydrocarbon group such as an alkyl and an alkylene groups, an unsaturated chain hydrocarbon group such as an alkenyl group, a saturated monocyclic or a polycyclic hydrocarbon group such as a cycloalkyl, an adamantyl, and a norbornane groups, and an unsaturated monocyclic or polycyclic hydrocarbon group such as an arylene group and an aryl group such as phenyl, naphthyl, fluorenyl, and biphenyl groups, where the mono- or divalent hydrocarbon group means a mono- or divalent group of each of these groups. A $C_1$ to $C_8$ hydrocarbon group is preferred.

A hetero atom means any of nitrogen, sulfur, and oxygen atoms, and can be one or more in number.

The alkyl groups, cycloalkyl groups, hydrocarbon groups, and hetero atoms in any of the chemical structural the formulas in this Specification are the same as above, unless otherwise specified, although they will differ depending on the number of carbons. Any which are capable of being linear or branched are also included.

The followings are specific examples of monomers from which a structural unit represented by the formula (IIIa) is derived.

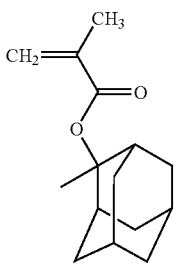 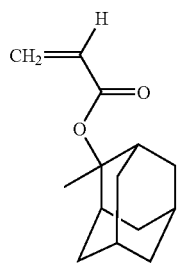

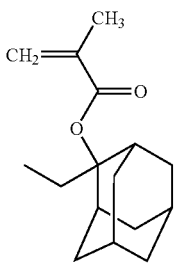 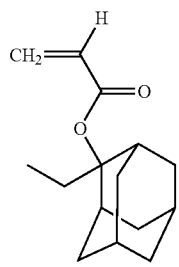

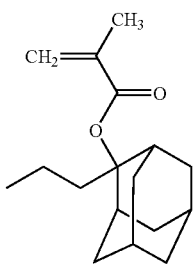 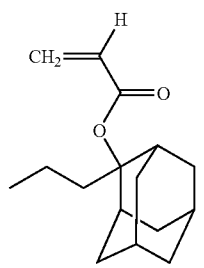

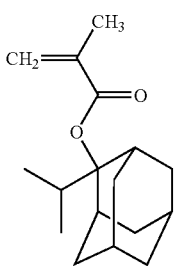 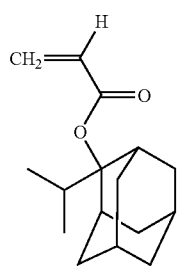

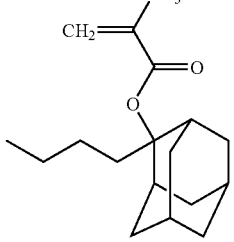 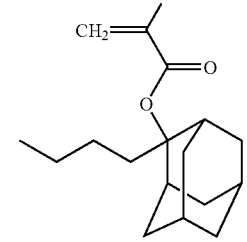

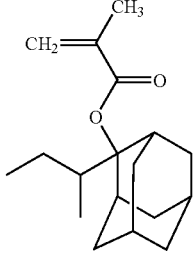 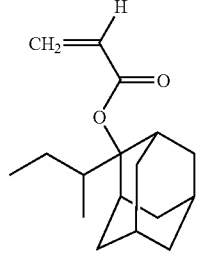

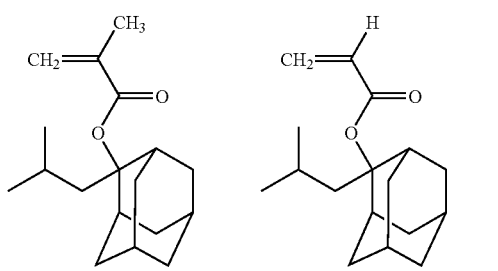
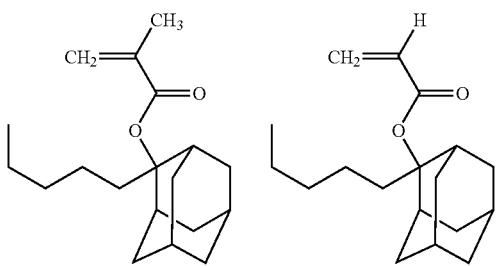
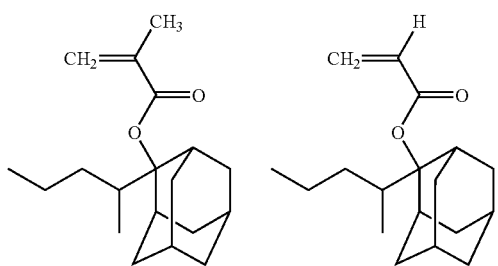
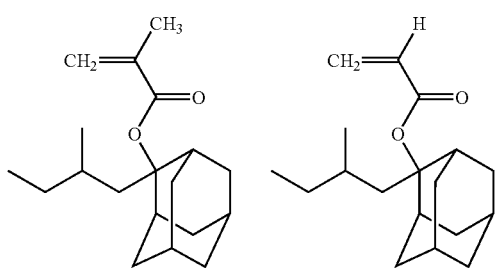
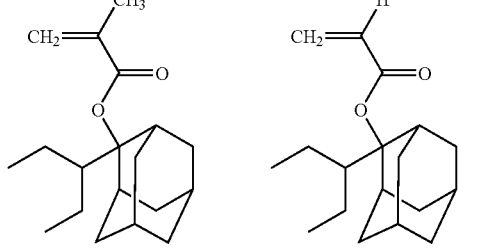
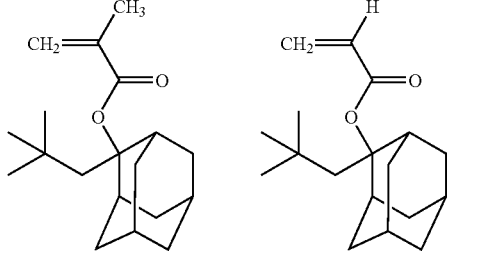
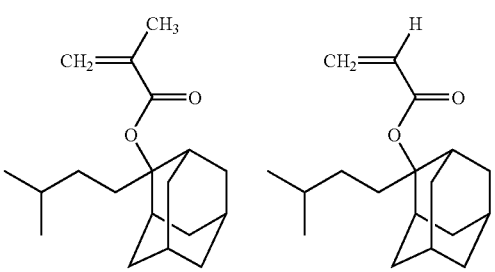
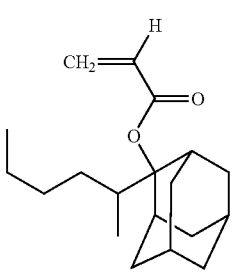

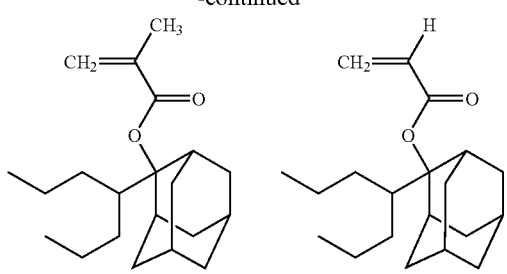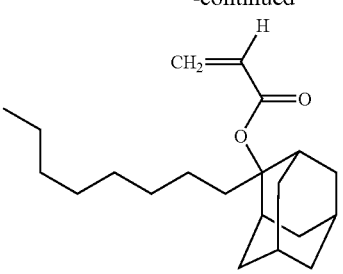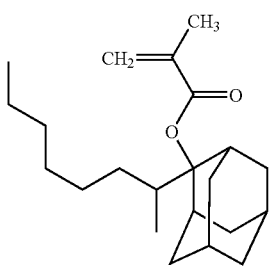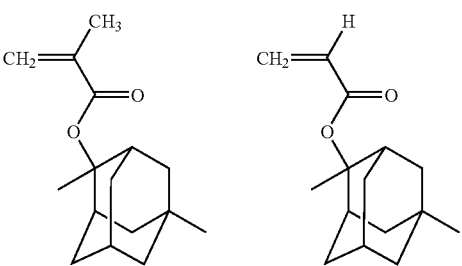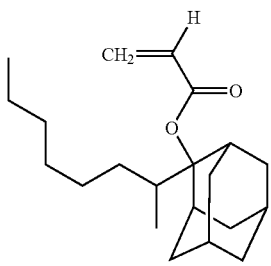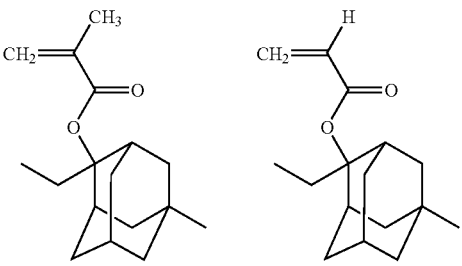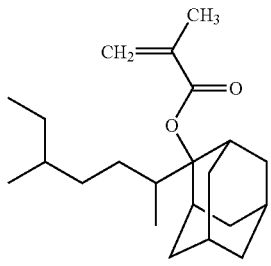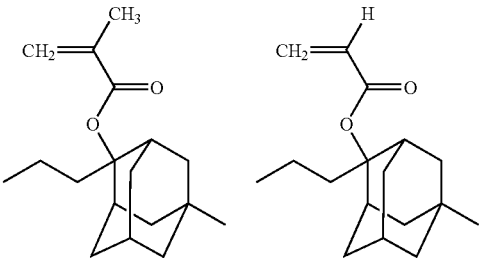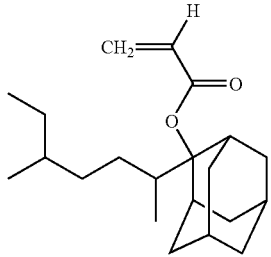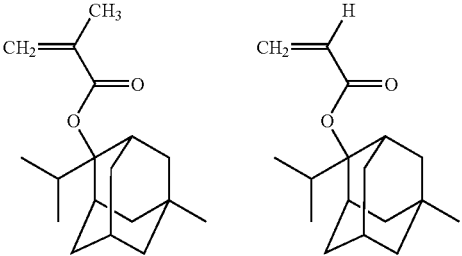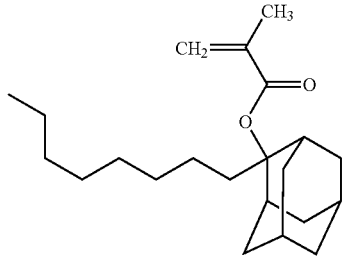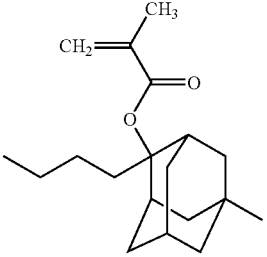

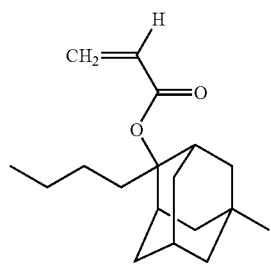
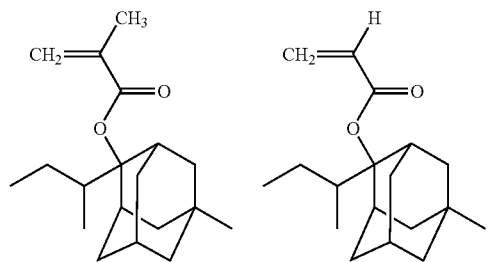
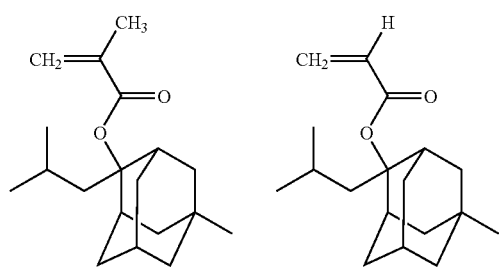
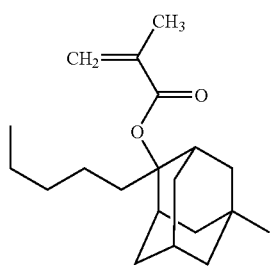
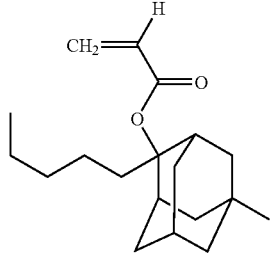
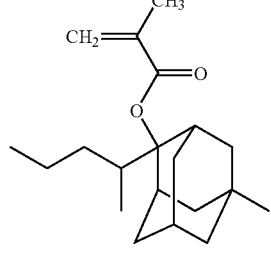
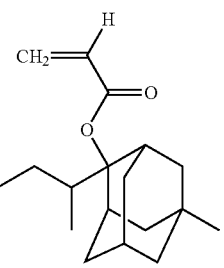
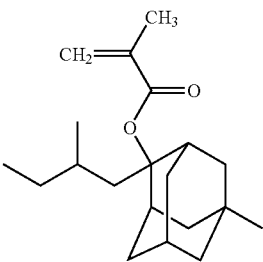
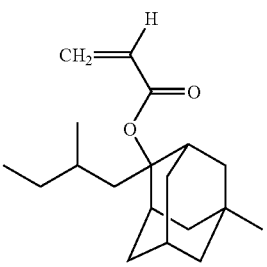
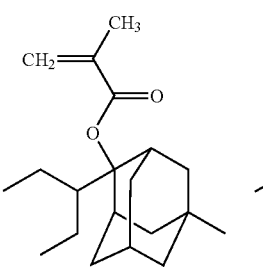
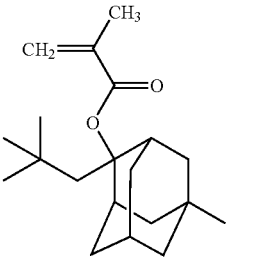
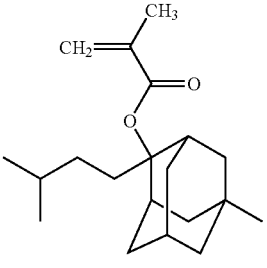

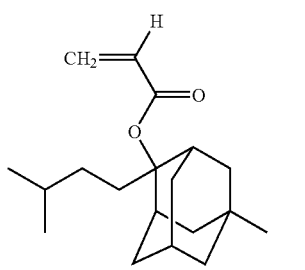
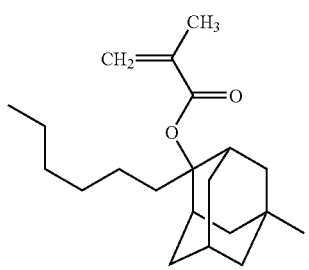
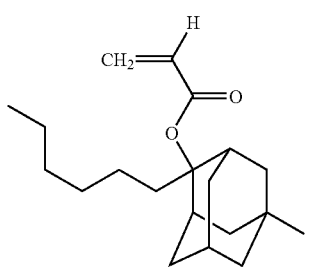
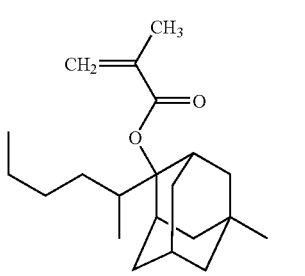
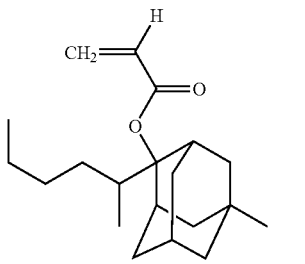
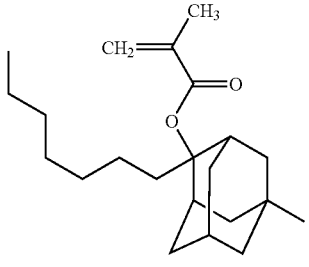
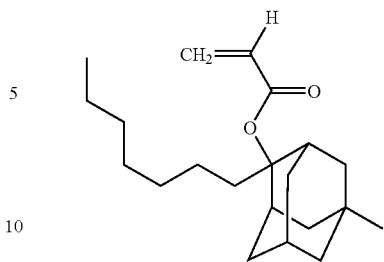
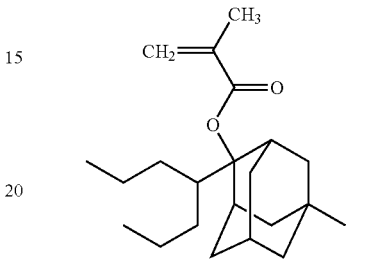
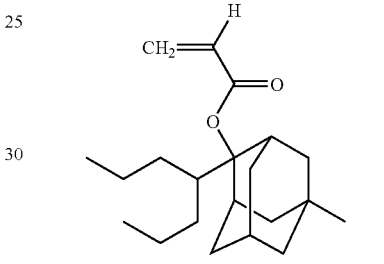
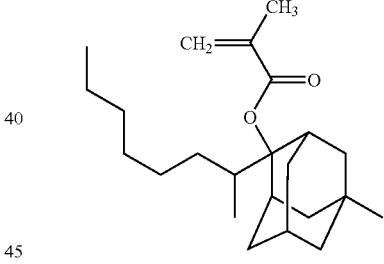
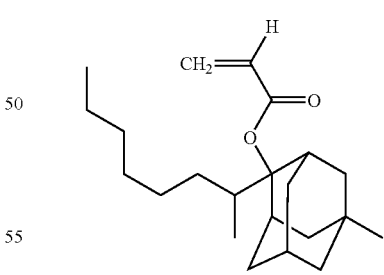
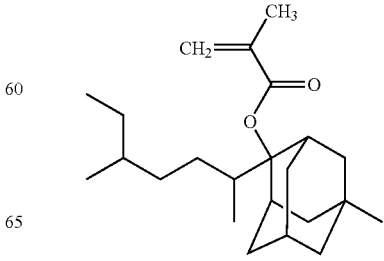

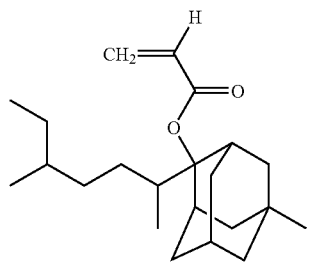
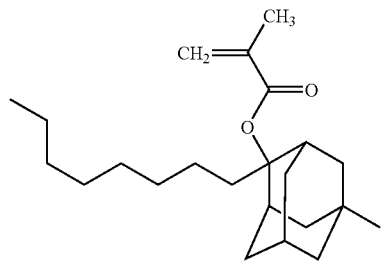
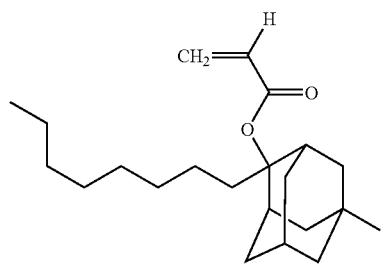
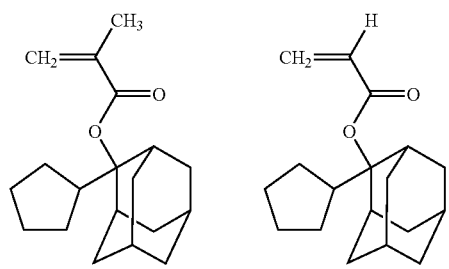
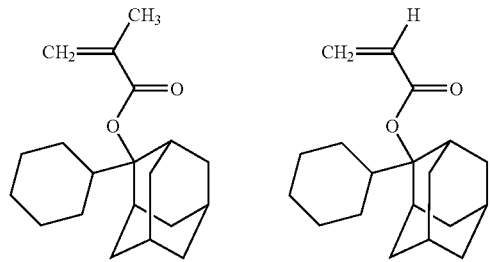
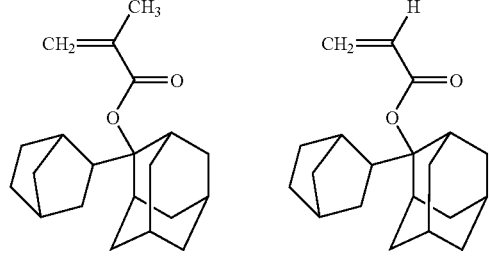
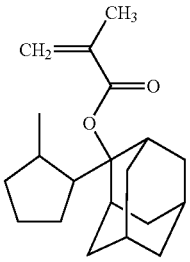
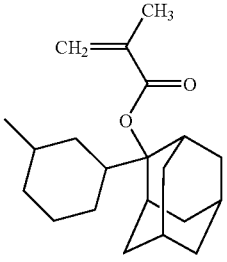
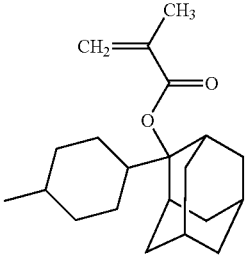
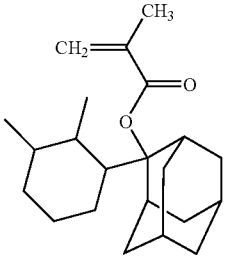
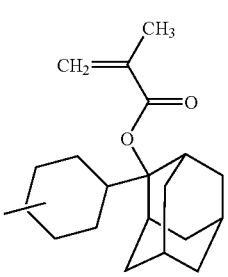
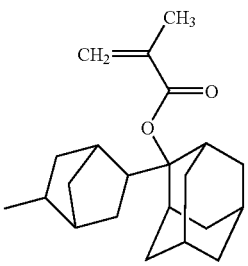

-continued
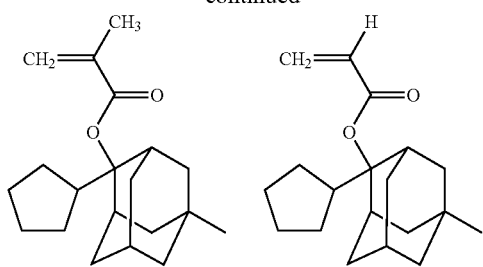
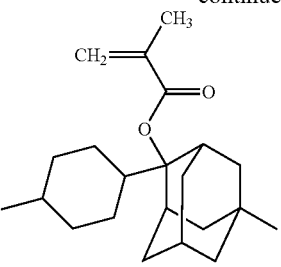
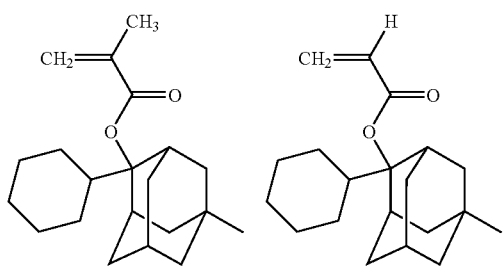
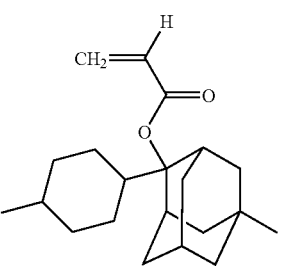
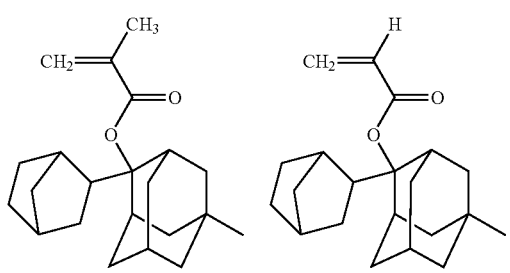
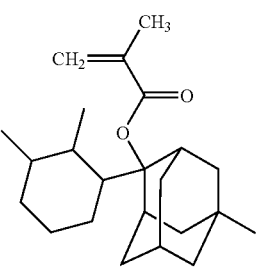
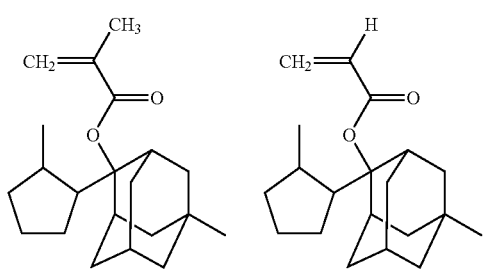
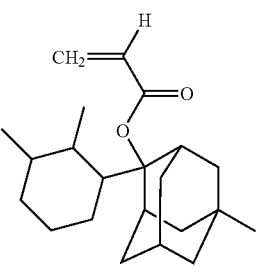
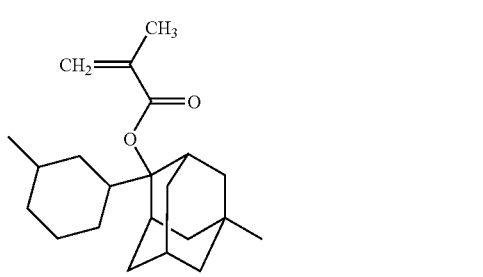
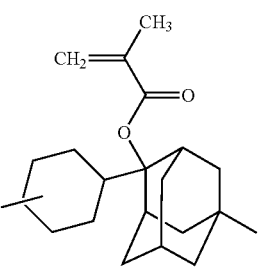
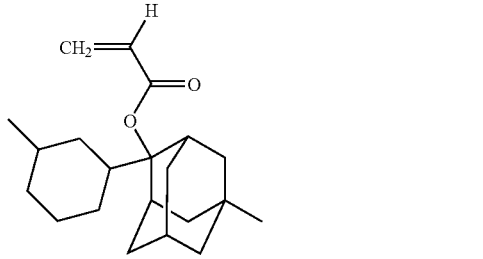
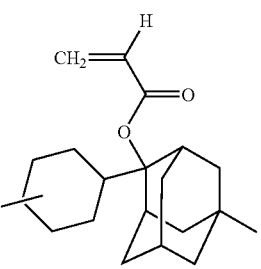

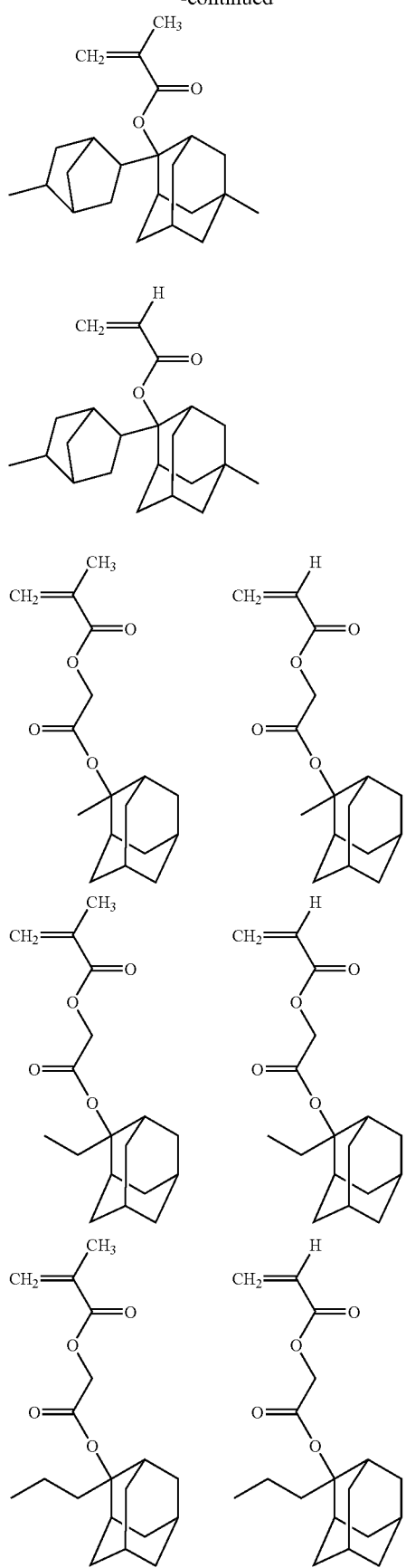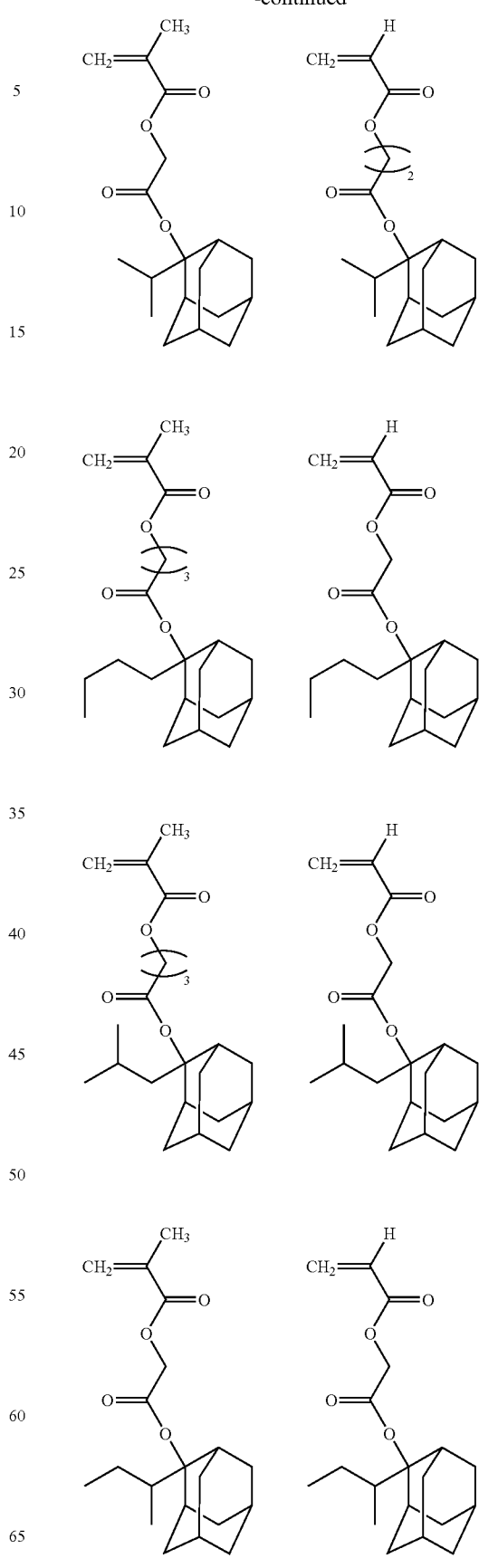

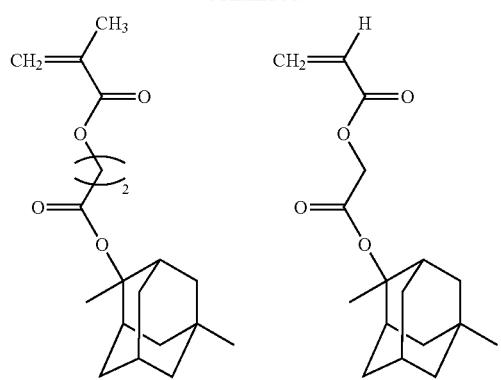
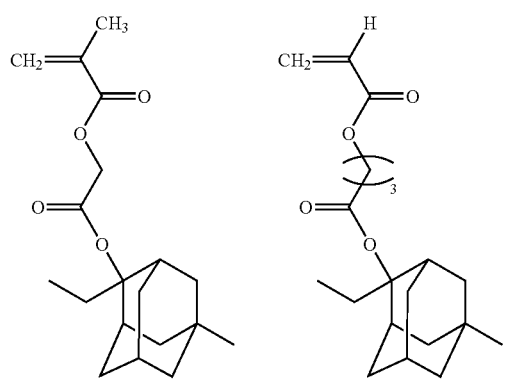
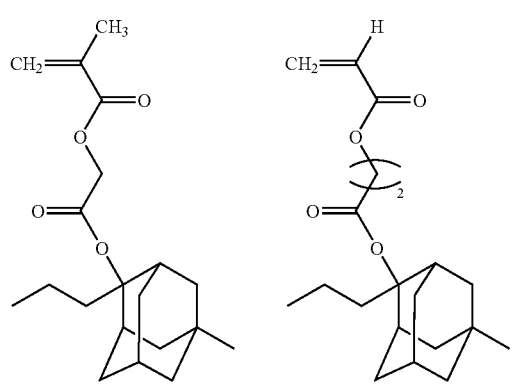
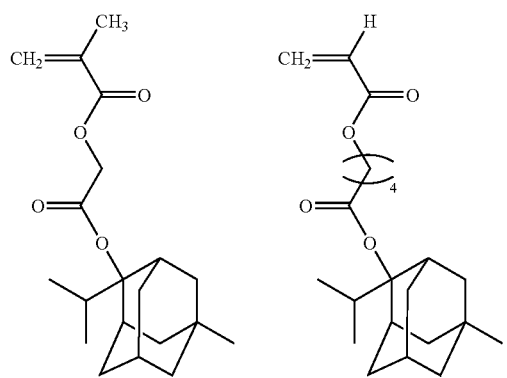
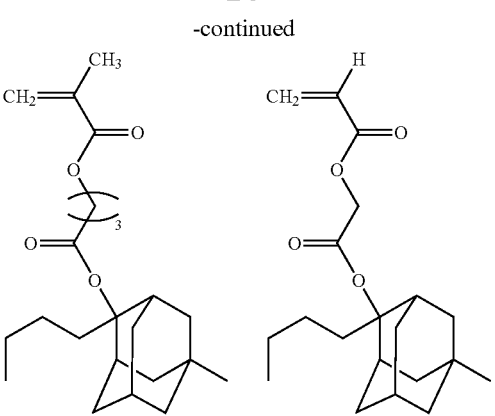
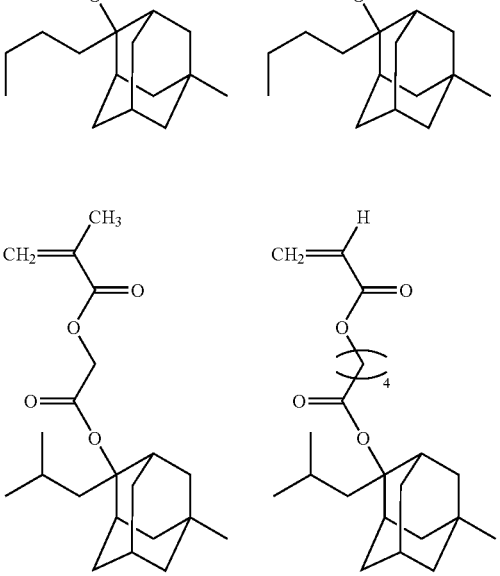
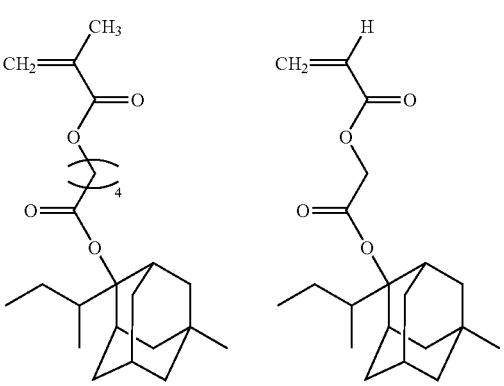
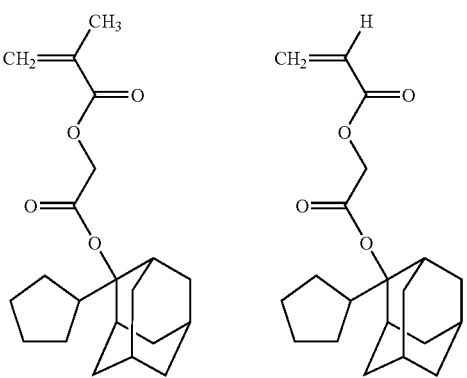

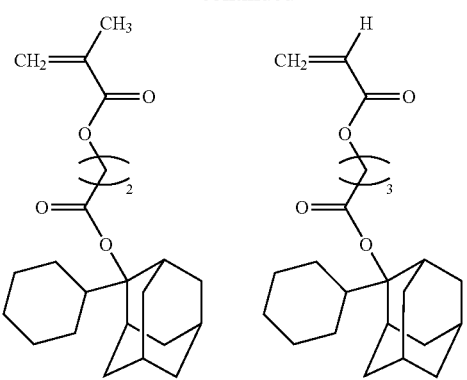
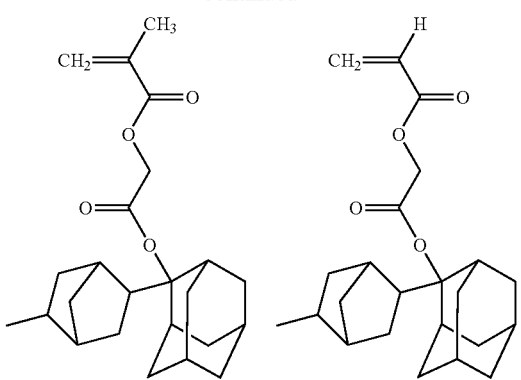
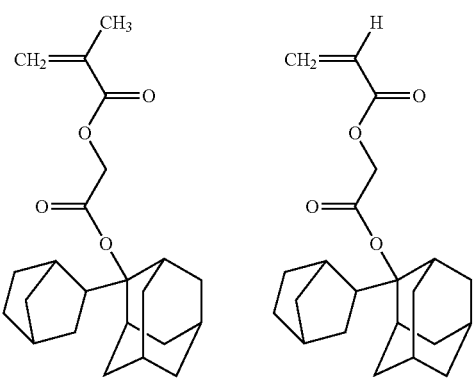
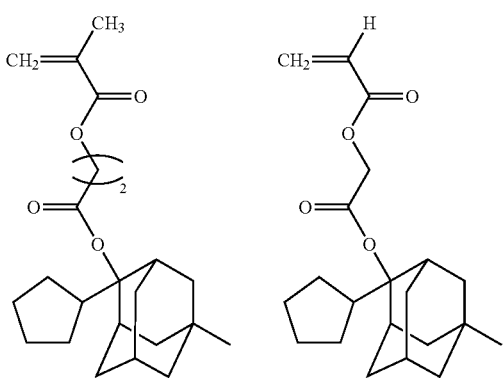
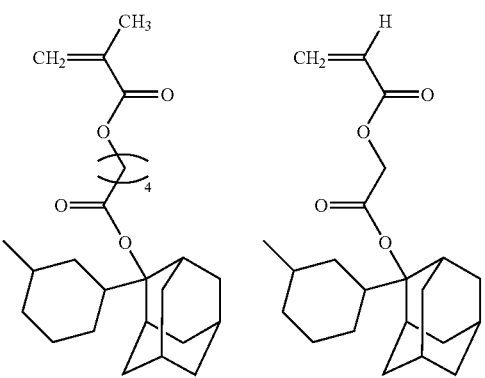
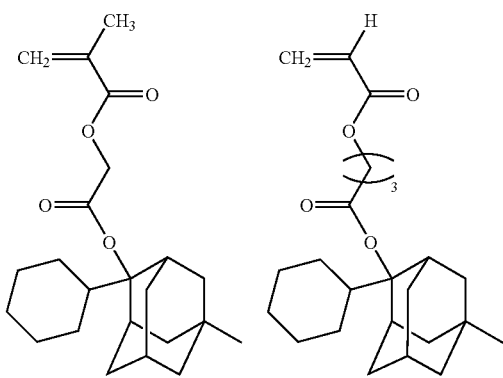
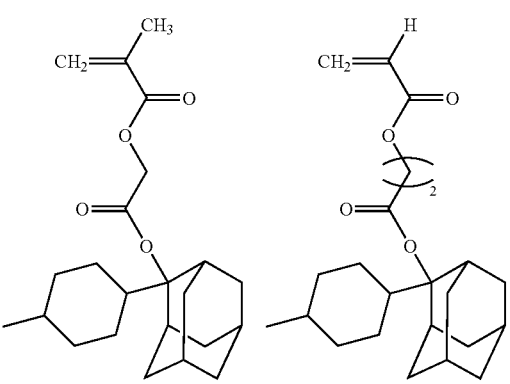
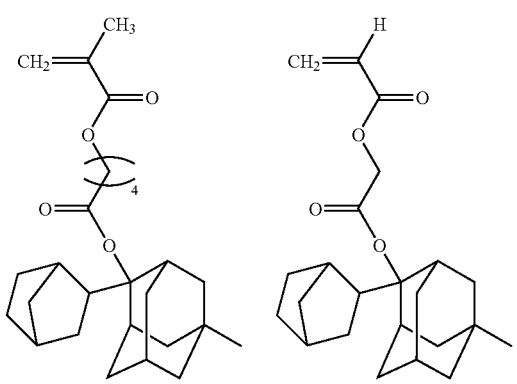

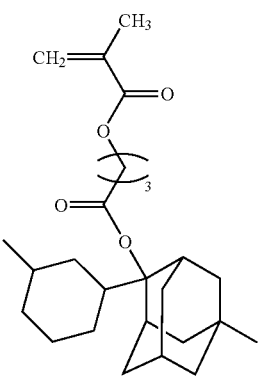
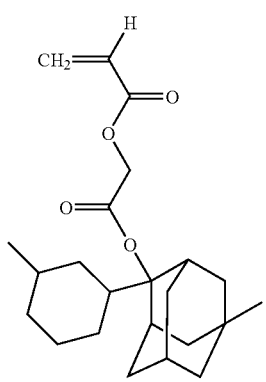
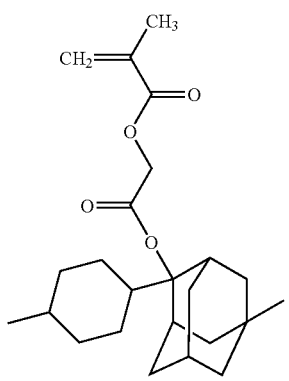
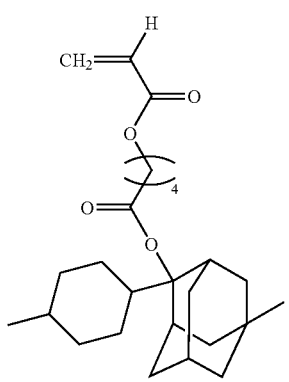
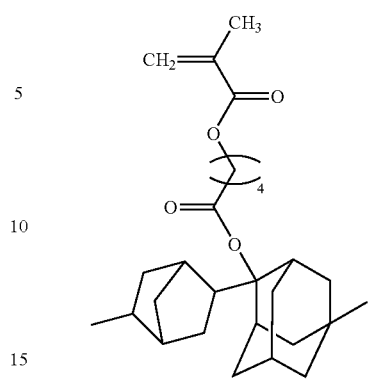
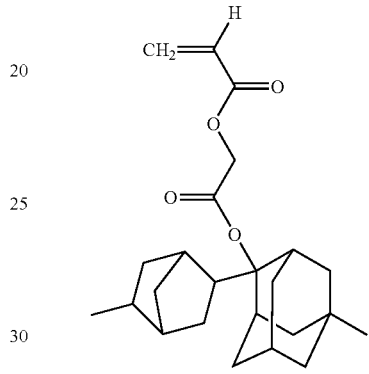
The followings are specific examples of monomers from which a structural unit represented by the formula (IIIb) is derived.
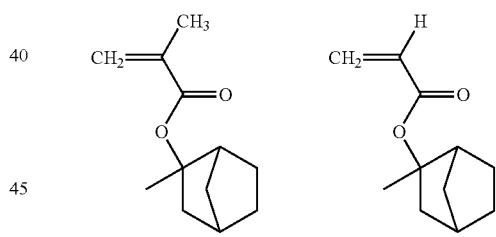
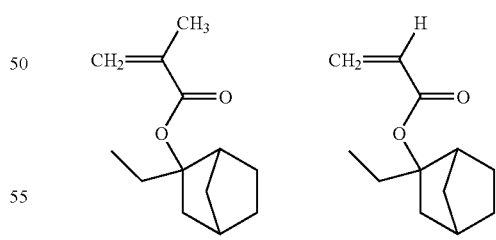
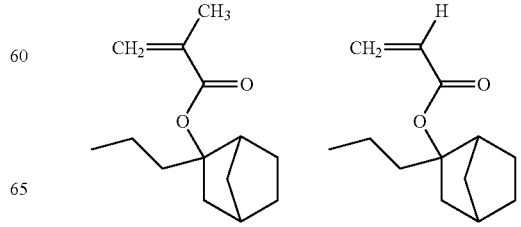

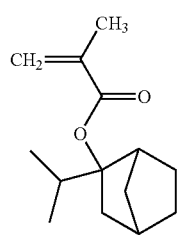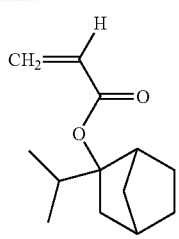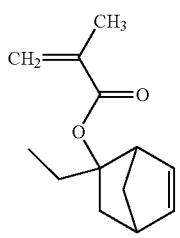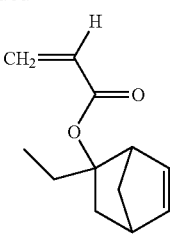
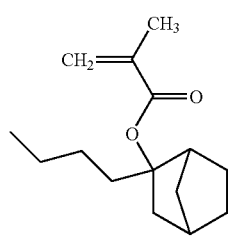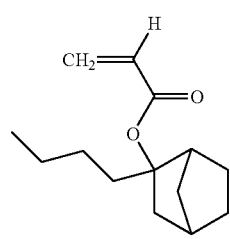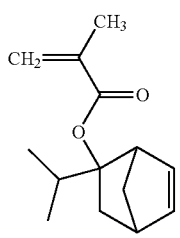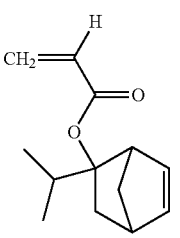
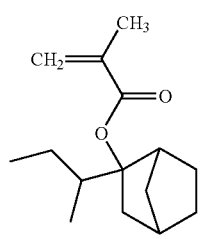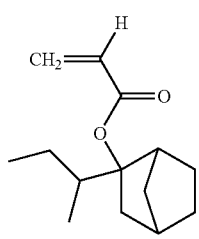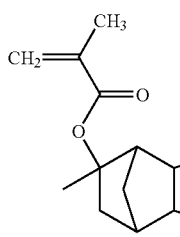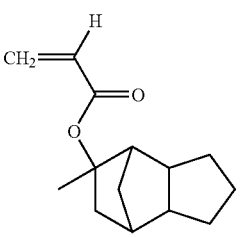
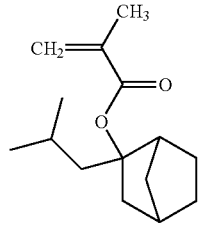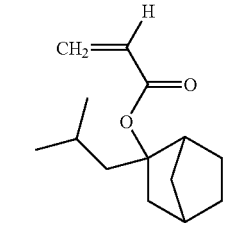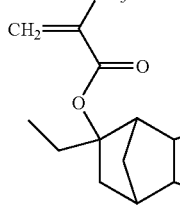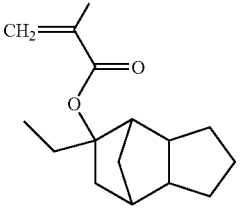
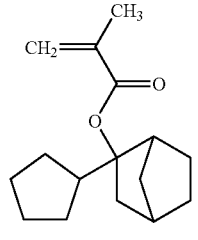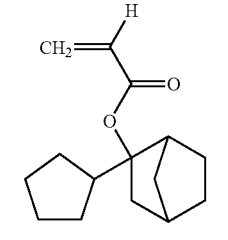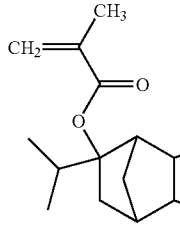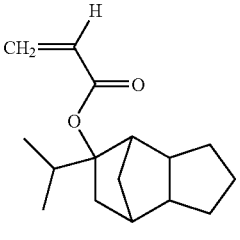
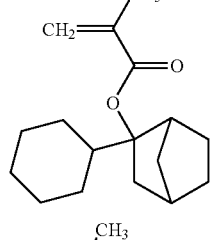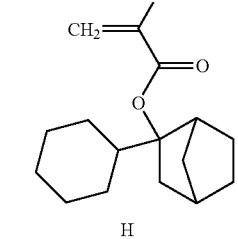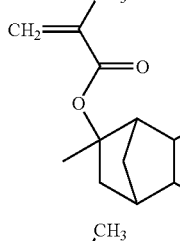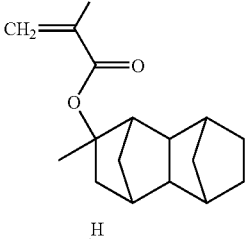
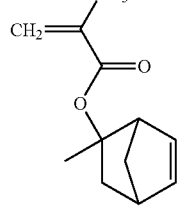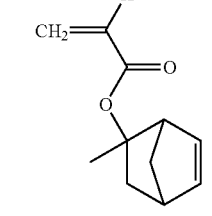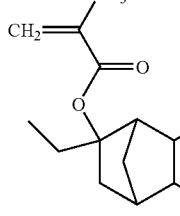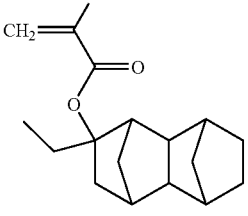

31
-continued
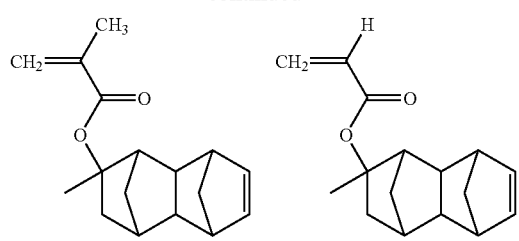
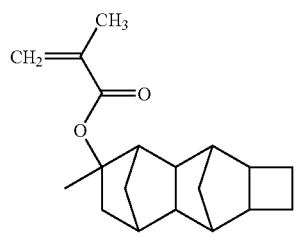
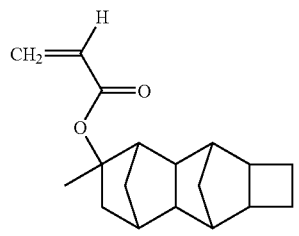
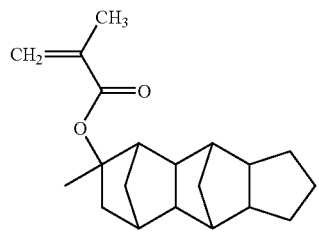
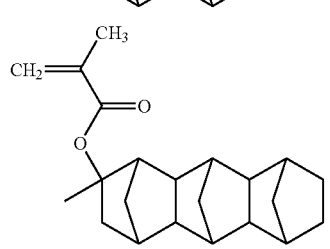
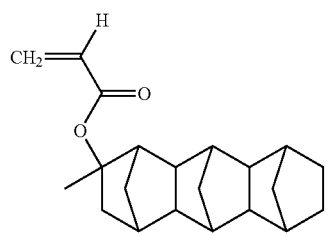
32
-continued
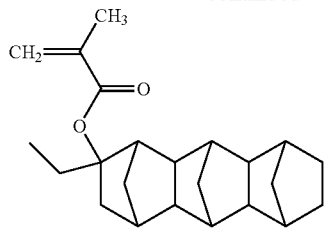
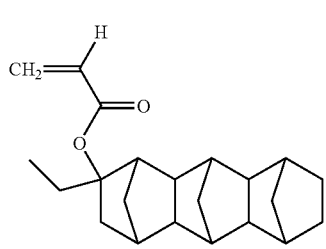
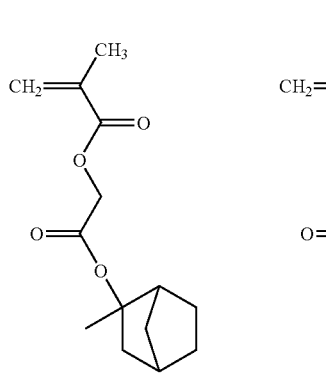
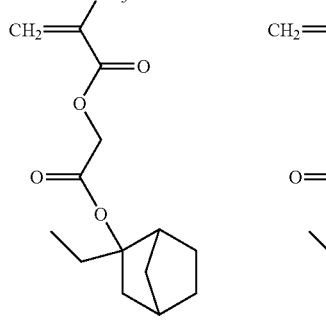
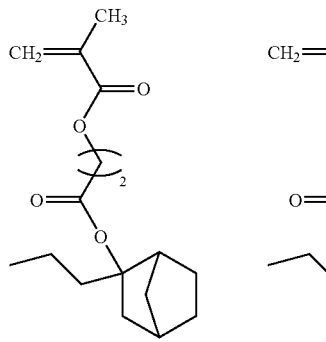

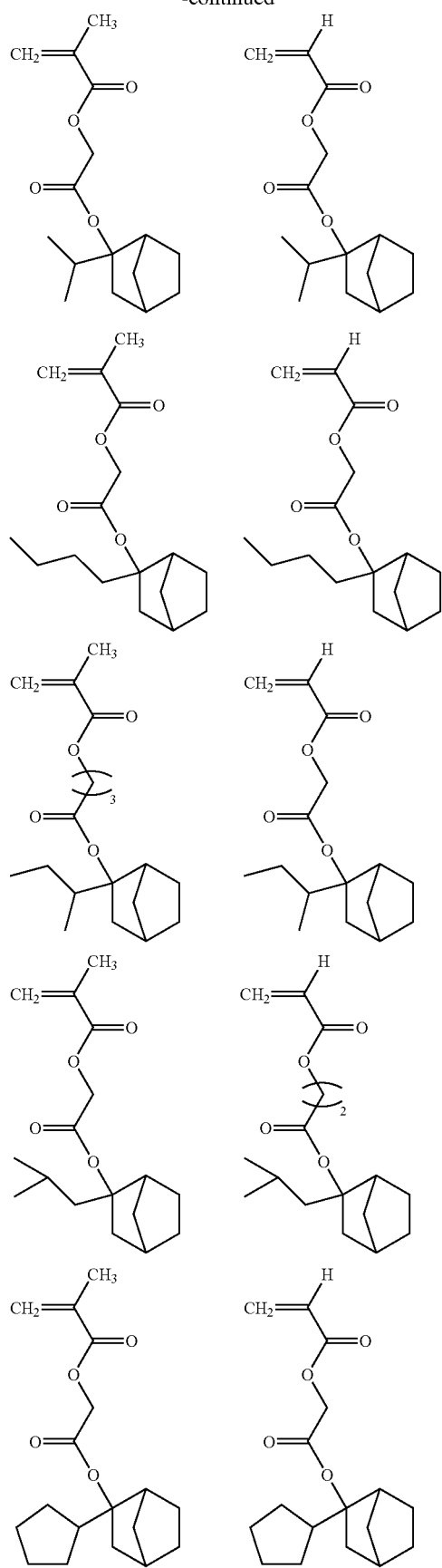
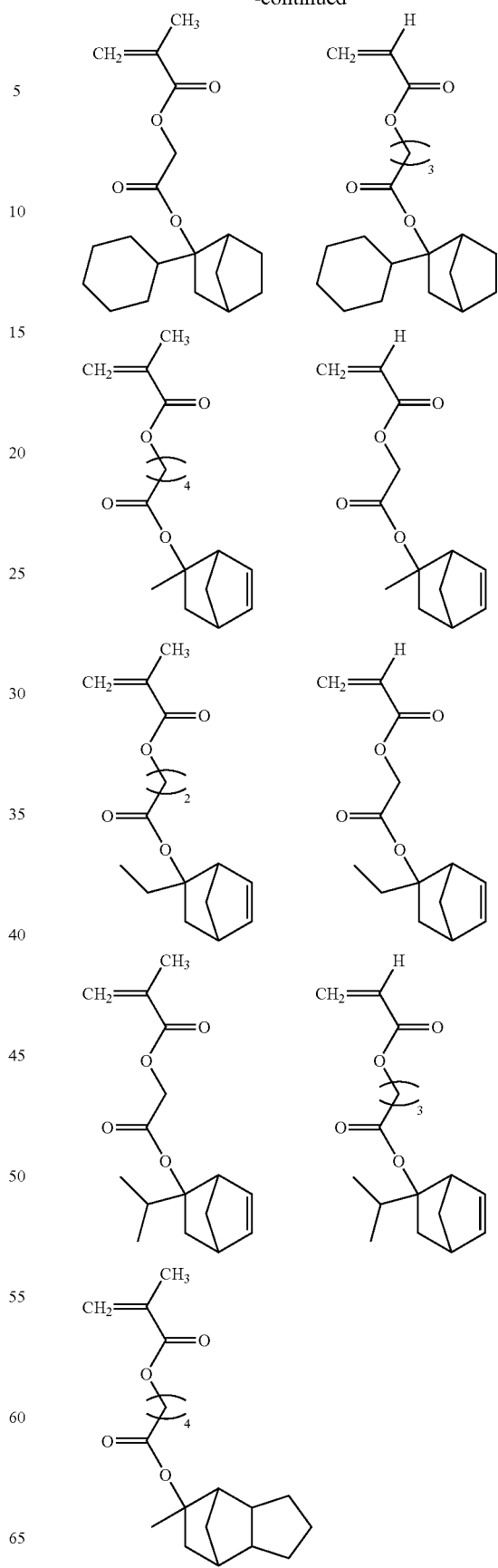

-continued

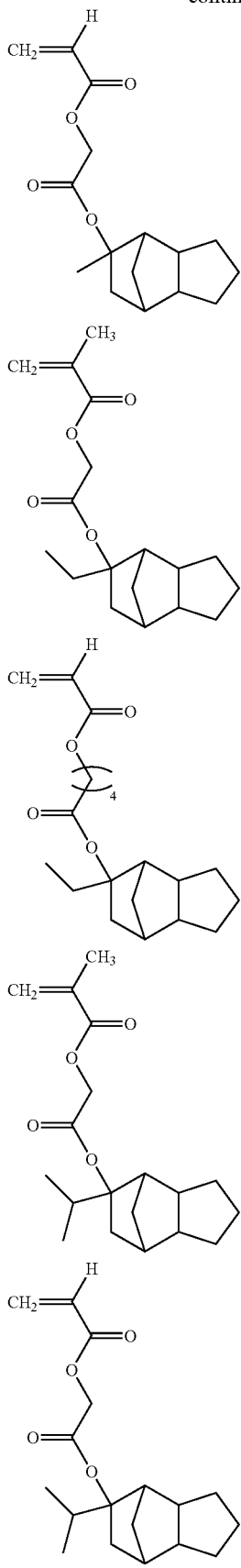

The inclusion of a structural unit derived from 2-alkyl-2-adamantyl (meth)acrylate, 1-(1-adamantyl)-1-alkylalkyl (meth)acrylate or 1-(2-alkyl-2-adamantyloxycarbonyl)alkyl (meth)acrylate in particular as the structural unit having an acid-labile group in the side chain will result in a sturdy structure because the resin will have an alicyclic group, which is advantageous and preferable in terms of the dry etching resistance of the chemically amplified resist composition.

Among these, the use of 2-methyl-2-adamantyl (meth)acrylate, 2-ethyl-2-adamantyl (meth)acrylate, 2-isopropyl-2-adamantyl (meth)acrylate or 1-(2-methyl-2-adamantyloxycarbonyl)methyl (meth)acrylate is even more preferable, as the resulting chemically amplified resist composition will tend to have better sensitivity and heat resistance.

The structural units derived from 2-ethyl-2-adamantyl (meth)acrylate and 2-isopropyl-2-adamantyl (meth)acrylate are particularly preferable, particularly in combinations of the structural unit represented by the formula (I) below wherein $R^1$ and/or $R^2$ is a primary or secondary alkyl group.

2-alkyl-2-adamantyl (meth)acrylates can usually be produced by a reaction between 2-akyl-2-adamanthanol or a metal salt thereof and an acrylic acid halide or methacrylic acid halide.

A variety of resin structural units represented by the formula (I) constituting the chemically amplified resist composition of the present invention are available, provided that they have this structure.

Examples of the perfluoroalkyl group in $X^1$ in the formula (I) include perfluoromethyl, perfluoroethyl, perfluoropropyl, and perfluorobutyl.

$X^1$ is preferably a hydrogen atom, a $C_1$ or $C_2$ alkyl group, or a perfluoroalkyl group.

Y in the formula (I) is preferably a $C_1$ to $C_4$ alkyl group, and a $C_1$ or $C_2$ alkyl group is more preferred.

The alkyl or haloalkyl group in $R^1$ to $R^4$ in the formula (I) are preferably a $C_1$ to $C_4$ alkyl or a haloalkyl group, and a $C_1$ or $C_2$ alkyl or haloalkyl group is more preferred. The halogen of the haloalkyl may be any of fluorine, chlorine, bromine, or iodine atom.

The perfluoroalkyl group and halogen in any of the chemical structural the formulas in this Specification are the same as above, unless otherwise specified, although they will differ depending on the number of carbons.

The followings are specific examples of monomers from which the structural unit represented by the formula (I) is derived.

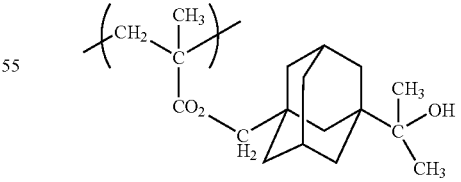

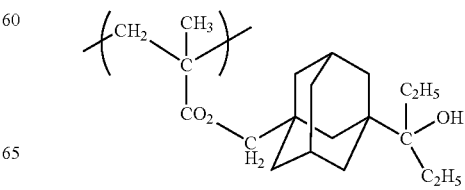

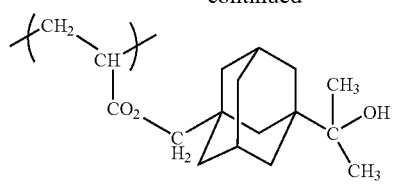
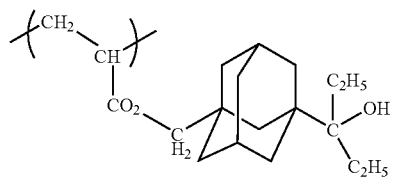
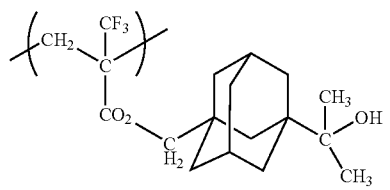
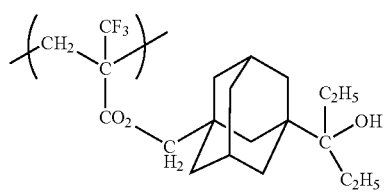
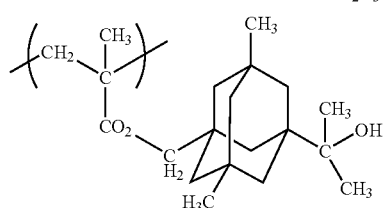
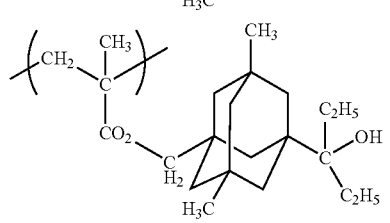
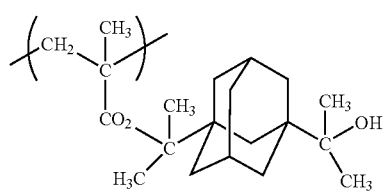
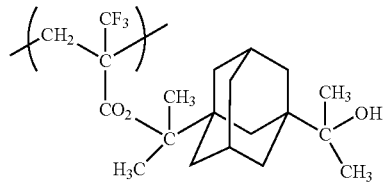
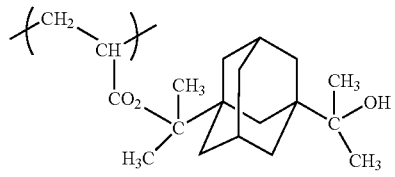

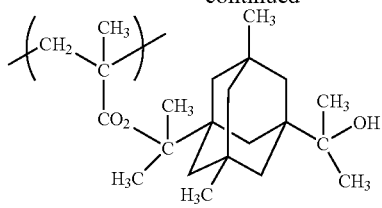

The structural unit having a polycyclic lactone structure in the resin constituting the chemically amplified resist composition of the present invention may be bicyclic, tricyclic, tetracyclic and the like, and bicyclic or tricyclic is preferably. The lactone may also be a β-, γ-, or δ-lactone.

Examples of the structural unit having a polycyclic lactone structure include the following structural units represented by the formulae (IVa), (IVb) and (IVc).

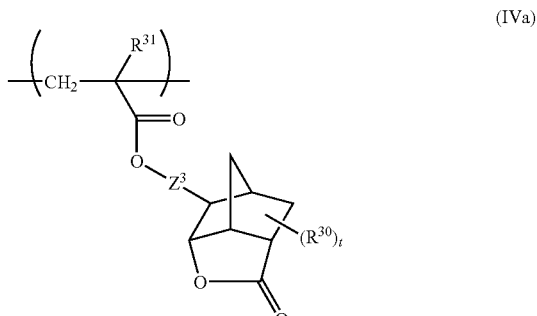
(IVa)

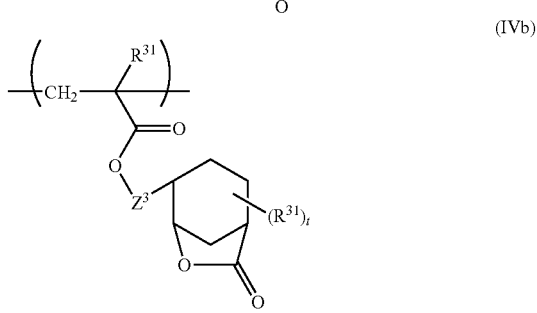
(IVb)

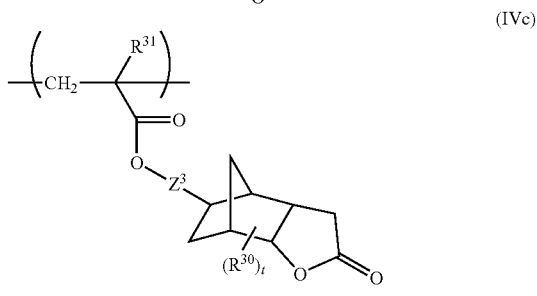
(IVc)

wherein $R^{30}$ in each occurrence represent, a $C_1$ to $C_4$ alkyl group, a carboxyl group or a cyano group, $R^{31}$ represents a $C_1$ to $C_4$ alkyl group, t represents an integer of 0 to 3, $Z^3$ represents a single bond or a —$[CH_2]_k$—COO— group, and k represents an integer of 1 to 4.

The hydrocarbon group in the formulae (IVa), (IVb) and (IVc) includes the same groups as the above, among which, it is preferably a saturated chain hydrocarbon group, and it is more preferably an alkyl group. Specially, methyl group or ethyl group is preferable, and methyl group is more preferred.

The followings are specific examples of monomers from which the structural unit represented by the formula (IVa) is derived.
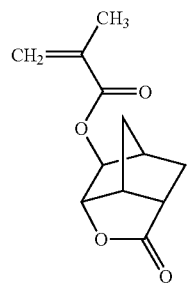 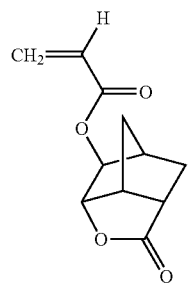
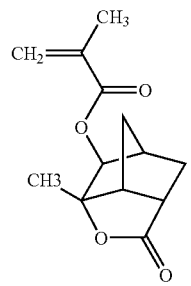 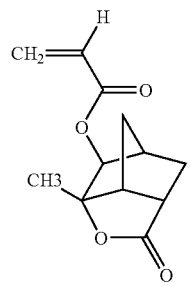
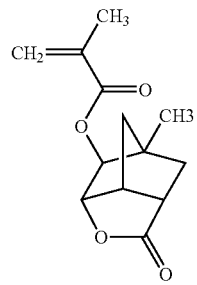 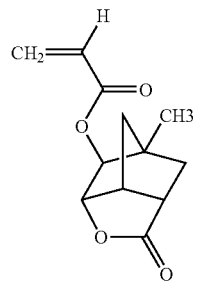
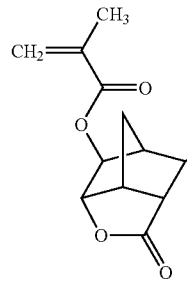 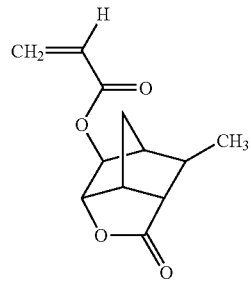
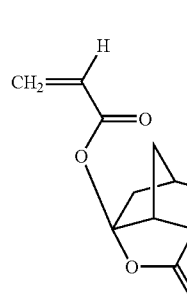 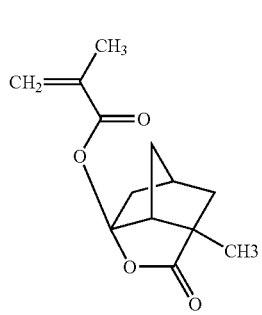
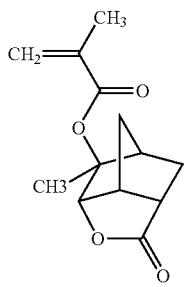 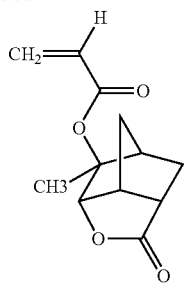
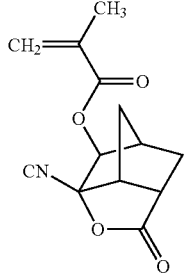 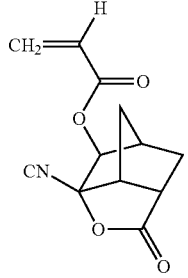
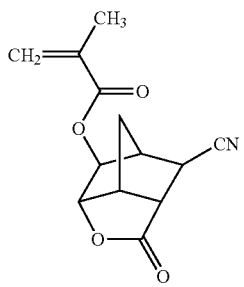 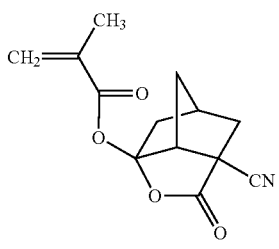
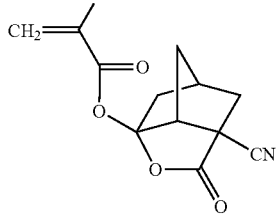
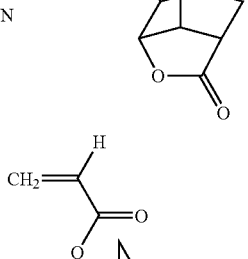
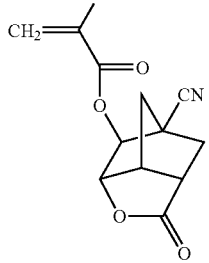
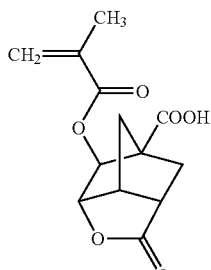 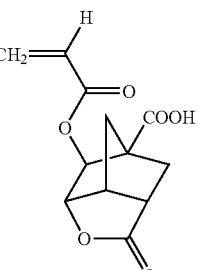

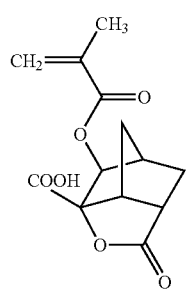
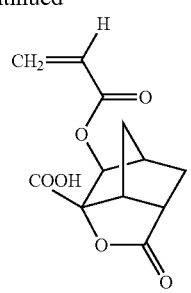
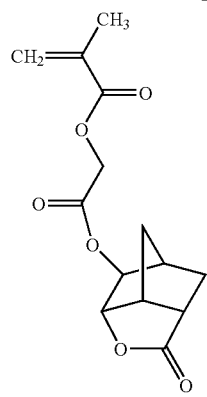
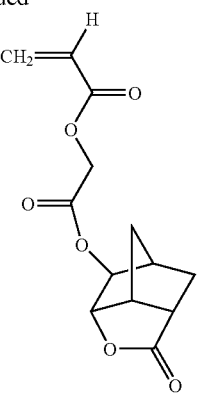
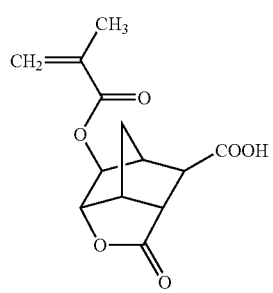
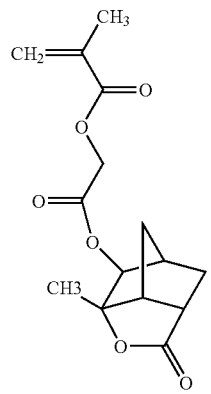
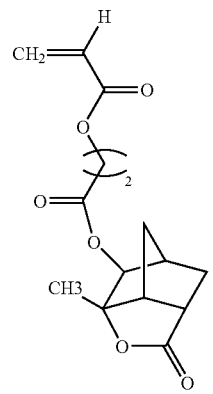
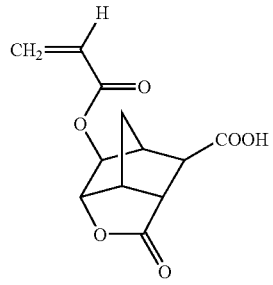
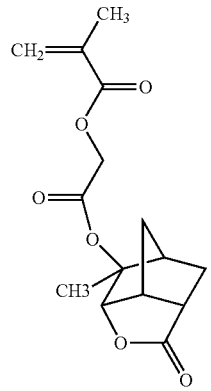
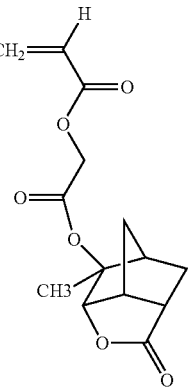
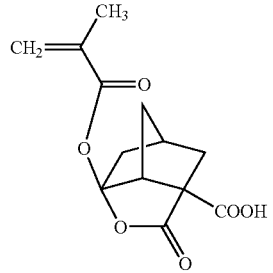
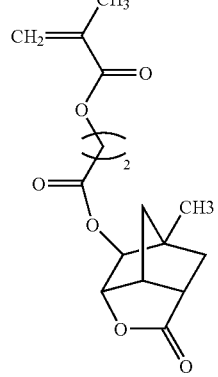
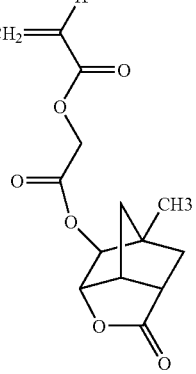
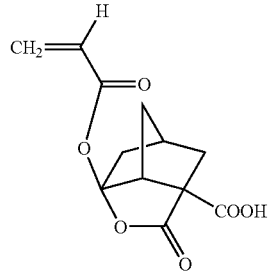

-continued
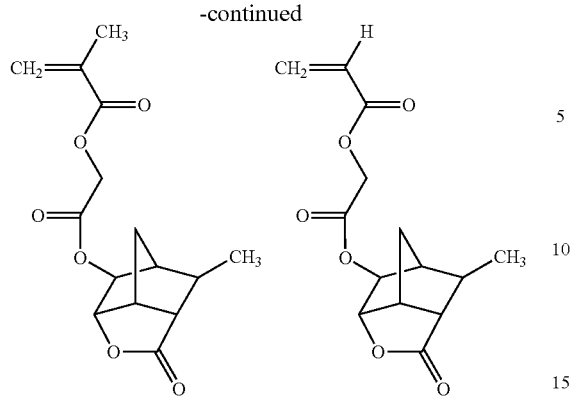
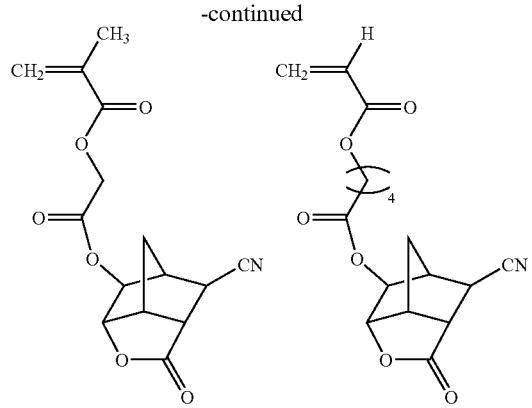
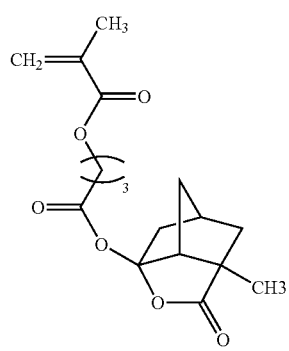
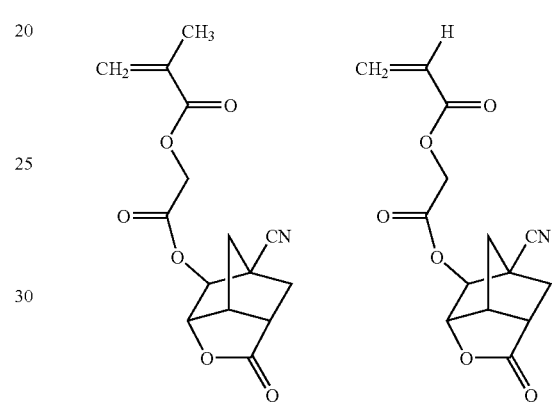
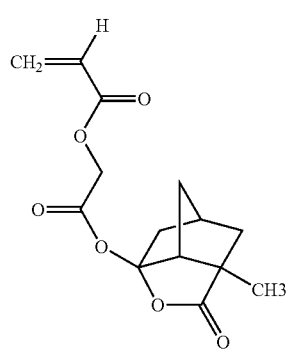
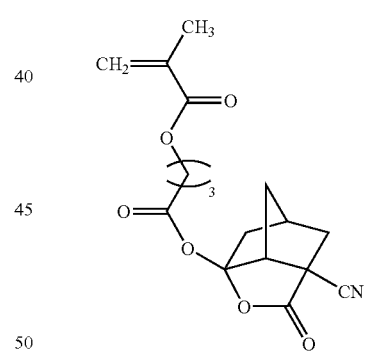
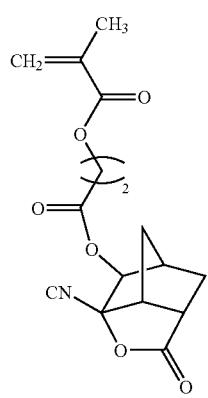
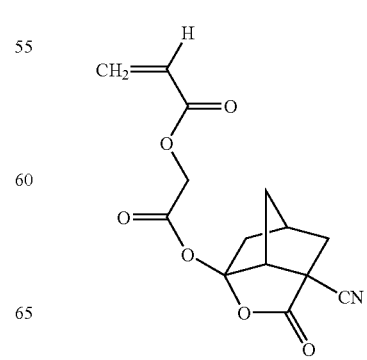

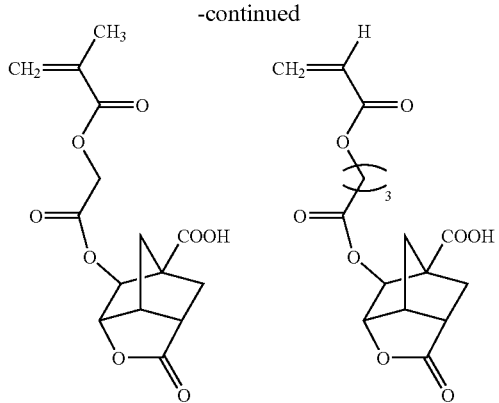
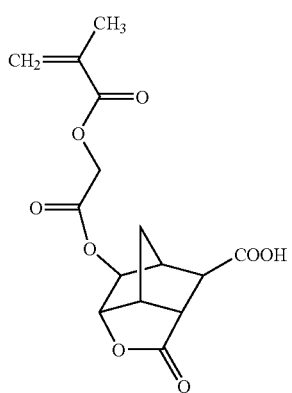
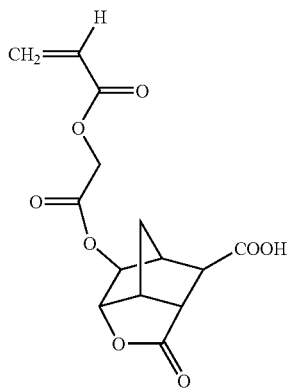
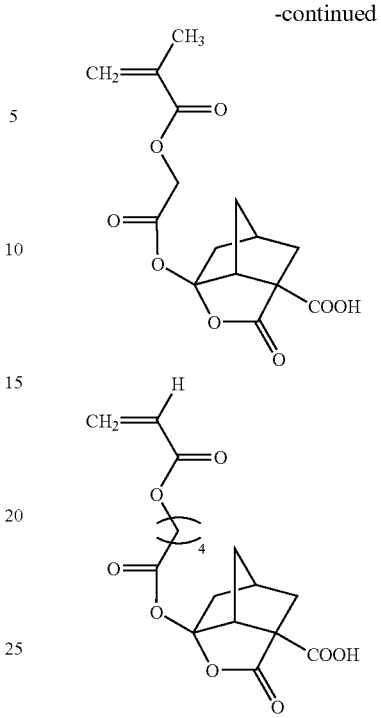
The followings are specific examples of monomers from which the structural unit represented by the formula (IVb) is derived.
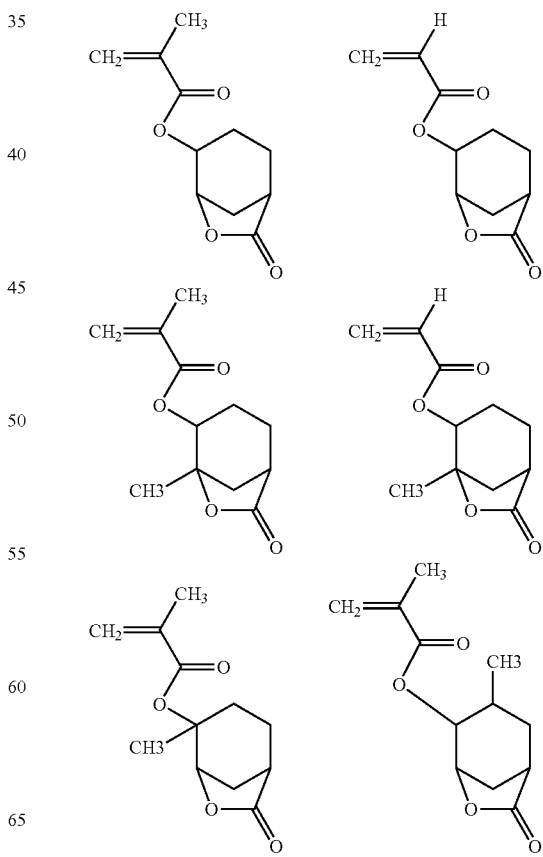

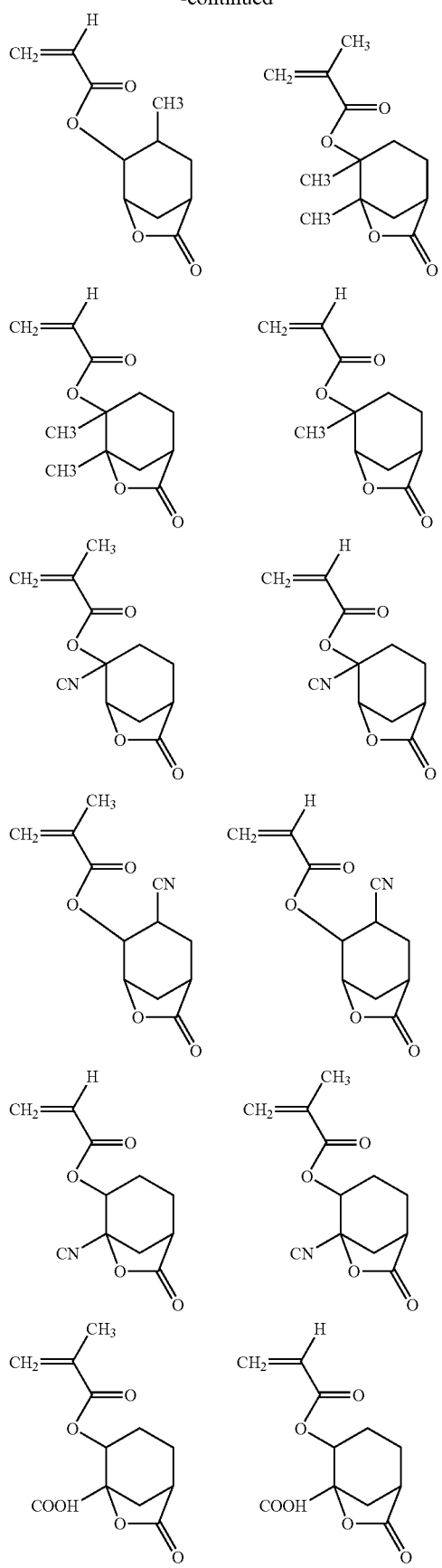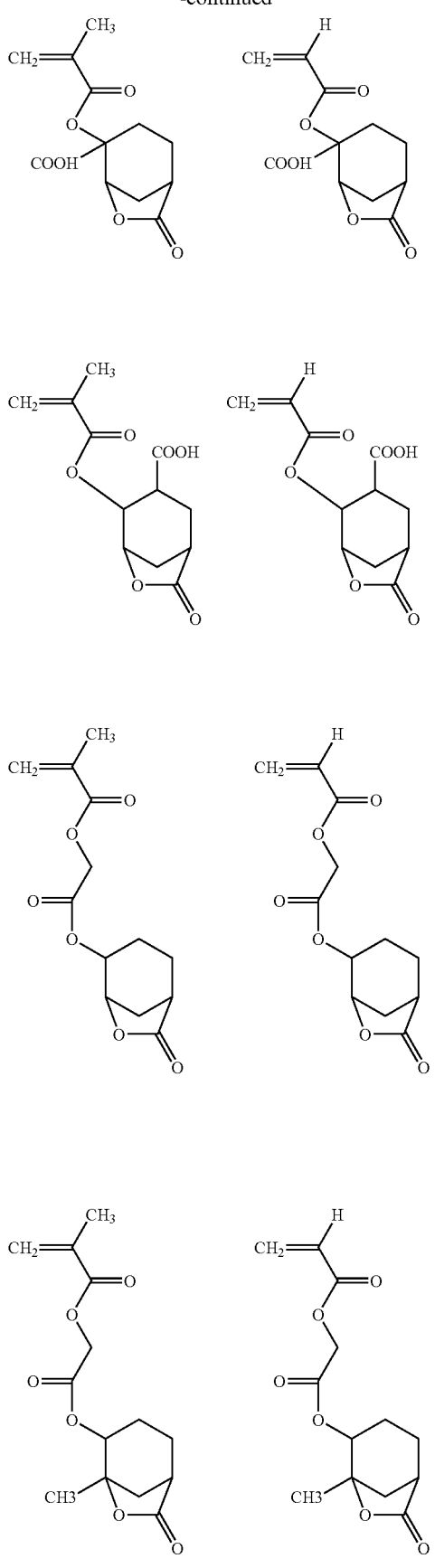

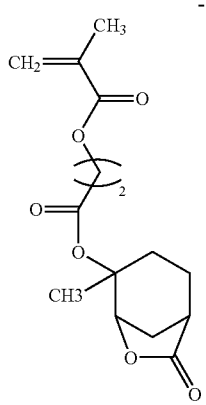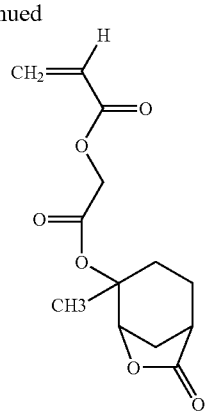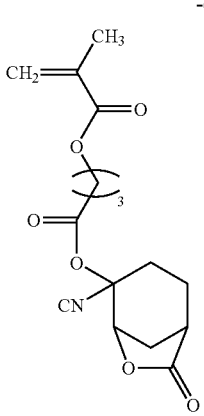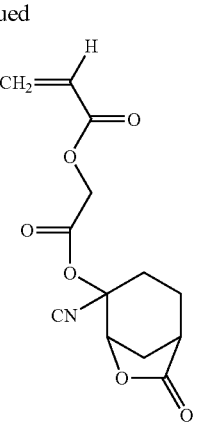
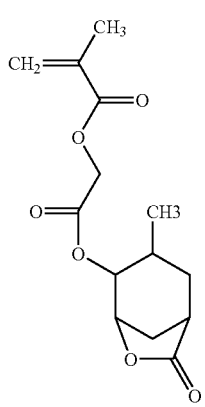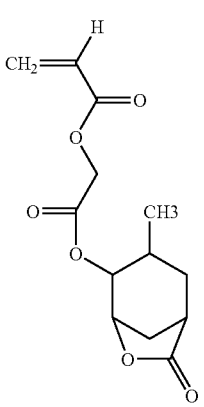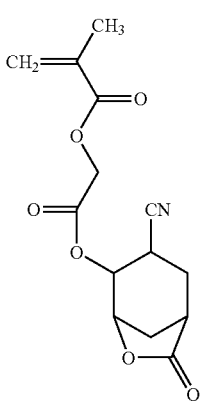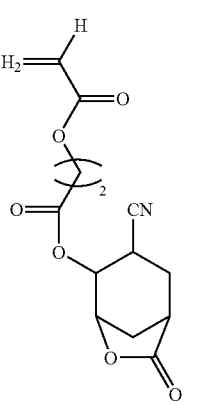
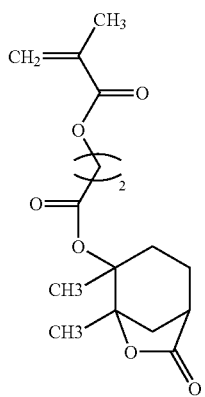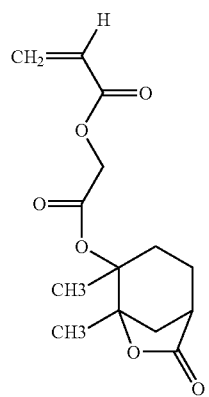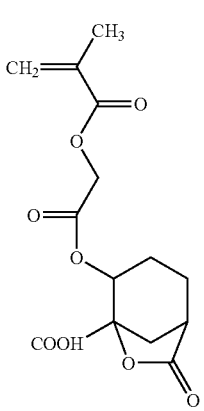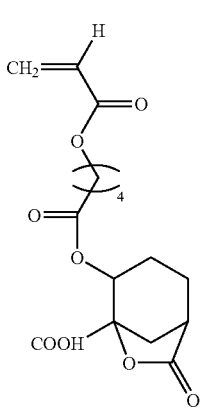
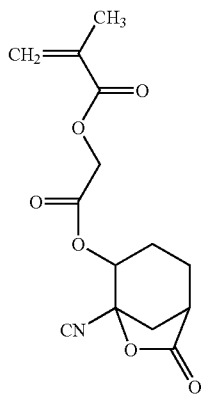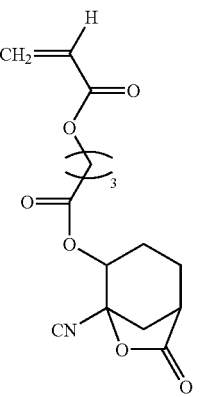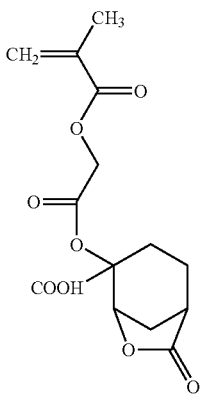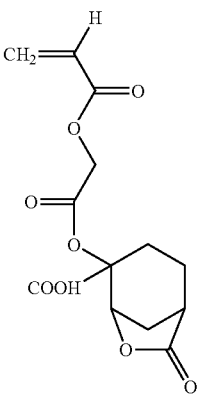

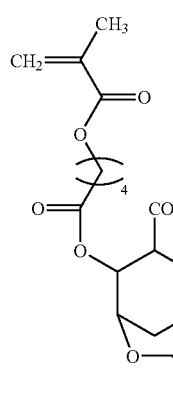
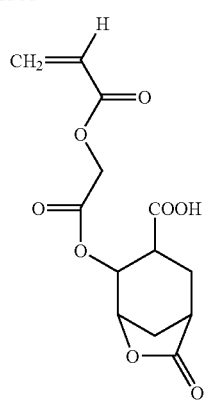
The following are specific examples of monomers from which the structural unit represented by the formula (IVc) is derived.
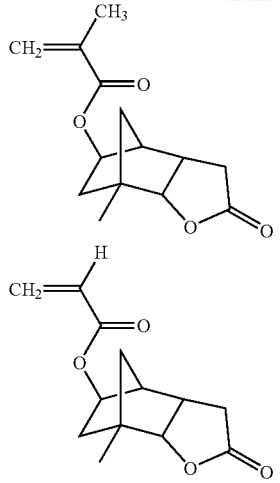
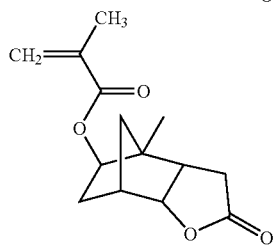
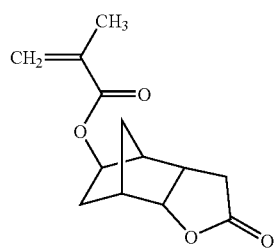
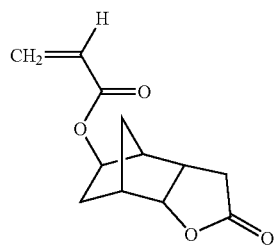
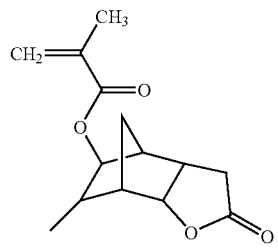
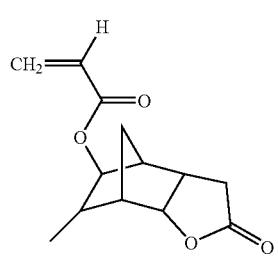

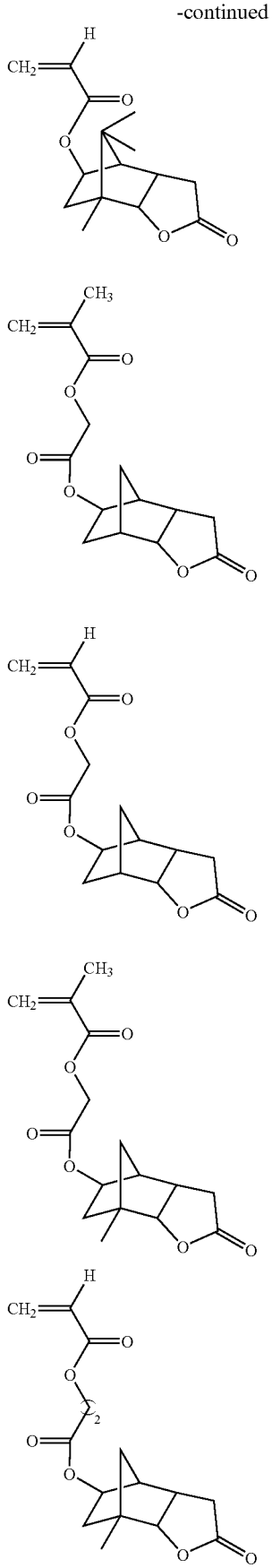
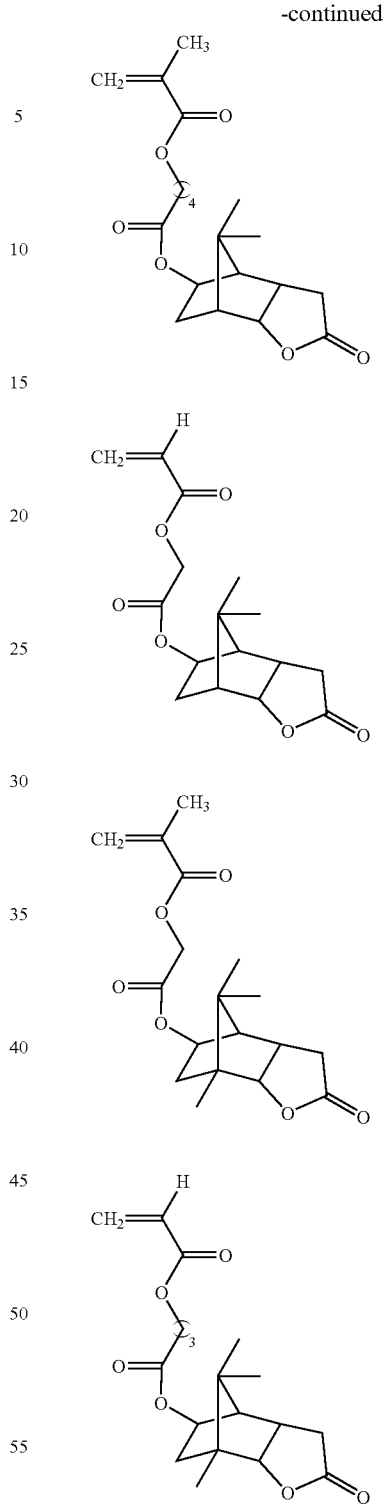

Examples of monomers giving the structural units represented by the formulae (IVa), (IVb) and (IVc) include (meth)acrylic acid esters or mixtures thereof obtained from the following hydroxyl-containing aliphatic lactone and (meth)acrylic acid. These esters can be produced, for example, by a reaction between the corresponding hydroxyl-group-containing aliphatic lactone and (meth)acrylic acid (see JP-A 2000-26446, for example).

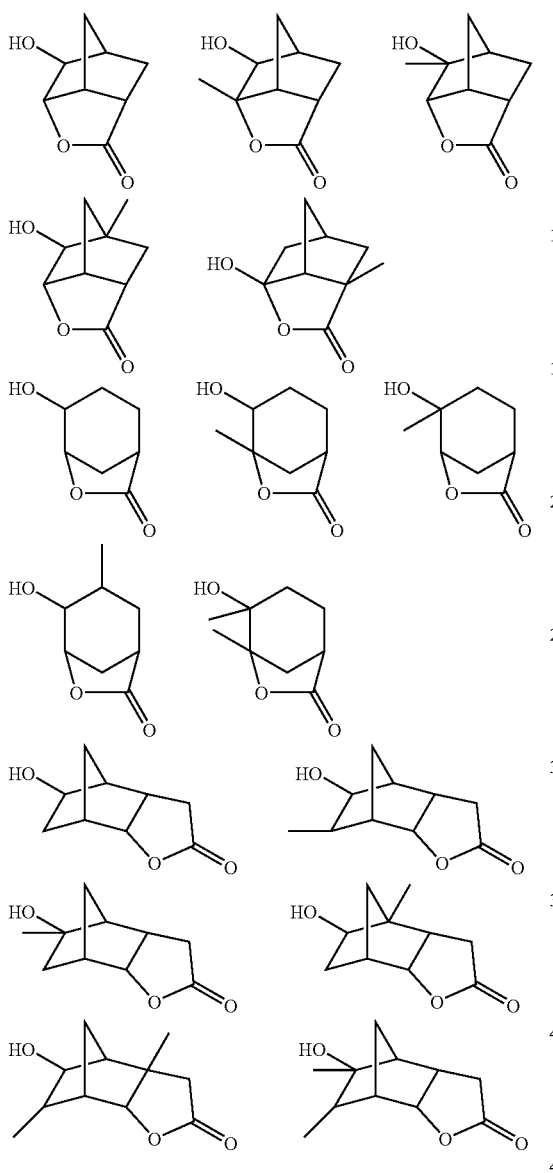

The resin of the chemically amplified resist composition of the present invention also preferably further contains a structural unit represented by the formula (V).

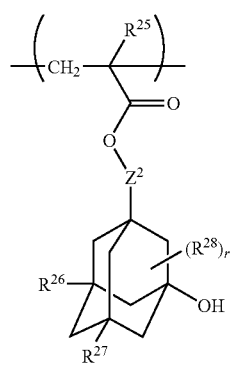

wherein $R^{25}$ represents a hydrogen atom or a methyl group, $R^{26}$ and $R^{27}$ independently represent a hydrogen atom, a methyl group, or a hydroxyl group, $R^{28}$ represents a methyl group, r represents an integer of 0 to 12, $Z^2$ represents a single bond or a —[CH2]$_k$—COO— group, and k represents an integer of 1 to 4.

The followings are specific examples of monomers from which a structural unit represented by the formula (V) is derived.

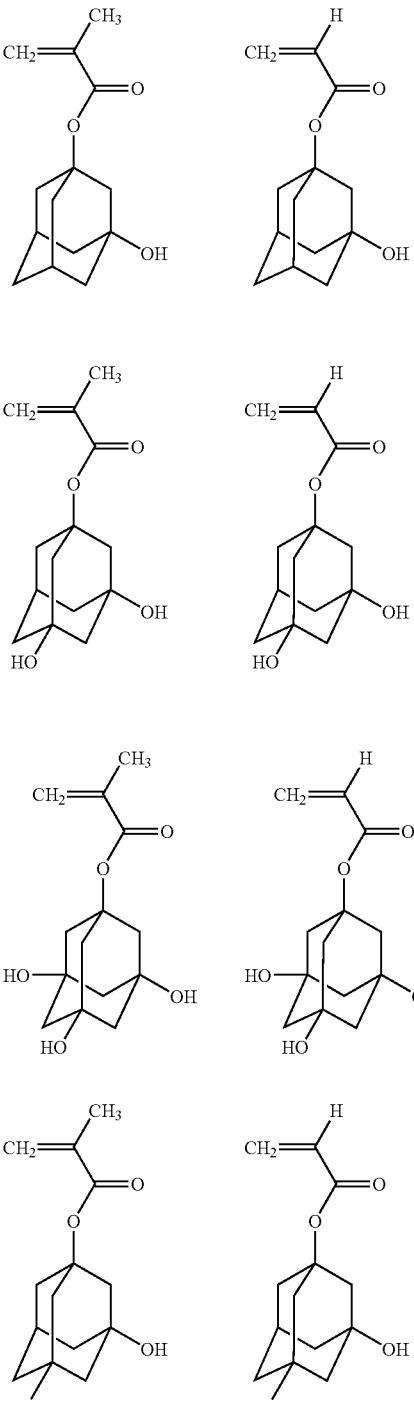

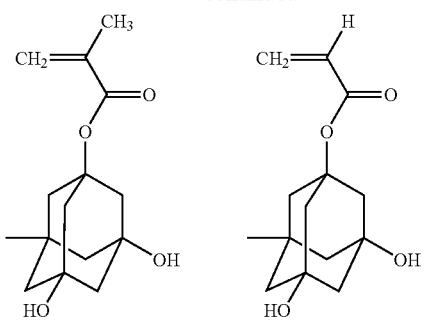
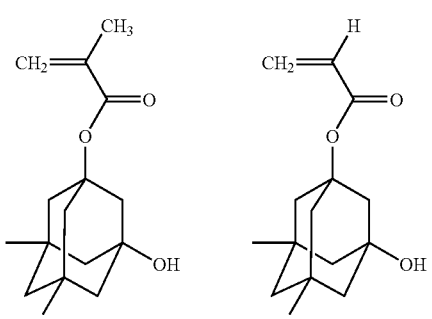
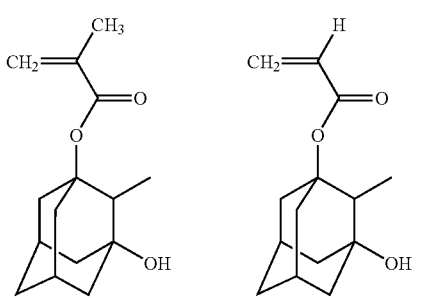
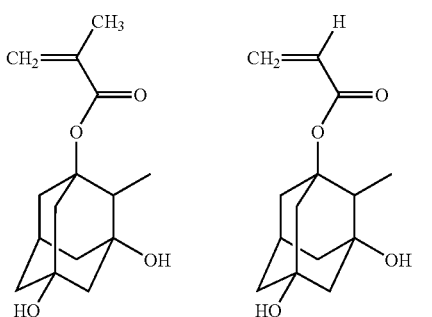
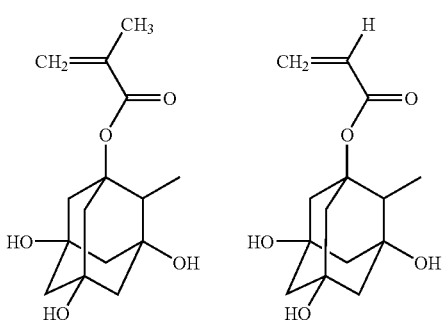
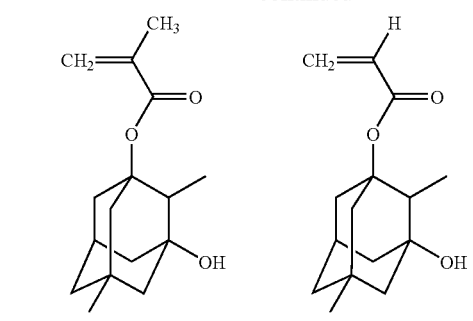
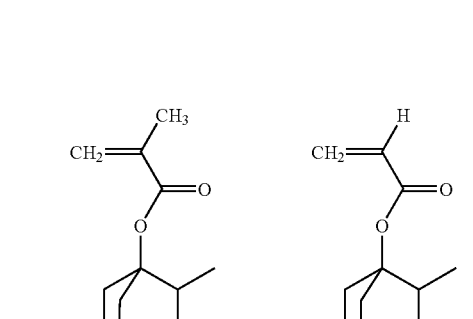
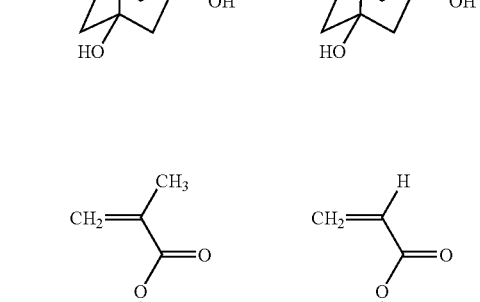
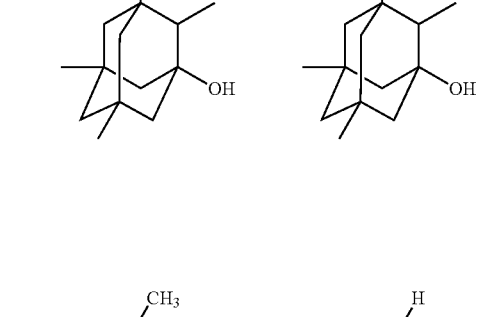
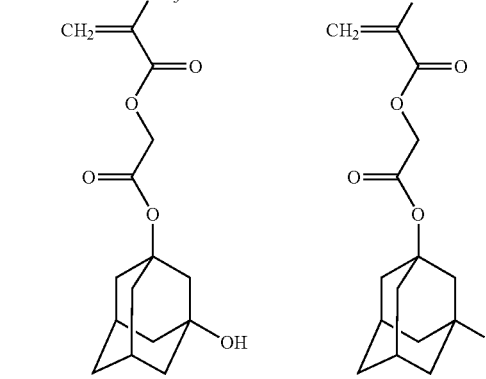

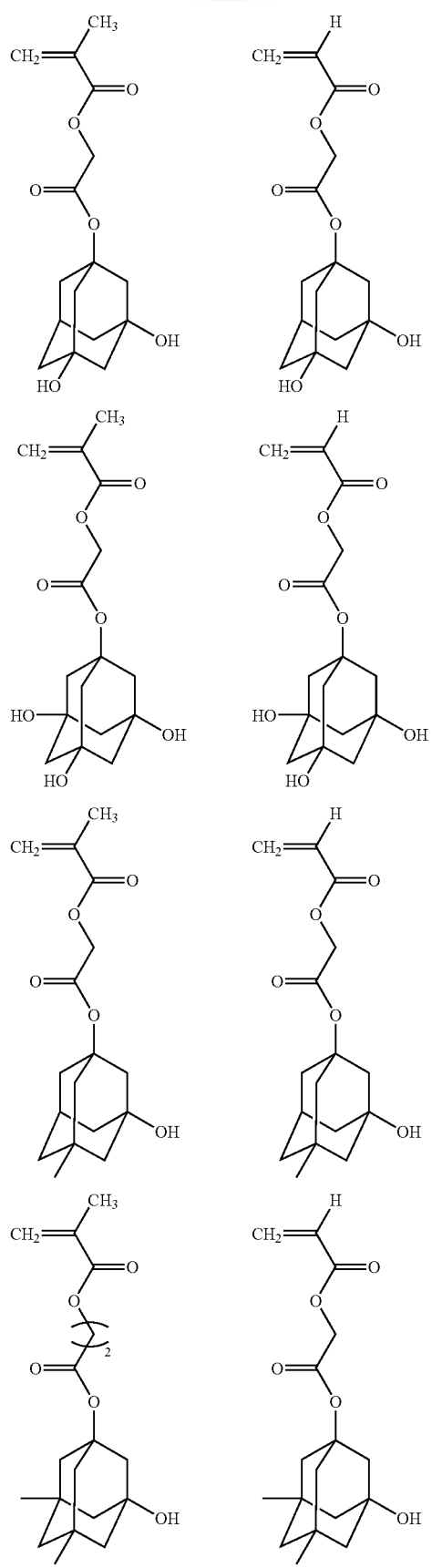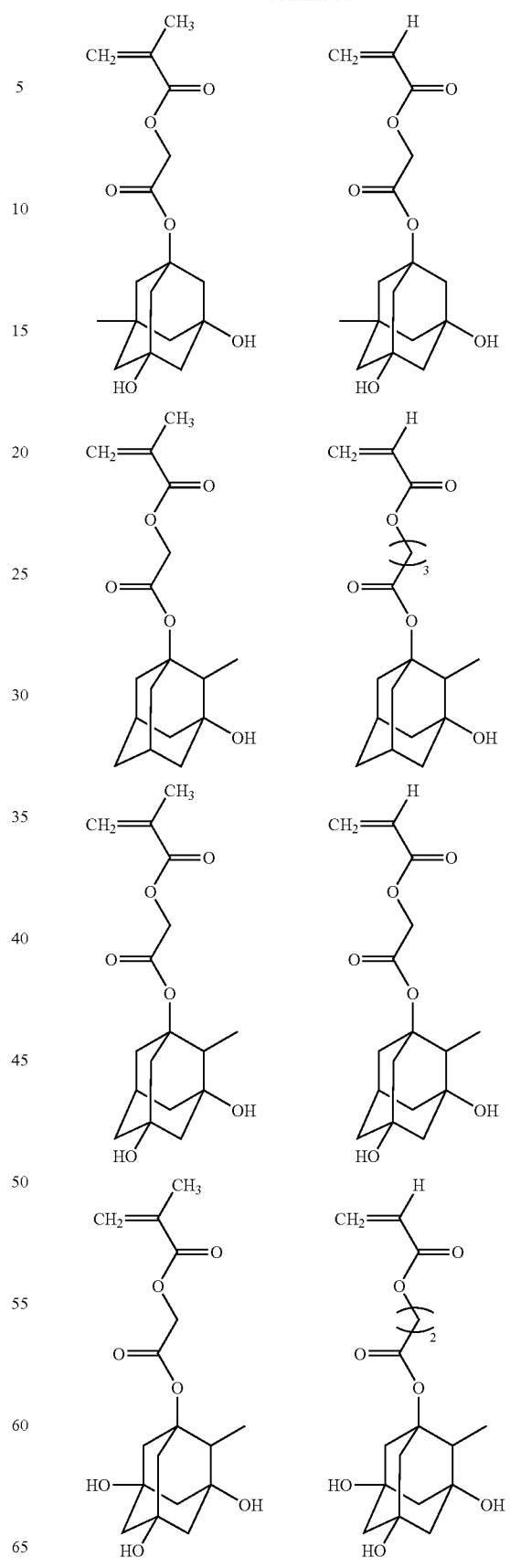

-continued

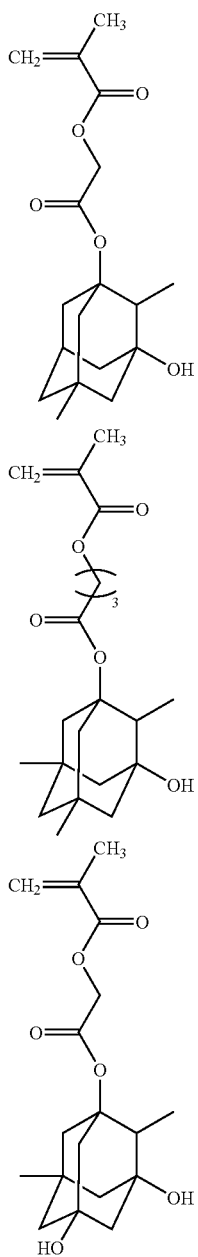
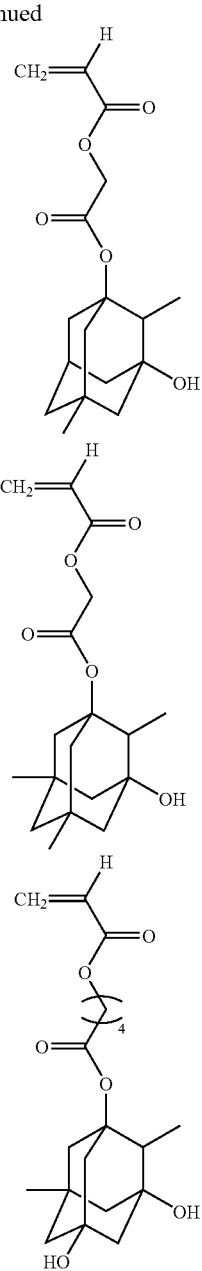

Preferred examples are those in which $R^{26}$ and $R^{27}$ independently represent a hydrogen atom or a hydroxyl group, and r=0.

Also, resins containing a structural unit derived from 3-hydroxy-1-adamantyl (meth)acrylate, 3,5-dihydroxy-1-adamantyl (meth)acrylate, 1-(3-hydroxy-1-adamantyloxycarbonyl)methyl methacrylate, or 1-(3,5-dihydroxy-1-adamantyloxycarbonyl)methyl methacrylate will give a chemically amplified resist composition affording high resolution and are therefore more preferable.

Monomers giving these structural units such as 3-hydroxy-1-adamantyl (meth)acrylate or 3,5-dihydroxy-1-adamantyl (meth)acrylate can be obtained in the form of commercially available products. They can also be produced, for example, by allowing the corresponding hydroxyadamantane to react with (meth)acrylic acid or a halide thereof.

The resin in the present invention may also include a structural unit having a monocyclic lactone structure.

Examples of the structural units having such a lactone structure include those represented by the formulae (VIIIa), (VIIIb), and (VIIIc) below.

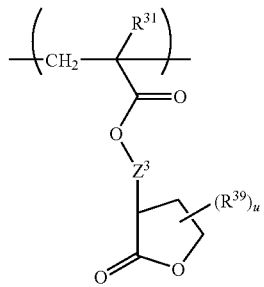

(VIIIa)

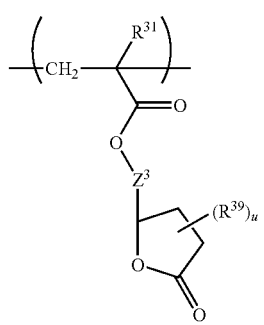

(VIIIb)

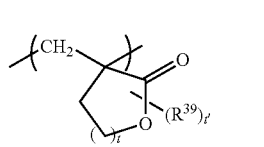

(VIIIc)

wherein $R^{31}$ represents a hydrogen atom or a methyl group, and $R^{39}$ represents a methyl group, u represents an integer of 0 to 5, t represents an integer of 0 to 3, and t' represents an integer of 0 to (2t+2), $Z^3$ represents a single bond or a —[$CH_2$]$_k$—COO— group, and k represents an integer of 1 to 4.

The followings are specific examples of monomers from which the structural unit represented by the formula (VIIIa) is derived.

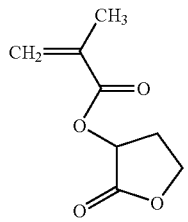
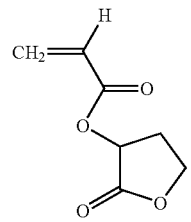
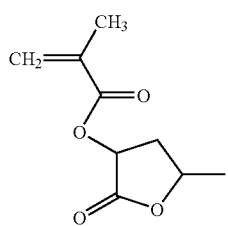
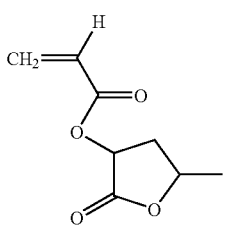

-continued
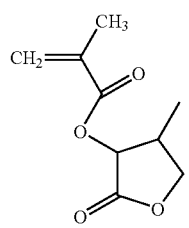 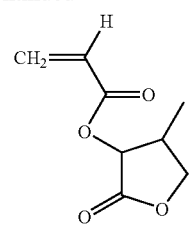
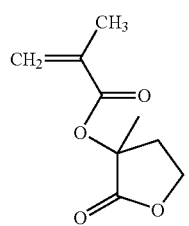 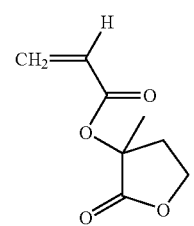
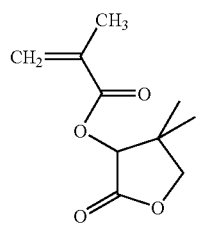 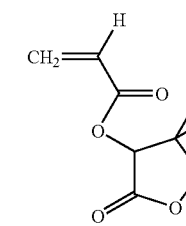
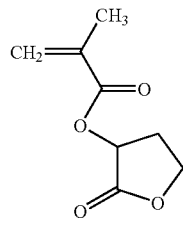 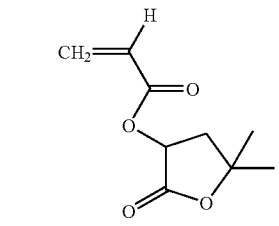
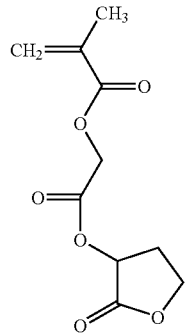 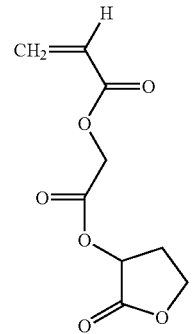
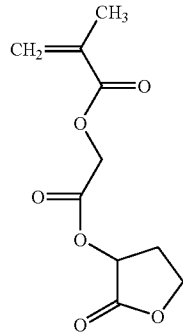 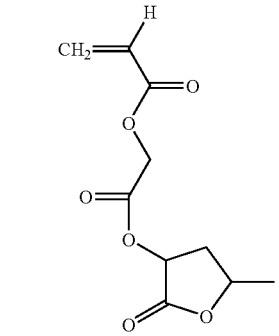
-continued
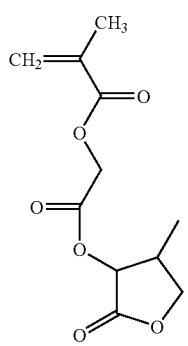 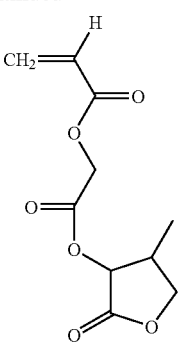
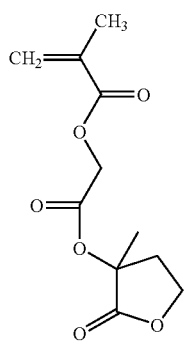 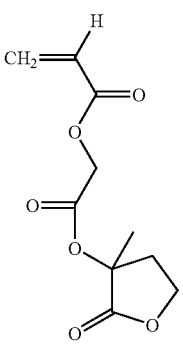
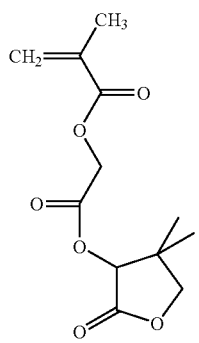 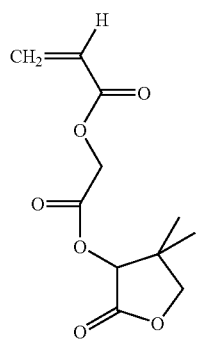
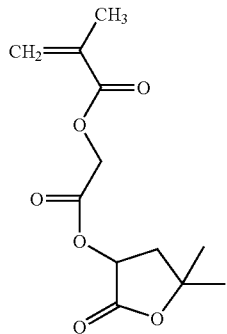 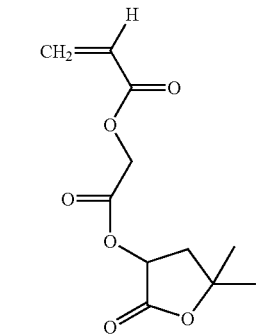
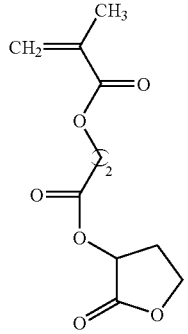 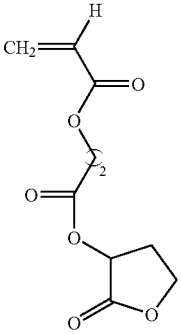

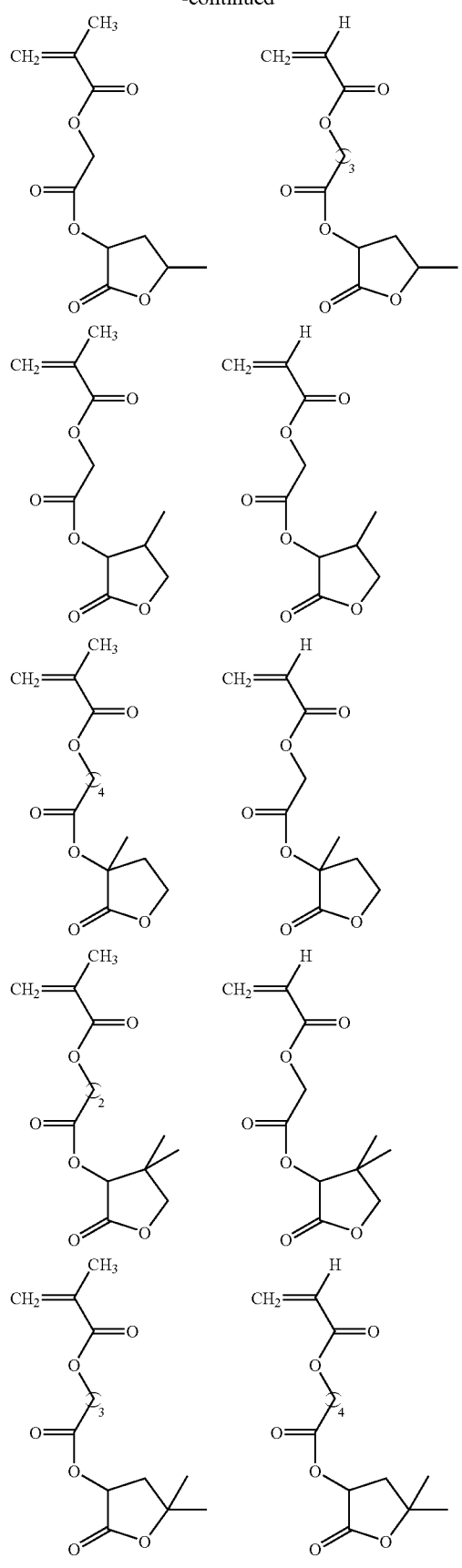
The followings are specific examples of monomers from which the structural unit represented by the formula (VIIIb) is derived.
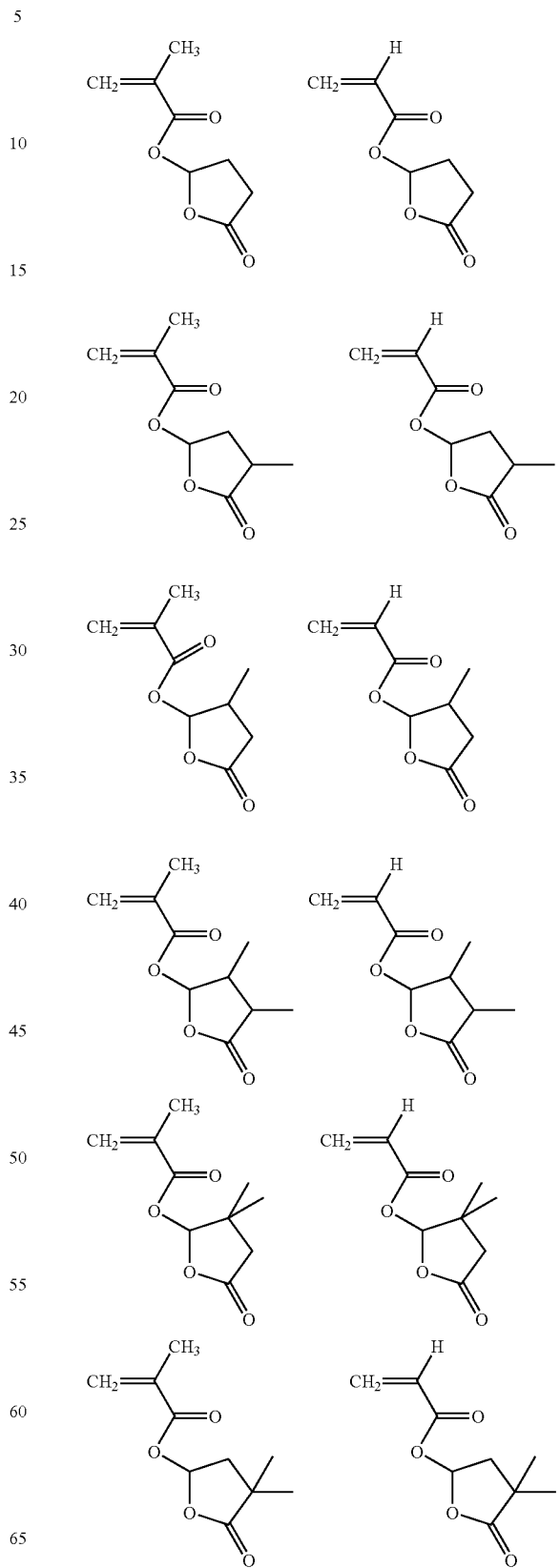

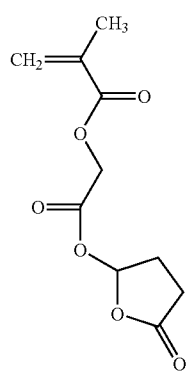 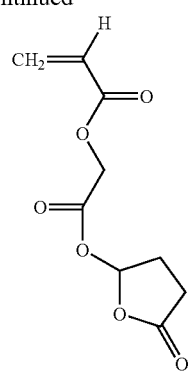 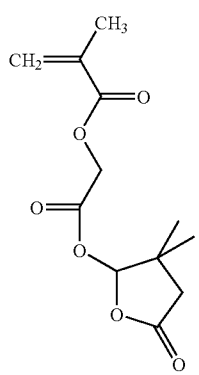 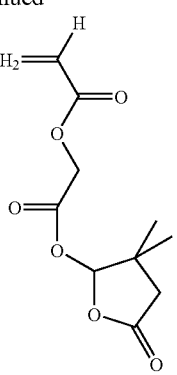
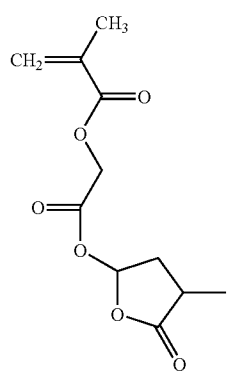 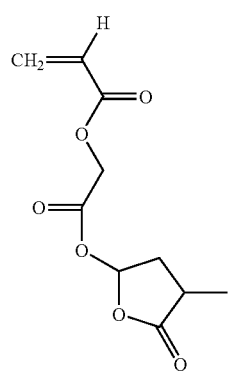 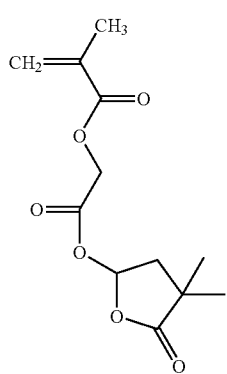 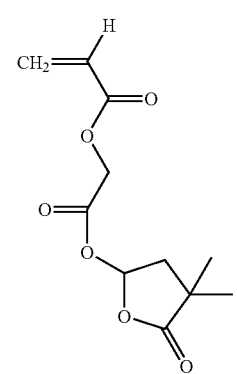
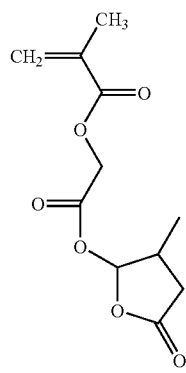 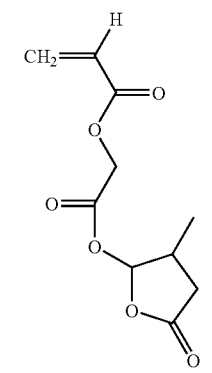 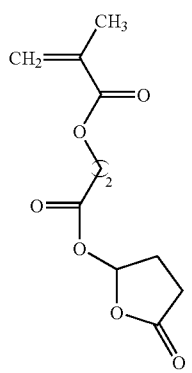 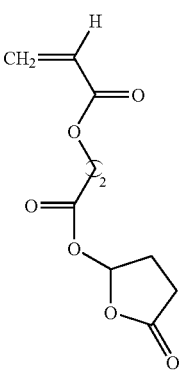
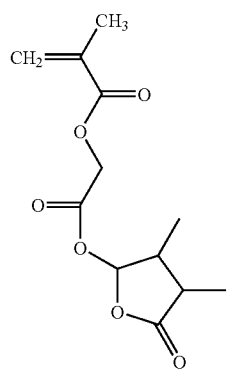 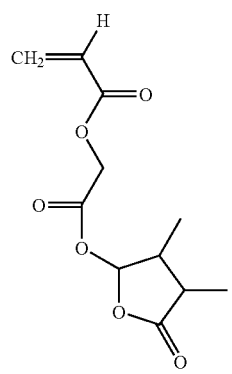 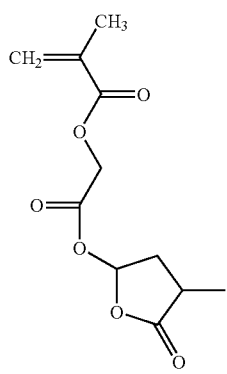 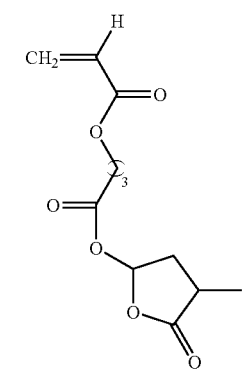

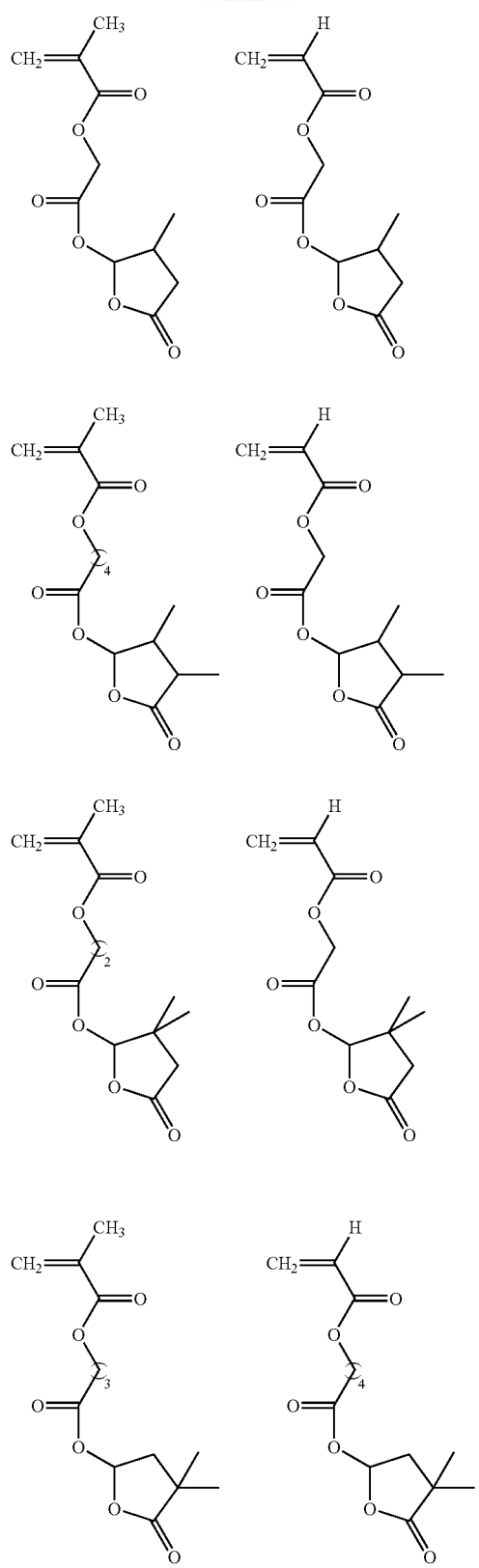

The followings are specific examples of monomers from which the structural unit represented by the formula (VIIIc) is derived.

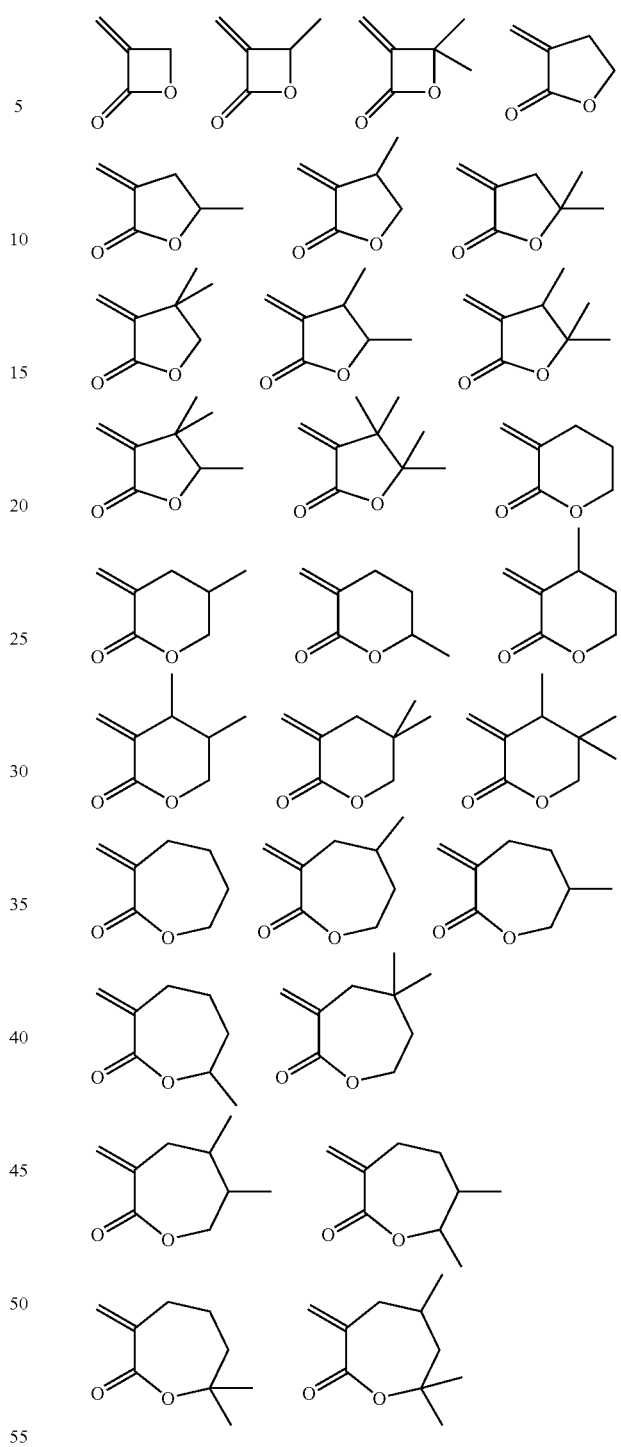

Resist resins obtained from hexahydro-2-oxo-3,5-methano-2H-cyclopenta[b]furan-6-yl (meth)acrylate, tetrahydro-2-oxo-3-furyl (meth)acrylate, or 2-(5-oxo-4-oxatricyclo[4.2.1.0$^{3,7}$]nonan-2-yloxy)-2-oxoethyl (meth)acrylate are more preferable.

Monomers such as (meth)acryloyloxy-γ-butyrolactone can be produced by allowing acrylic acid or methacrylic acid to react with an α- or β-bromo-γ-butyrolactone in which the lactone ring may be optionally substituted with an alkyl group, or by allowing an acrylic acid halide or methacrylic acid halide to react with an α- or β-hydroxy-γ-butyrolactone in which the lactone ring may be optionally substituted with an alkyl group.

The resin of the present invention may also include a structural unit derived from monomer that is stable to acid, that is, a structural unit derived from 2-norbornene. In such cases, an alicyclic group will directly present in the main chain, which will therefore result in a sturdy structure and allow dry etching resistance to be improved. 2-norbornene can be introduced into the main chain during polymerization, for example, by radical polymerization with the combined use of an aliphatic unsaturated dicarboxylic anhydride such as maleic anhydride or itaconic anhydride in addition to the corresponding 2-norbornene. The structural unit derived from 2-norbornene is thus formed upon the opening of the double bond in the norbornene structure, and can be represented by the formula (d), whereas structural unit derived from maleic anhydride or itaconic anhydride is formed upon the opening of the double bond of maleic anhydride or itaconic anhydride, and can be represented by the formulas (e) and (f), respectively.

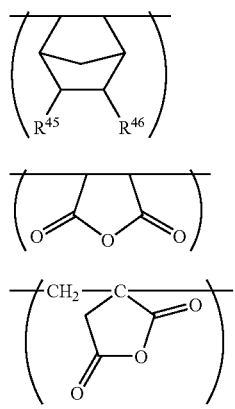

Wherein $R^{45}$ and $R^{46}$ in the formula (d) independently represent a hydrogen atom, a $C_1$ to $C_3$ alkyl group, a carboxyl group, a cyano group, or —COOU wherein U is an alcohol residue, or $R^{45}$ and $R^{46}$ are bonded together to form a carboxylic anhydride residue represented by —C(=O)OC (=O)—.

The —COOU group is an ester formed from carboxyl group, and examples of the alcohol residue corresponding to U include an optionally substituted $C_1$ to $C_8$ alkyl group, and 2-oxooxolan-3- or -4-yl group. Examples of alkyl group substituents include a hydroxyl and an alicyclic hydrocarbon residue groups.

Specific examples, for when $R^{45}$ and/or $R^{46}$ is or are alkyl groups, include methyl, ethyl, and propyl groups, and specific examples of the alkyl group to which a hydroxyl group is bonded include hydroxymethyl, and 2-hydroxyethyl groups.

The followings are specific examples of monomers from which the norbornene structural represented by the formula (d) is derived.
2-norbornene,
2-hydroxy-5-norbornene,
5-norbornene-2-carboxylic acid,
methyl 5-norbornene-2-carboxylate,
2-hydroxy-1-ethyl 5-norbornene-2-carboxylate,
5-norbornene-2-methanol, and
5-norbornene-2,3-dicarboxylic acid anhydride.

As long as the U in —COOU in the formula (d) is an acid-labile group, such as an aliphatic ester in which the carbon atom bonded to the oxygen side of the carboxyl group is a quaternary carbon atom, the structural unit will have an acid-labile group in the side chain, despite having a norbornene structure.

Specific examples of the monomer contain such norbornene structure and an acid-labile group include, t-butyl 5-norbornene-2-carboxylate, 1-cyclohexyl-1-methylethyl 5-norbornene-2-carboxylate, 1-methylcyclohexyl-5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl) -1-methylethyl 5-norbornene-2-carboxylate, 1-(4-hydroxycyclohexyl) -1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

While the resin of the present invention can be prepared as desired, depending on the type of radiation used for patterning exposure, the type of acid-labile group and the like, the content of structural units derived from monomers having the acid-labile group in the side chain is preferably adjusted to within a range of about 10 to 80 mol % with respect to the total structural units constituting the resin.

When the structural unit derived from 2-alkyl-2-adamantyl (meth)acrylate or 1-(1-adamantyl)-1-alkylalkyl (meth)acrylate in particular is included as the structural unit derived from the monomer with the acid-labile group in the side chain, adjusting the content to about 15 mol % or more with respect to the total structural units constituting the resin will result in a sturdy structure because the resin will have an alicyclic group, which is advantageous in terms of the dry etching resistance of the resulting immersion photo-resist composition.

The content of the structural units represented by the formula (I) are suitably adjusted to within a range of 2 to 70 mol %, and preferably about 5 to 35 mol %, with respect to the total structural units constituting the resin.

The content of the structural units having the polycyclic lactone structure are suitably adjusted to within a range of 2 to 70 mol %, and preferably about 10 to 50 mol %, with respect to the total structural units constituting the resin.

When the resin furthermore includes the structural unit having the formula (V) and/or the monocyclic lactone structure, the content of the structural units having the formula (V) is preferably within the range of about 2 to 70 mol %, and more preferably about 5 to 35 mol %, and the content of the structural units having the monocyclic lactone structure is preferably within the range of about 2 to 70 mol %, and more preferably about 10 to 50 mol %, with respect to the total structural units forming the resin.

The content of the structural unit derived from the acid-labile monomer, when included, is also usually suitable in the range of about 20 to 90 mol % with respect to the total structural units forming the resin.

When an alicyclic compound having an olefinic double bond or an aliphatic unsaturated dicarboxylic anhydride is used as the monomer, it is preferably used in excess amounts from the viewpoint of a tendency that the addition polymerization does not easily proceed.

The monomers that are used may be a combination of monomers that have the same olefinic double bond moiety but different acid-labile group, combinations of monomers with the same acid-labile group and different olefinic double bond moiety, and monomers with different combinations of acid-labile group and olefinic double bond moiety.

The resin of the invention can be produced by, for example, but is not particularly limited to, radical polymerization.

One or more monomers are first dissolved in organic solvent. One or more radical polymerization initiators are then dissolved therein. The resulting reaction solution is kept at a certain reaction temperature, giving the resin.

The organic solvent used here is preferably one that is capable of dissolving all the monomers, initiator, and resulting copolymer. Examples of such organic solvent include hydrocarbons such as toluene, 1,4-dioxane, tetrahydrofuran, methyl isobutyl ketone, isopropyl alcohol, γ-butyrolactone, propylene glycol monomethyl ether acetate, and ethyl lactate. These may be used alone or in mixtures of two or more.

The initiator of the invention can be used any known one, but is not particularly limited to.

Specific initiators include azo compounds such as 2,2'-azobis isobutyronitrile, 2,2'-azobis(2-methylbutyronitrile), 1,1'-azobis(cyclohexyan-1-carbonitrile), 2,2'-azobis(2,4-dimethyl valeronitrile), 2,2'-azobis(2,4-dimethyl-4-methoxy valeronitrile), dimethyl-2,2'-azobis(2-methylpropionate), and 2,2'-azobis(2-hydroxymethylpropyonitrile); organic peroxides such as lauroyl peroxide, tert-butyl hydroperoxide, benzoyl peroxide, tert-butyl peroxyl benzoate, cumene hydroperoxide, diisopropyl peroxy dicarbonate, di-n-propylperoxy dicarbonate, tert-butylperoxy neodecanoate, tert-butyl peroxypivalate, and (3,5,5-trimethyl hexanoyl)peroxide; inorganic peroxide such as potassium persulfate, ammonium persulfate, and hydrogen peroxide.

Azo compounds in particular are more preferable. 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), and dimethyl-2,2'-azobis(2-methylpropionate) are preferable, and 2,2'-azobisisobutyronitrile and 2,2'-azobis(2,4-dimethylvaleronitrile) are more preferable.

When two kinds of initiator are used, the molar ratio is preferably in the range 1:1 to 1:10, where particularly preferable combinations are 2,2'-azobis(2,4-dimethylvaleronitrile) and 2,2'-azobisisobutyronitrile, 2,2'-azobis(2,4-dimethylvaleronitrile) and 2,2'-azobis(2-methylbutyronitrile), 2,2'-azobis(2,4-dimethylvaleronitrile) and 1,1'-azobis(cyclohexane-1-carbonitrile), and 2,2'-azobis(2,4-dimethylvaleronitrile) and dimethyl-2,2'-azobis(2-methylpropionate).

The reaction temperature of the production of the resin used in the invention is usually in the range from about 0 to 150° C., and preferably from about 40 to 100° C.

The amount of solvent is preferably 1 weight time to 5 weight times relative to the amount of monomer or oligomer.

The amount of initiator is preferably 1 to 20 mol % relative to the amount of monomer or oligomer.

The weight average molecular weight of the resin obtained by the polymerization will range from about 1,000 to 500,000, and preferably about 4,000 to 50,000.

The acid generator constituting the chemically amplified resist composition of the present invention includes an acid generator represented by the formula (II).

$$A^+E^- \quad (II)$$

wherein $A^+$ represents an organic counterion, $E^-$ represents $CF_3SO_3-$, $C_2F_5SO_3-$, $C_4F_9SO_3-$, $N(SO_2C_2F_5)_2-$, $N(SO_2C_4F_9)_2-$, $N(SO_2C_6H_5)_2-$, $C(SO_2CF_3)_3-$, or $R^{21}O(CO)C(Y^1)(Y^2)SO_3-$ wherein $R^{21}$ represents a $C_1$ to $C_{30}$ hydrocarbon group which may be substituted, and the carbon atom included in the hydrocarbon group may be optionally substituted with a carbonyl group or an oxygen atom, and $Y^1$ and $Y^2$ independently represent a fluorine atom or a $C_1$ to $C_6$ perfluoroalkyl group.

The anion of the acid generator represented by the formula (II) is preferably represented by $R^{21}O(CO)CY^1Y^2SO_3-$.

The following anions are examples of such anion.

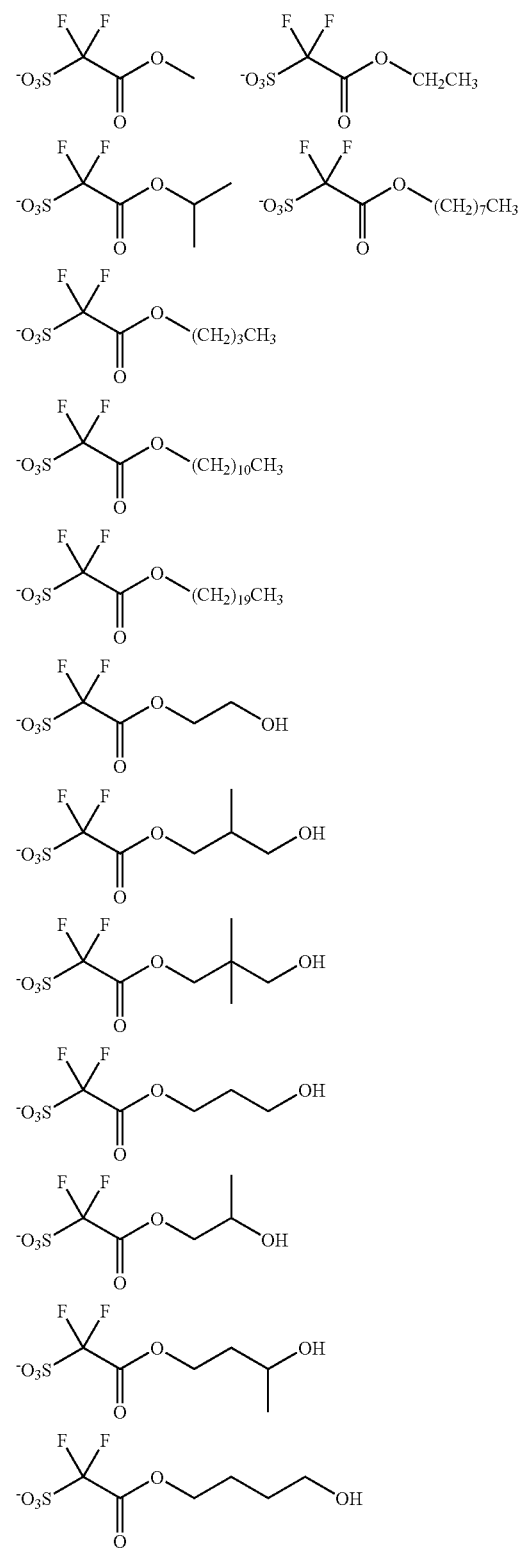

75
-continued
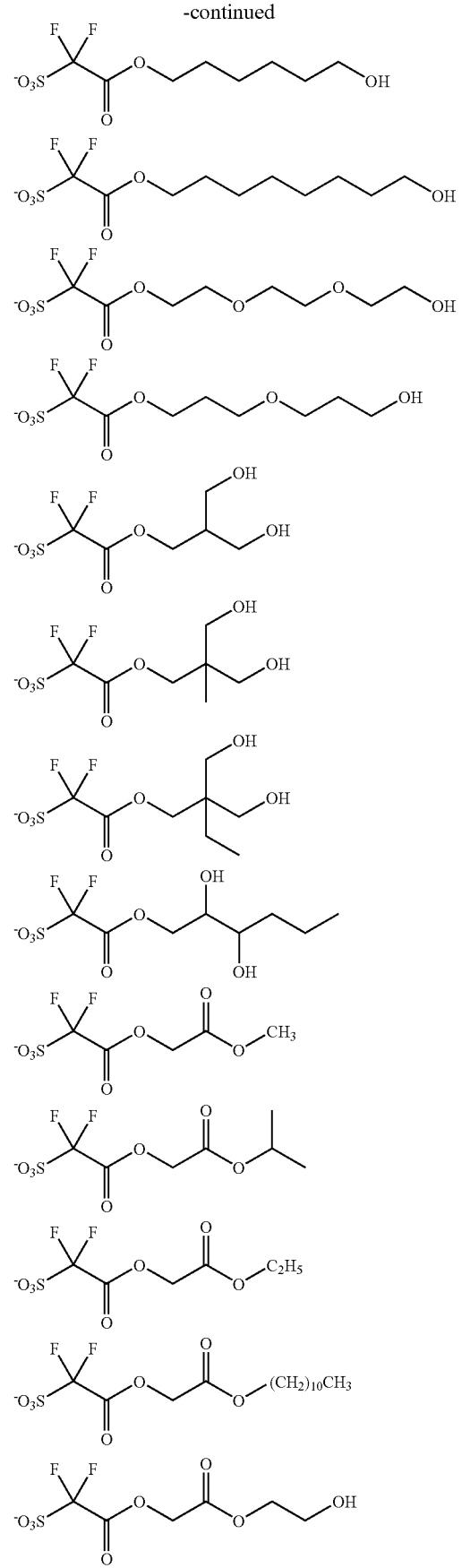
76
-continued
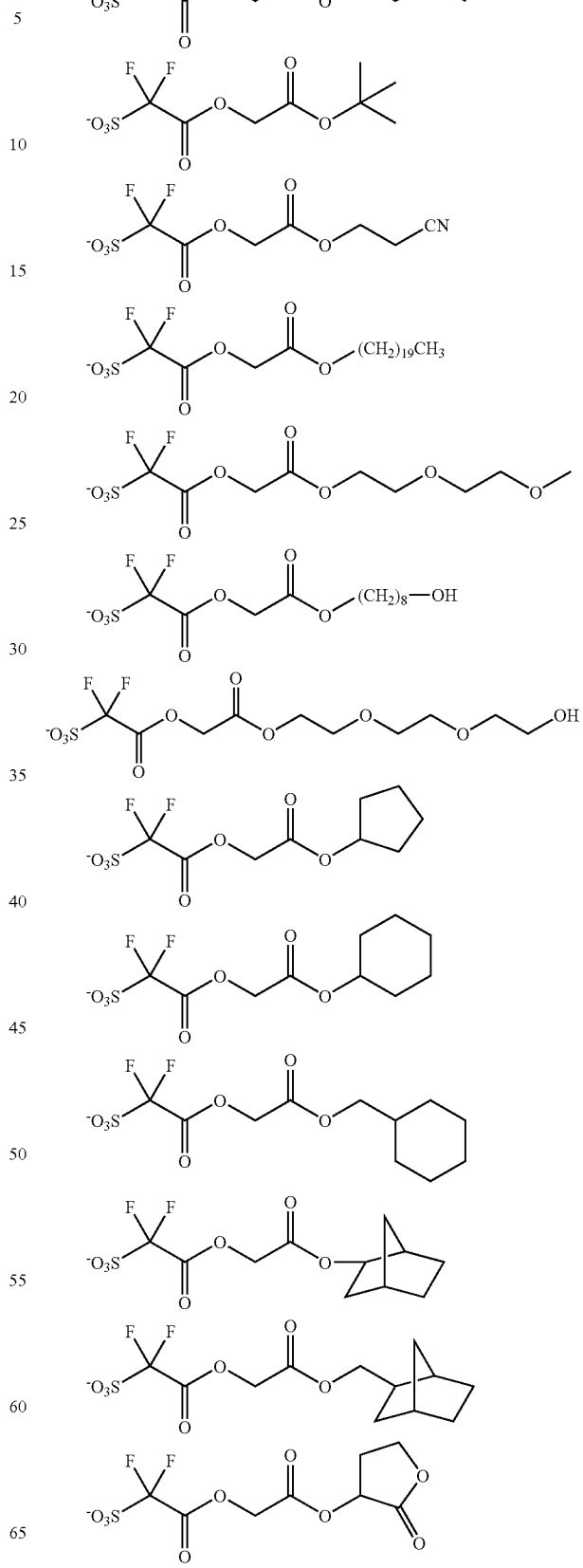

-continued
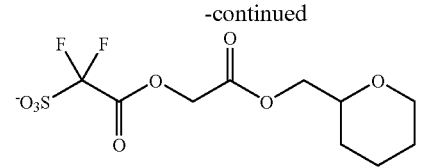
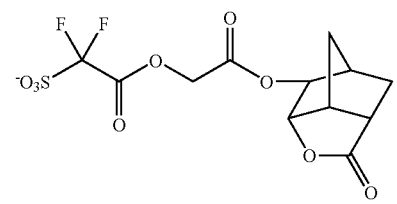
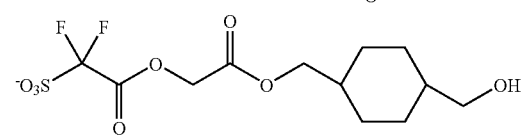
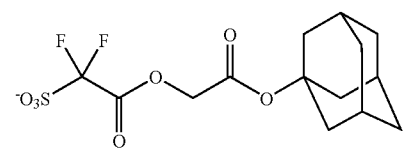
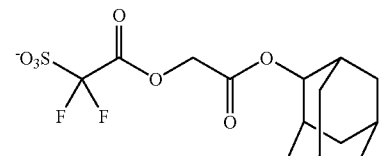
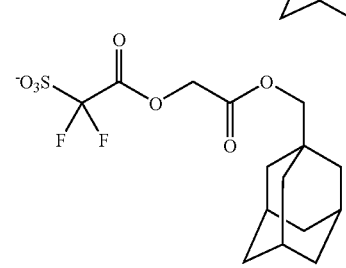
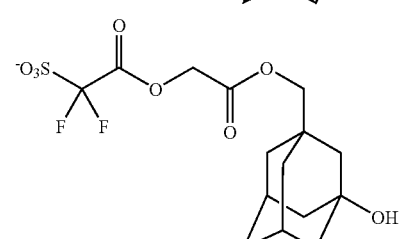
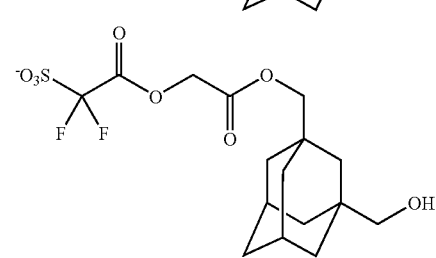
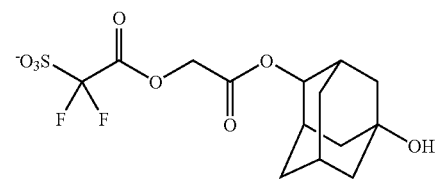
-continued
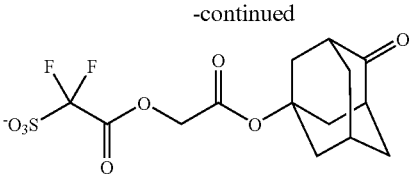
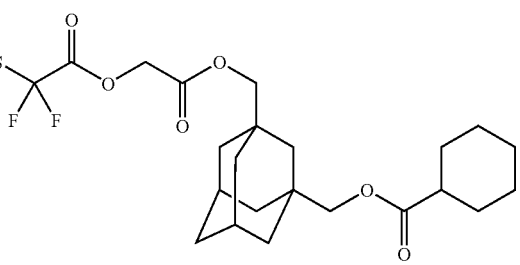
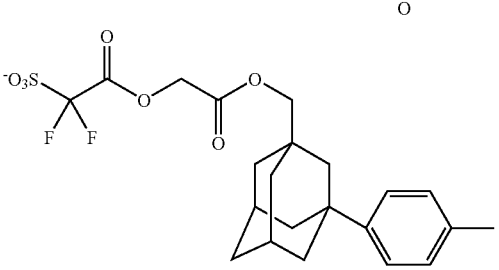
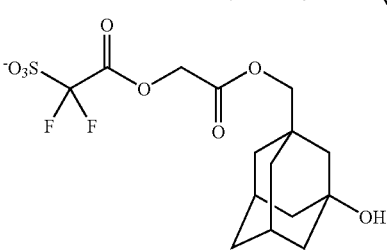
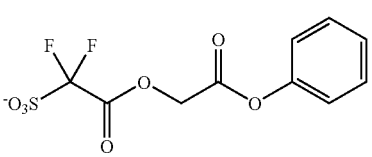
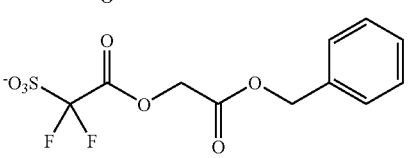
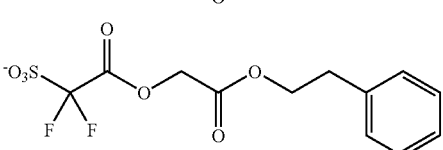
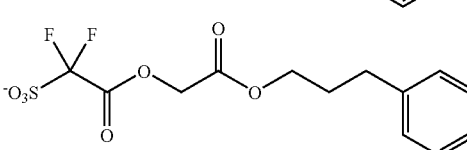
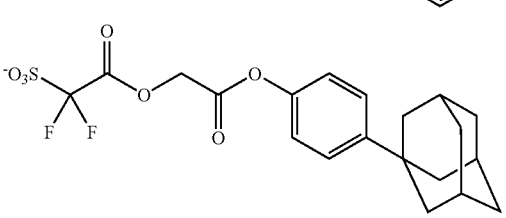

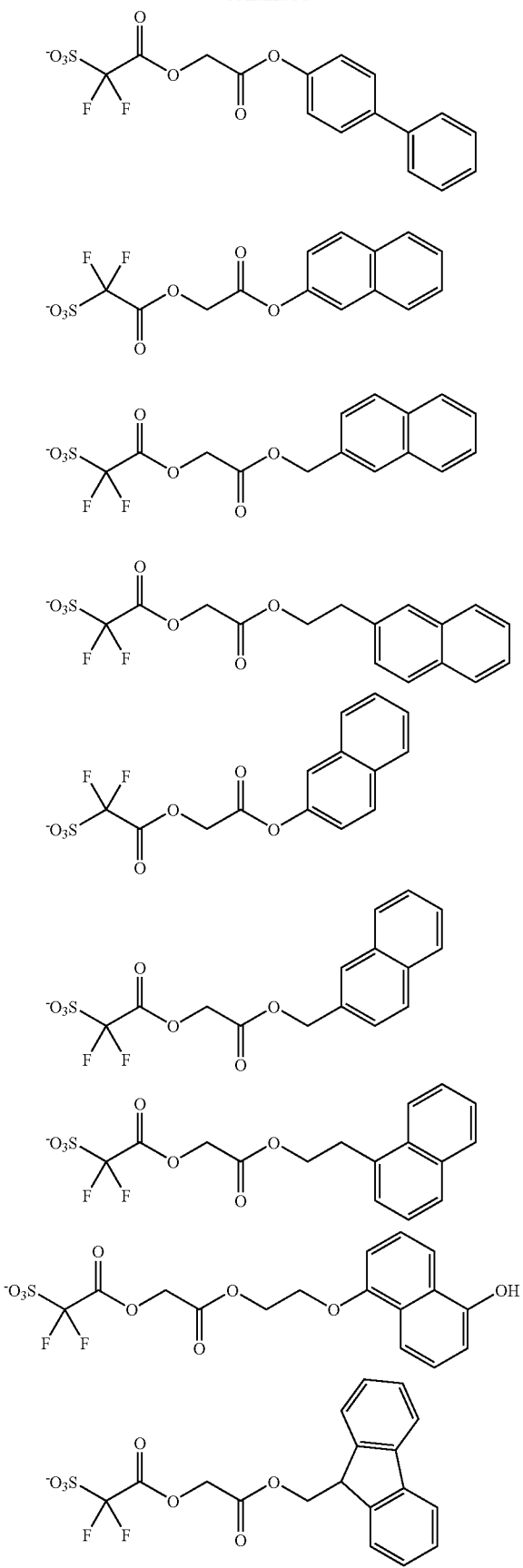
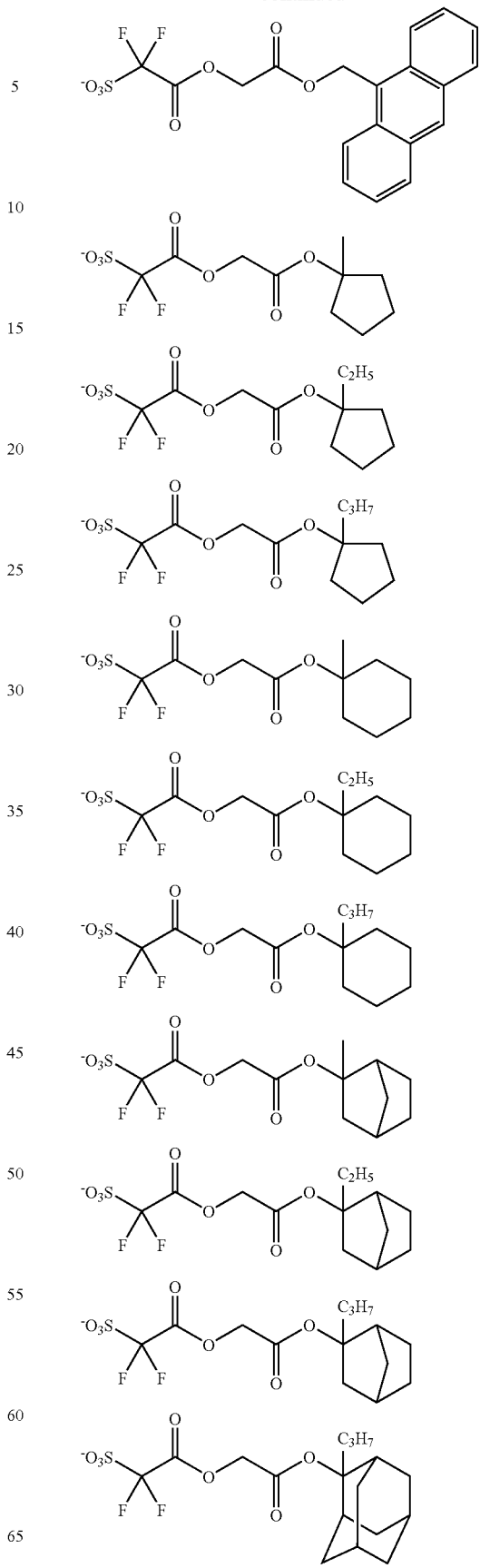

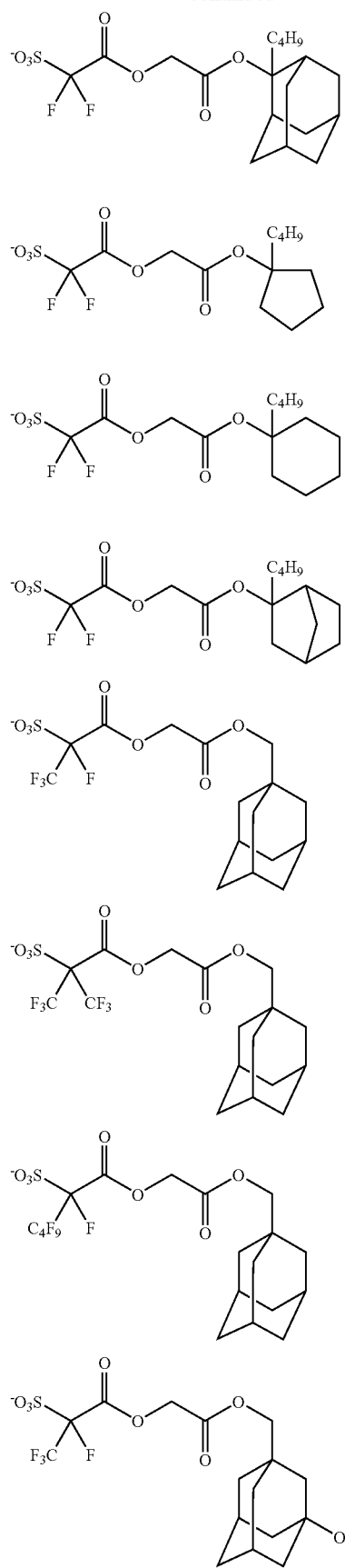
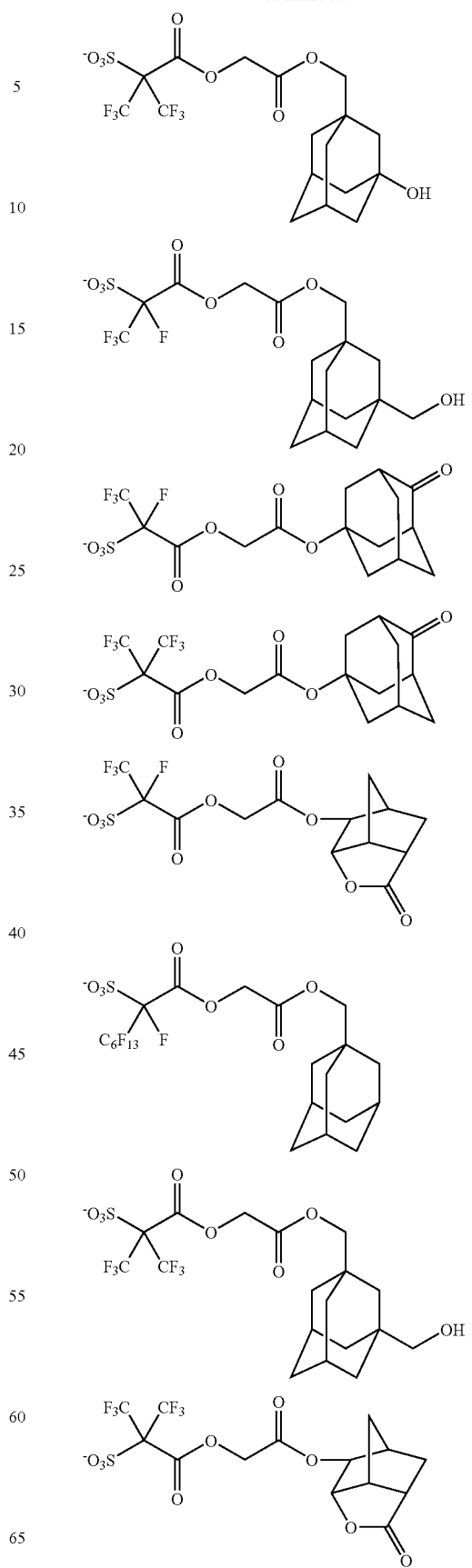

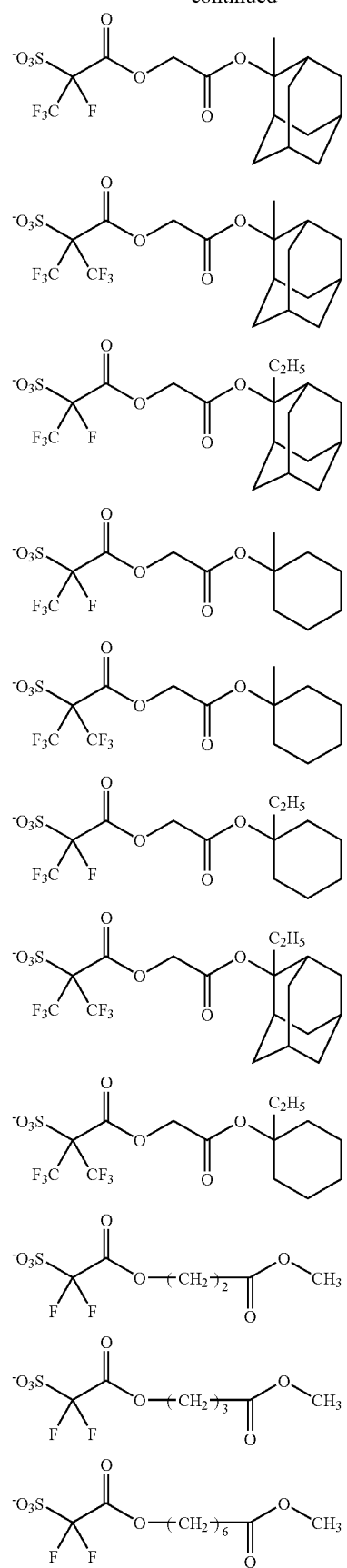
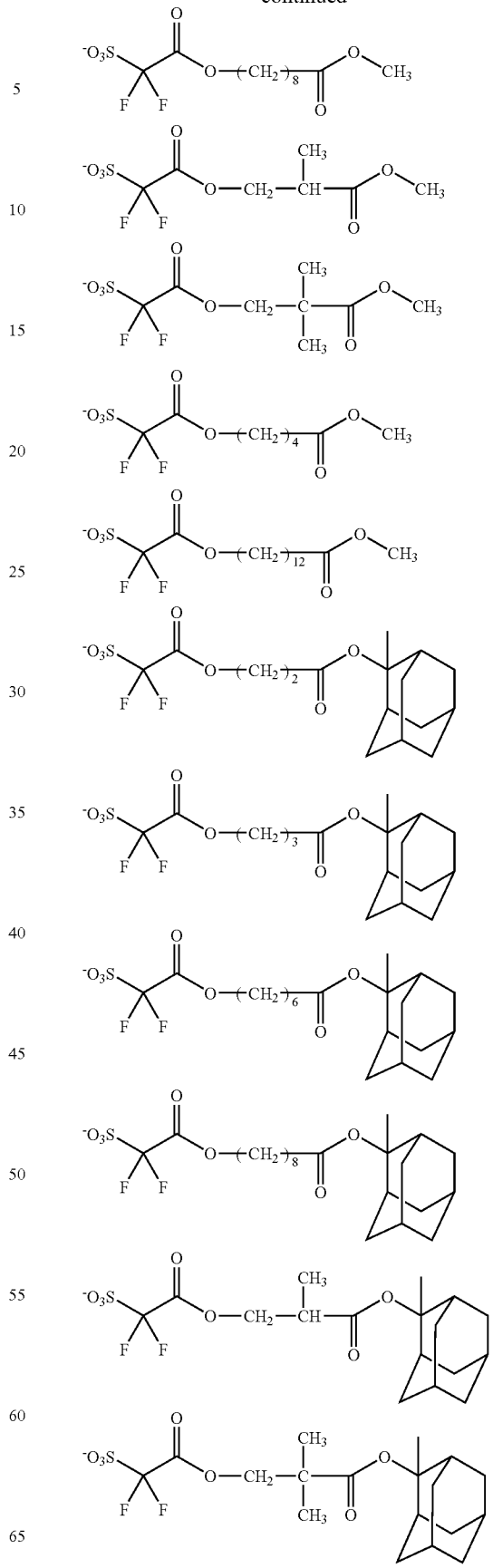

85
-continued
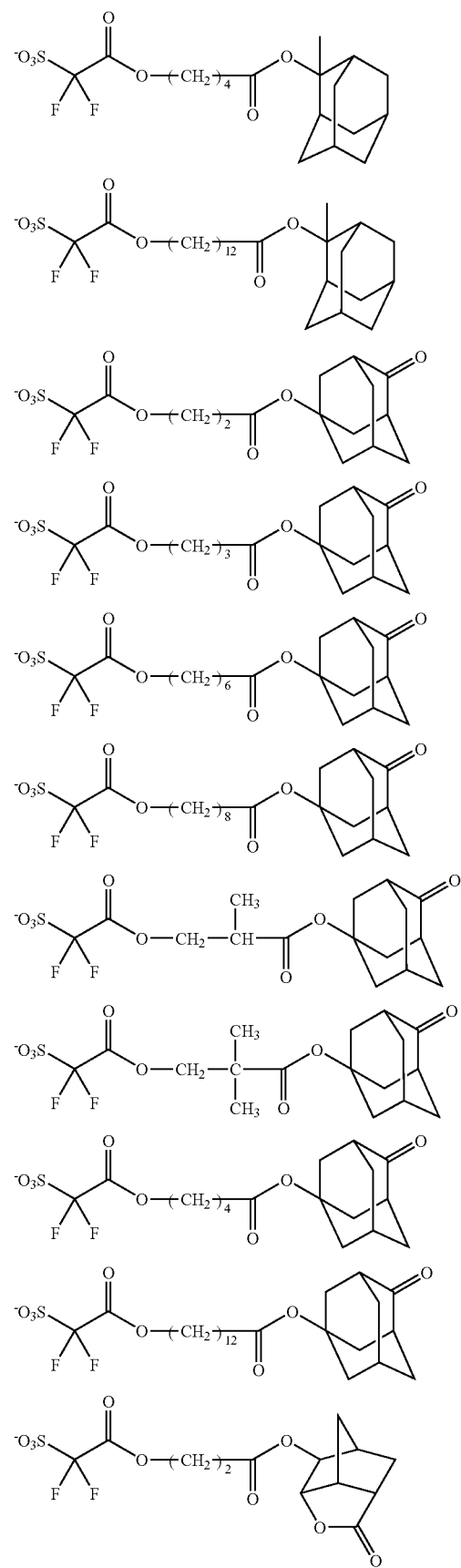
86
-continued
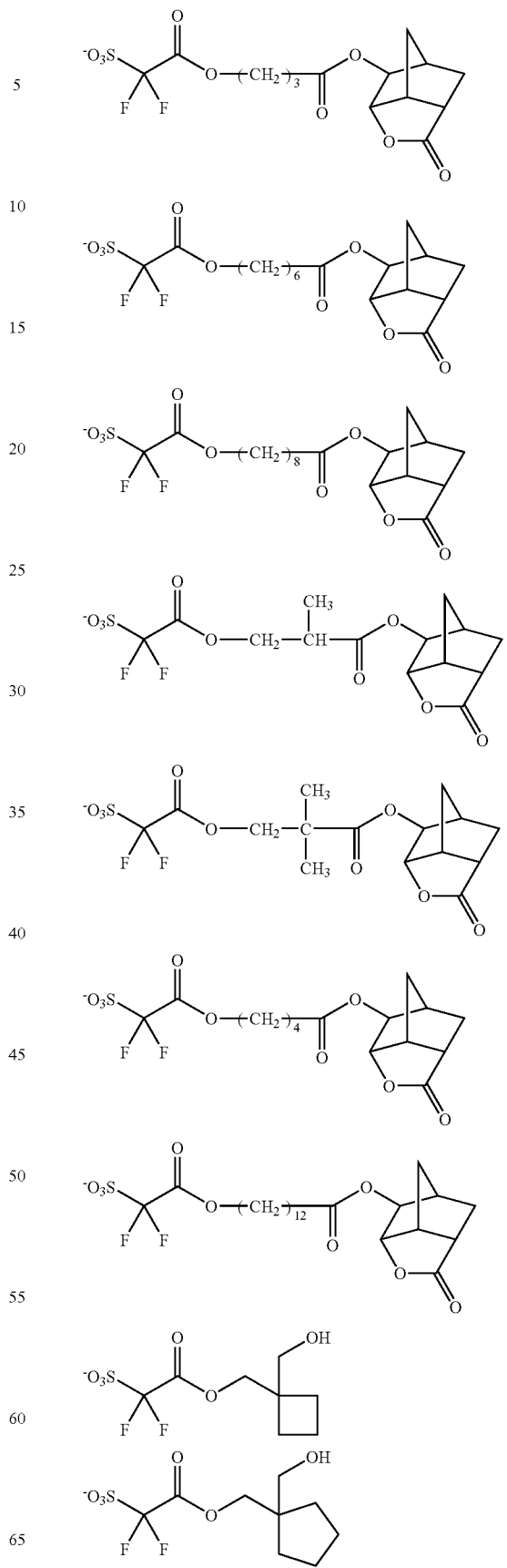

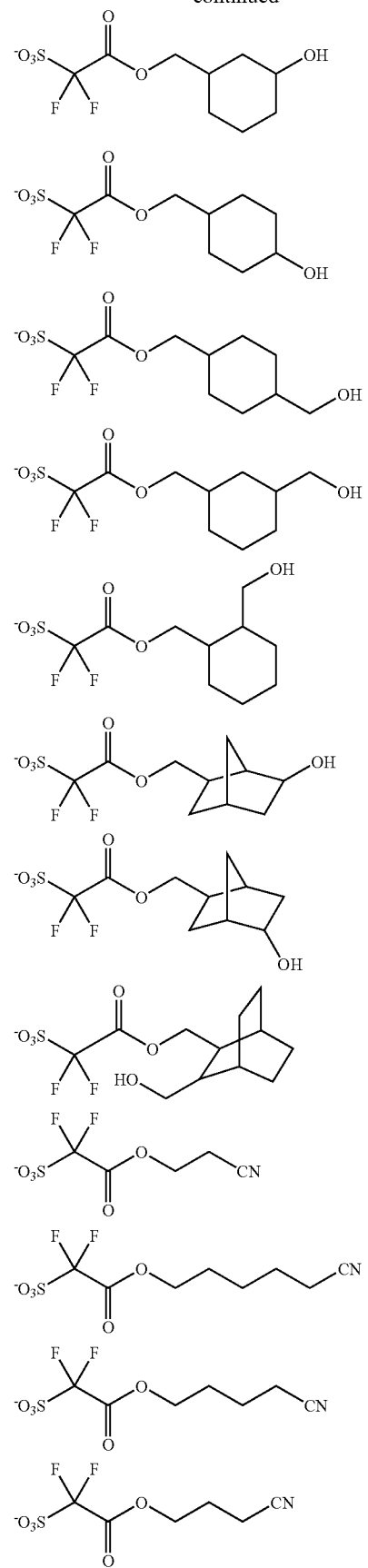
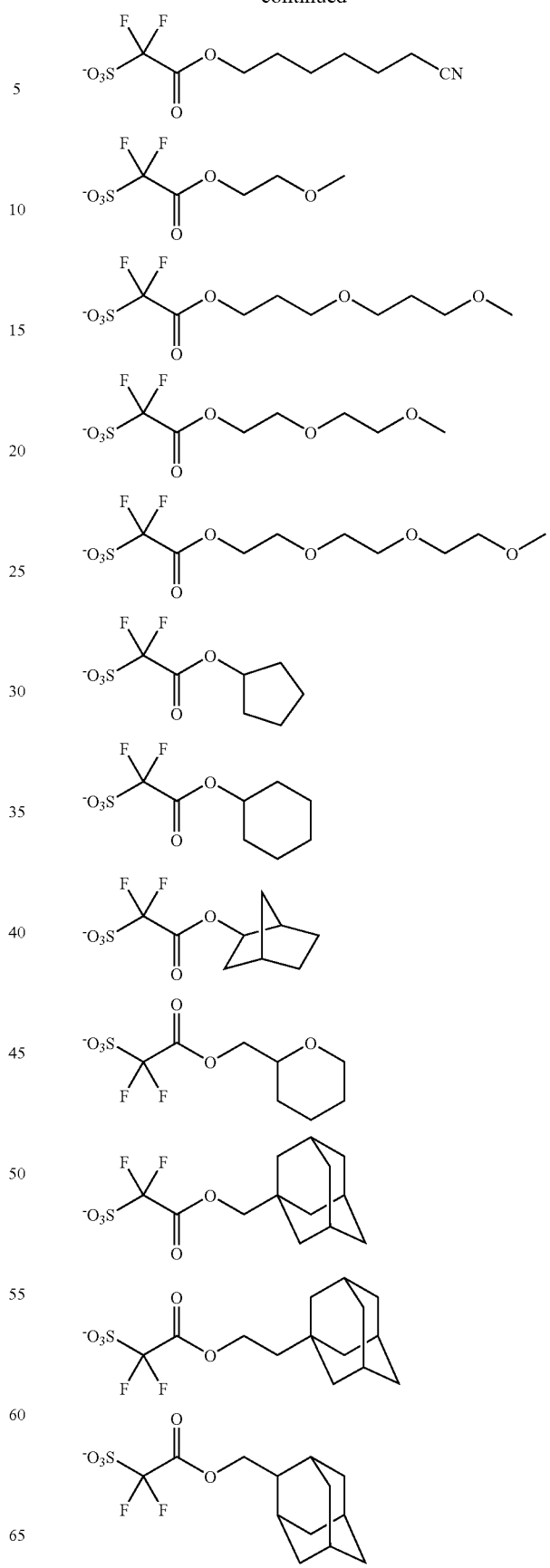

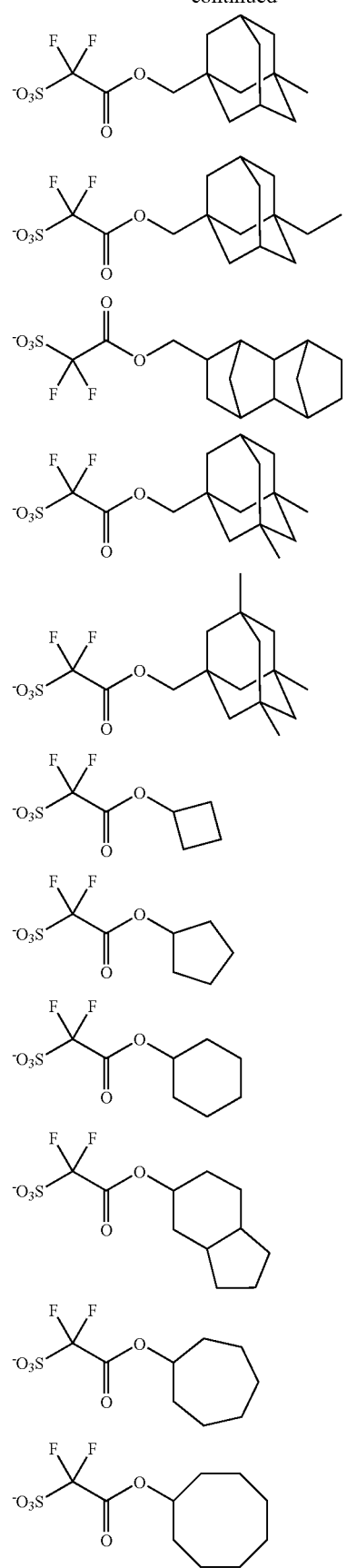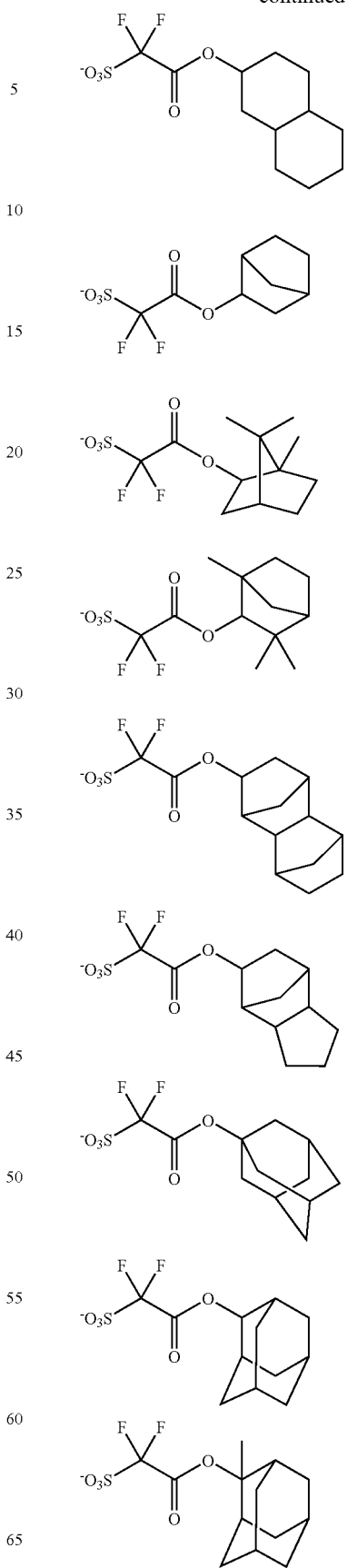

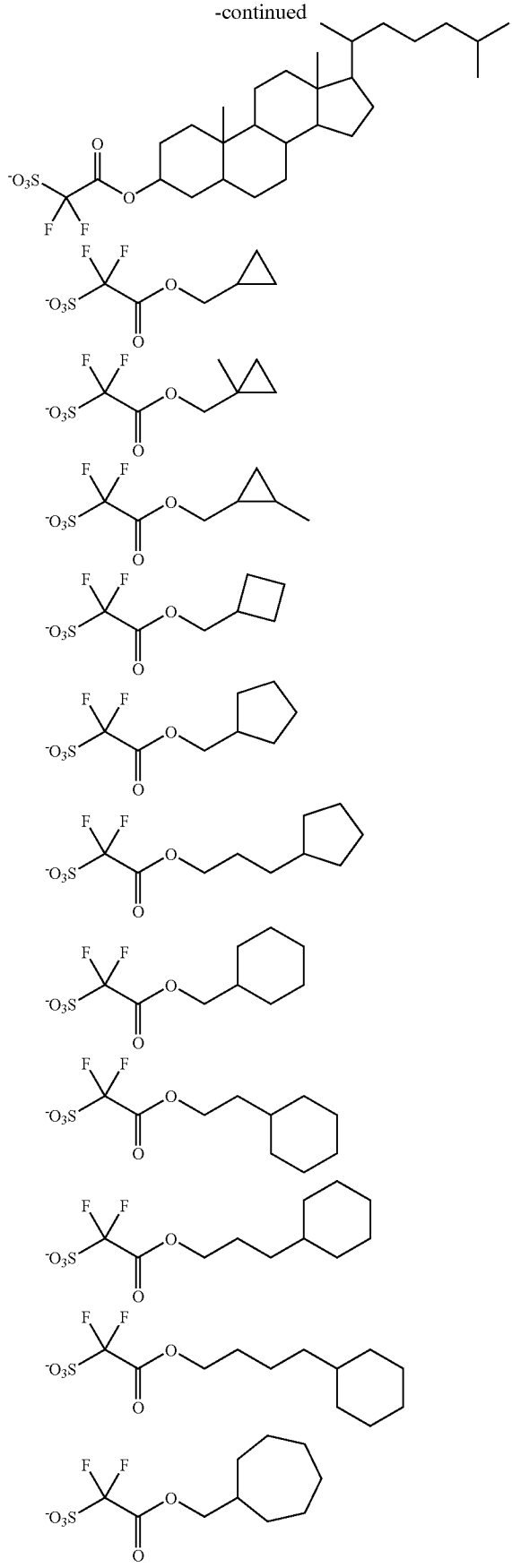
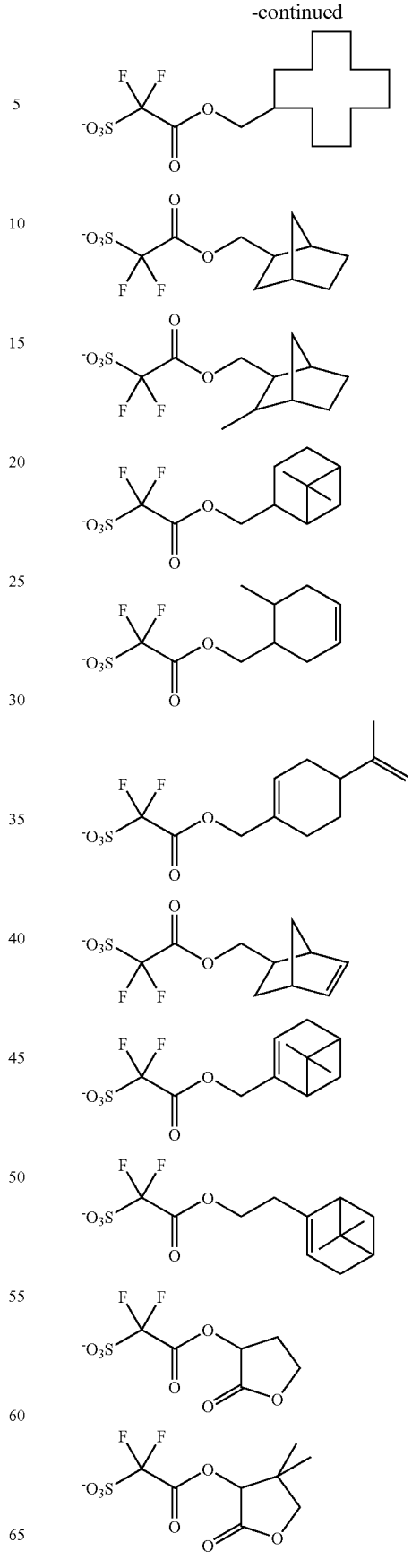

93
-continued
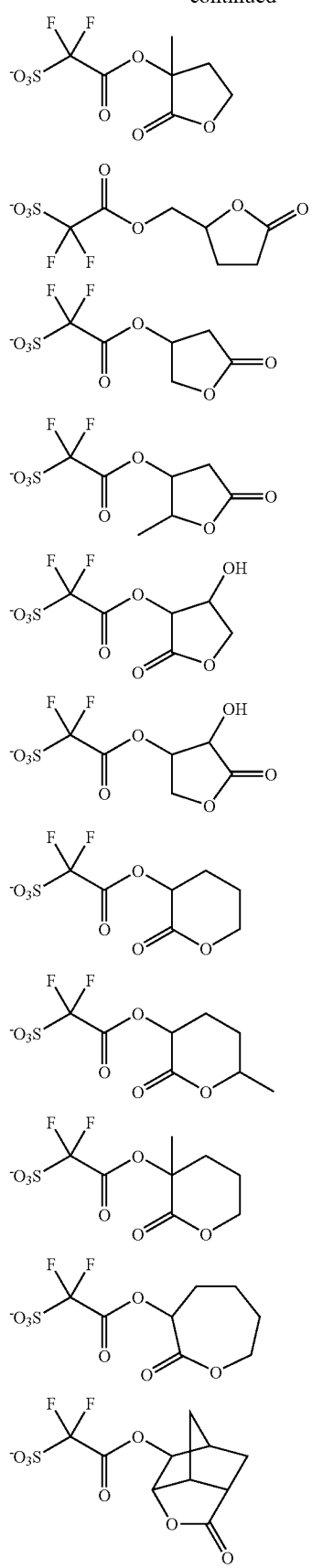
94
-continued
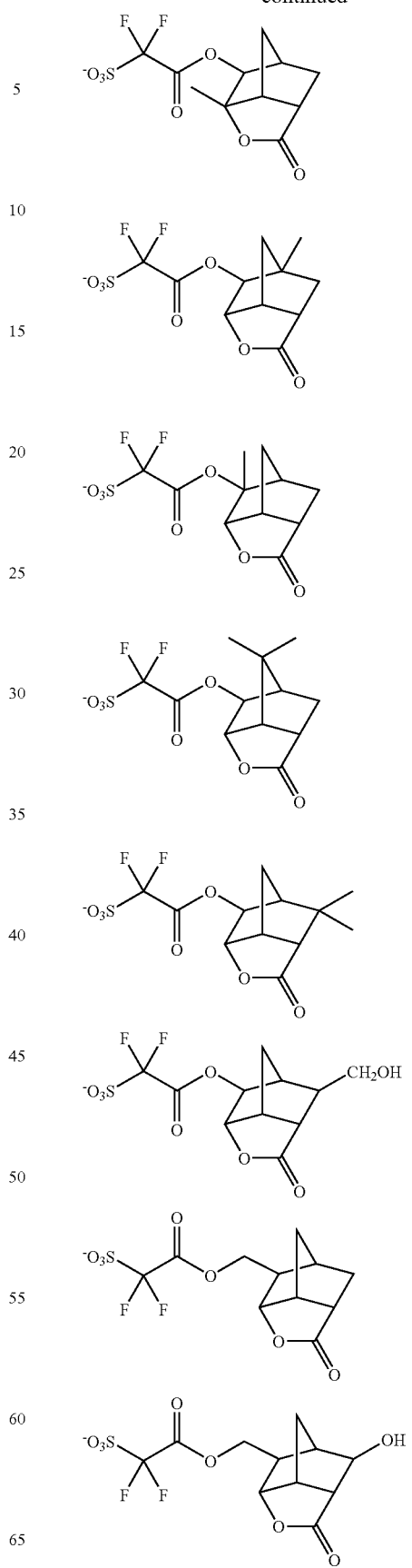

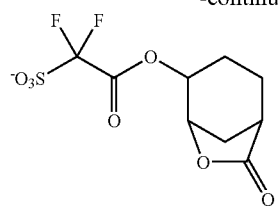
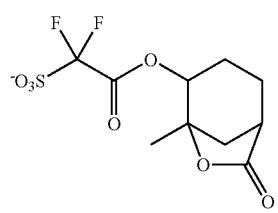
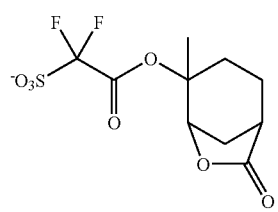
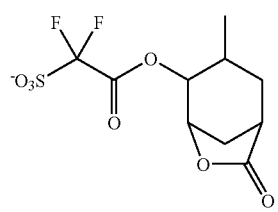
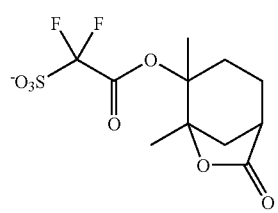
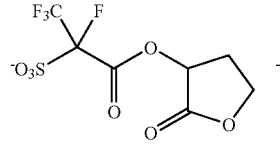
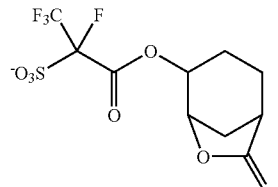
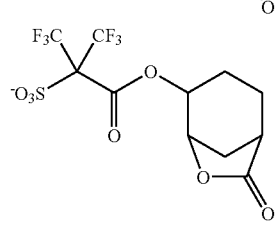
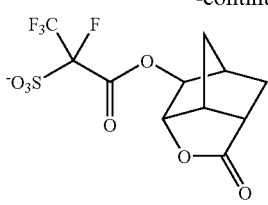
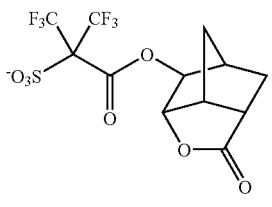
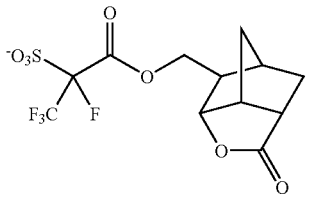
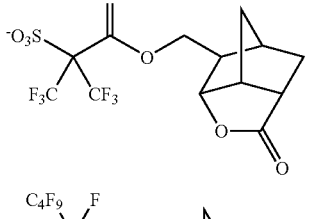
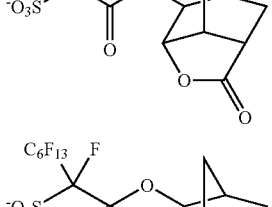
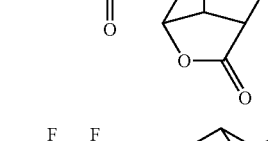
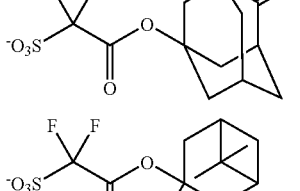
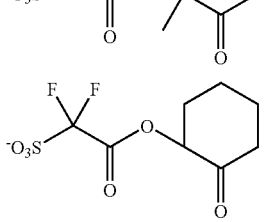

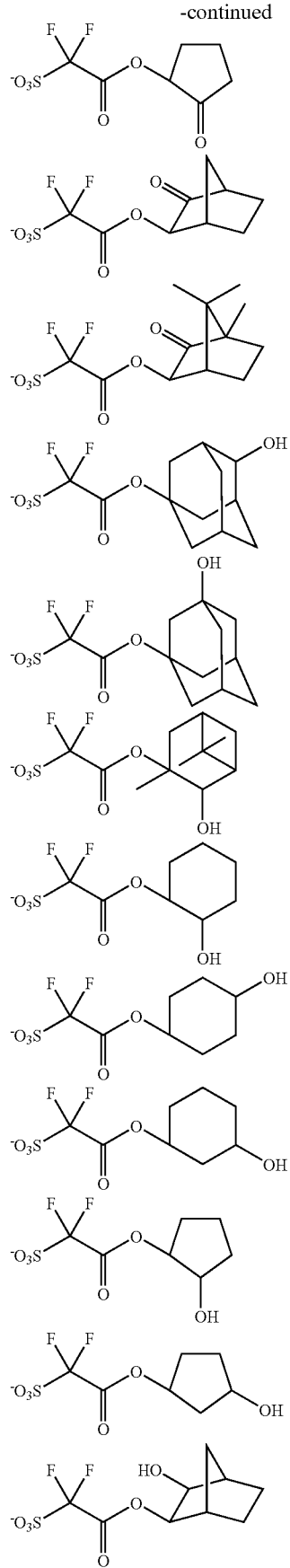
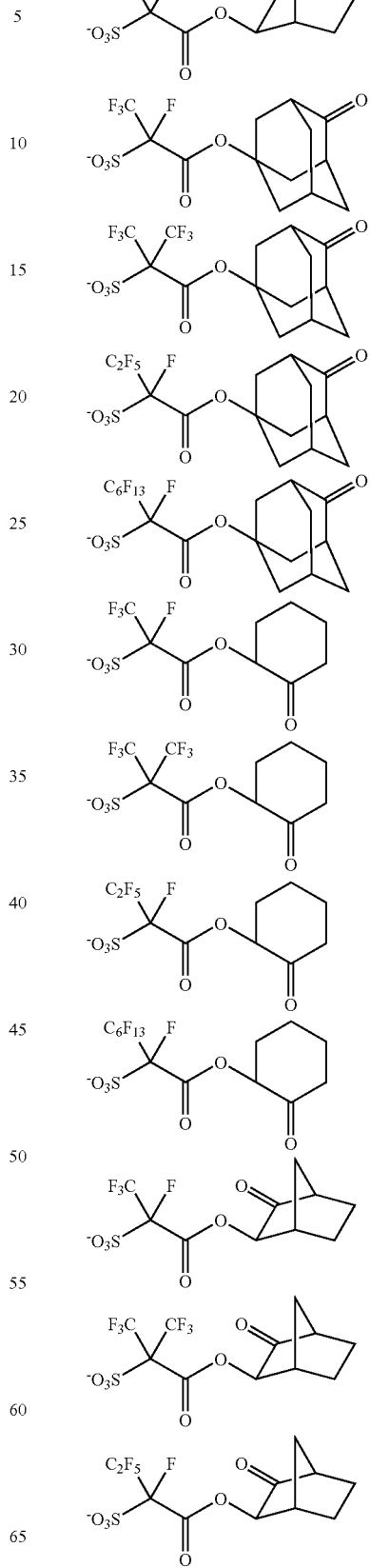

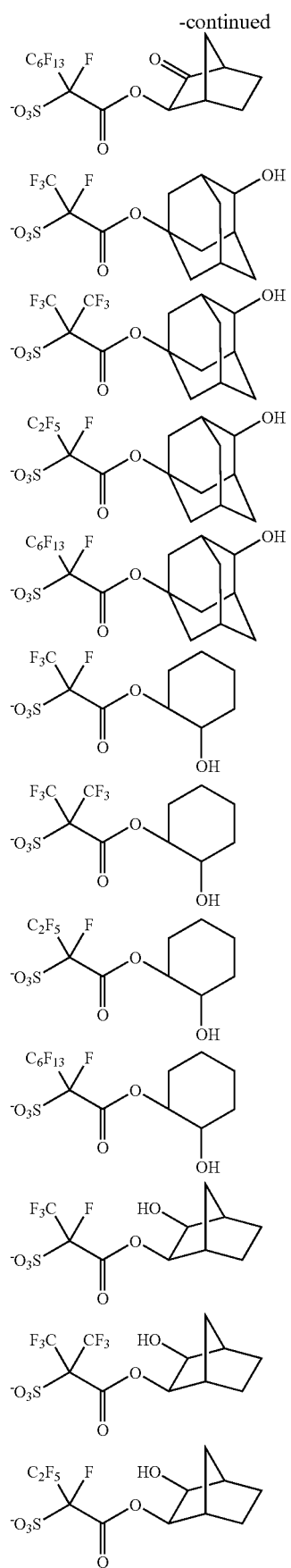
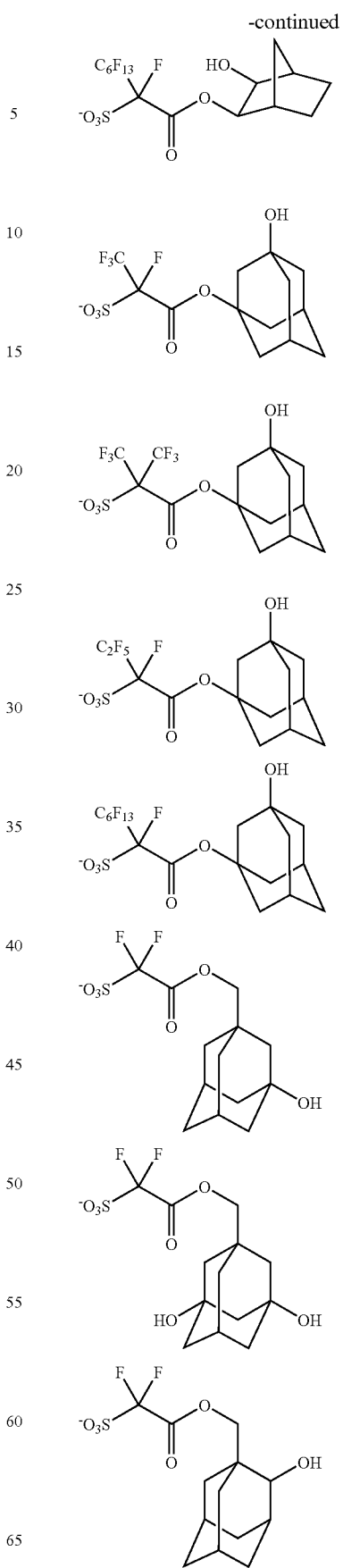

101
-continued
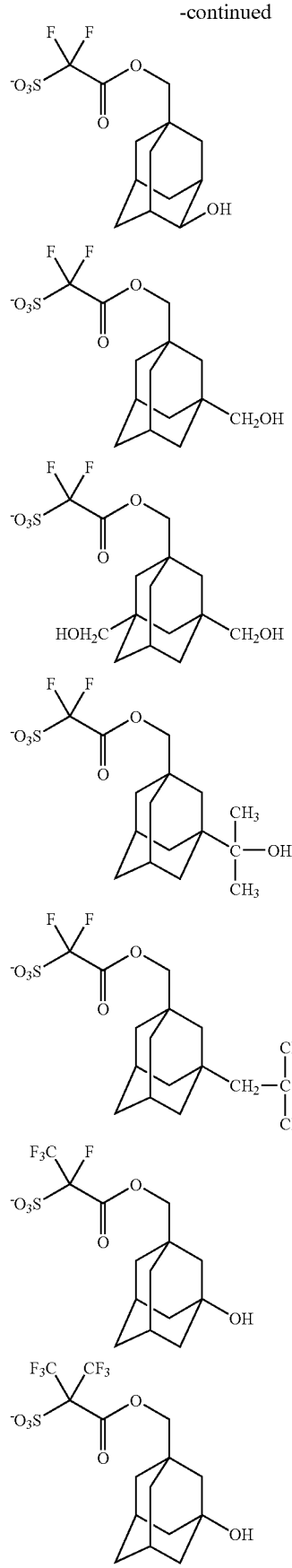
102
-continued
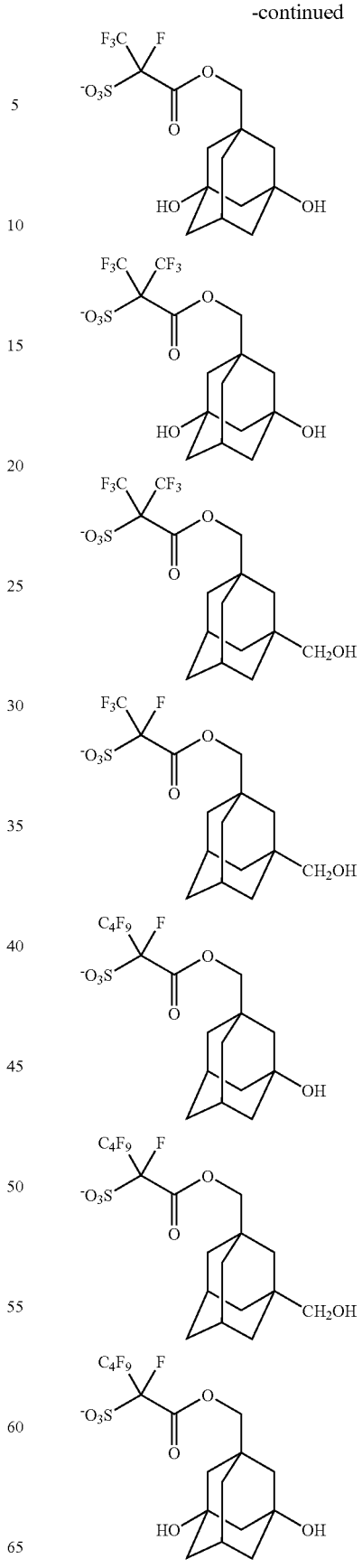

-continued
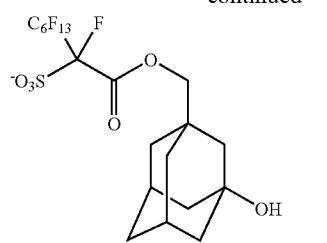
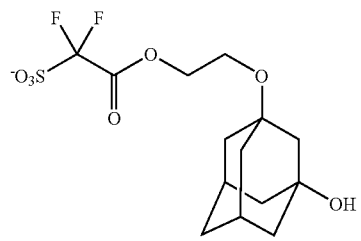
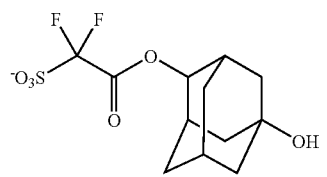
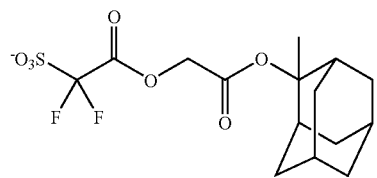
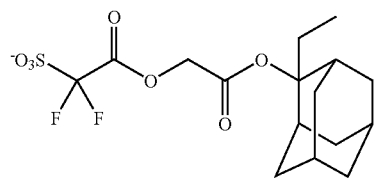
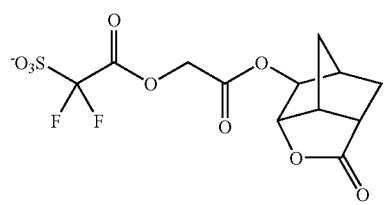
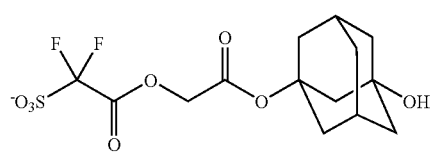
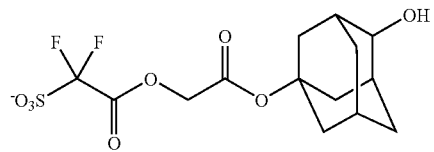
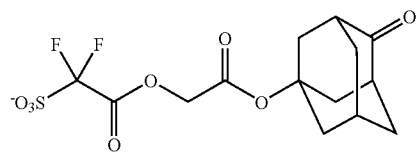
-continued
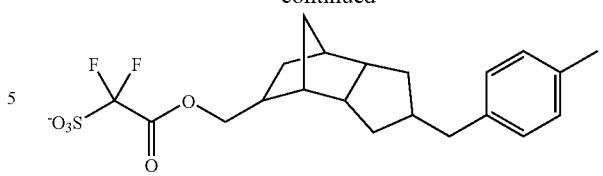
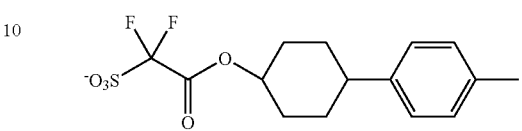
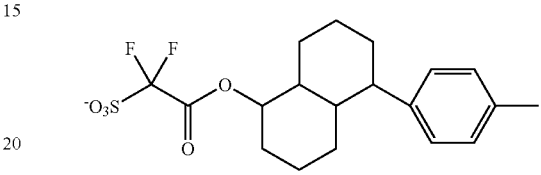
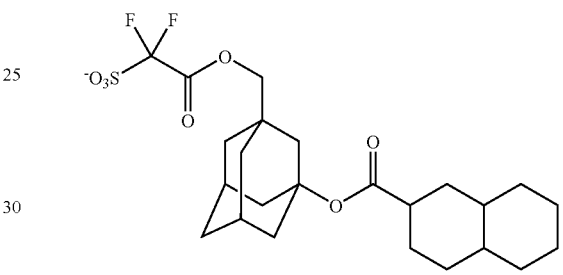
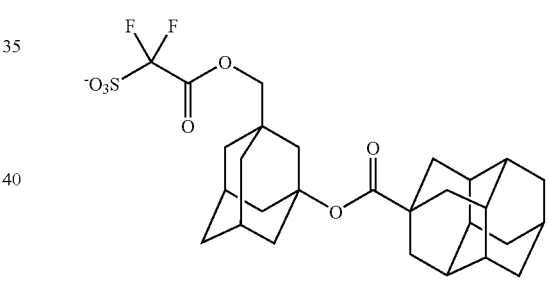
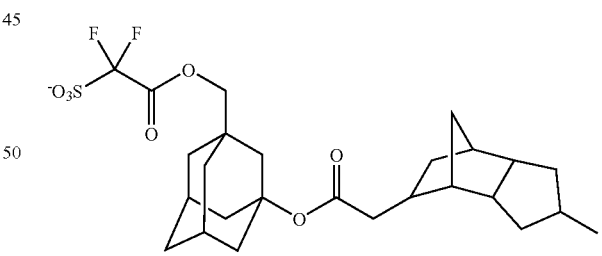
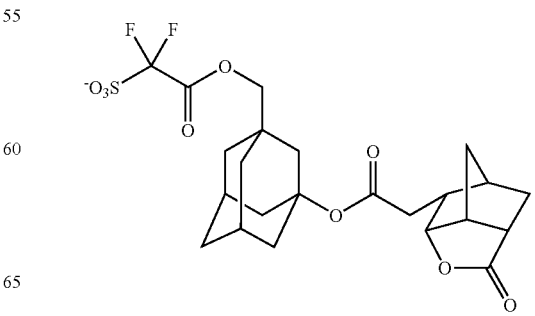

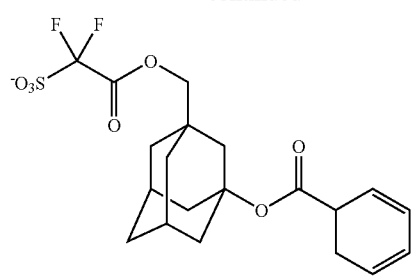
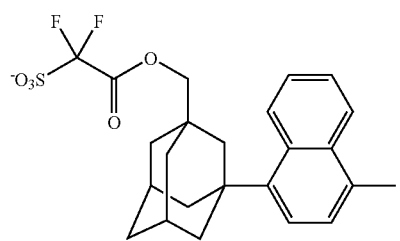
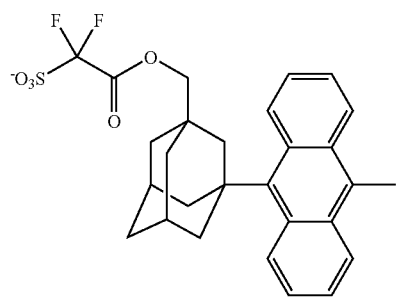
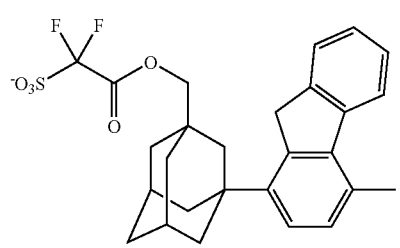
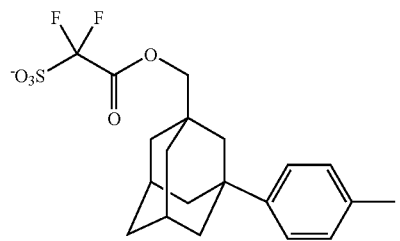
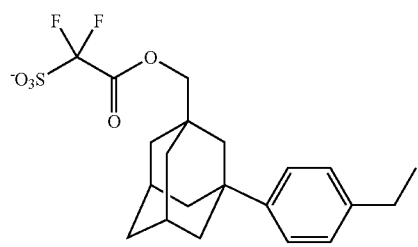
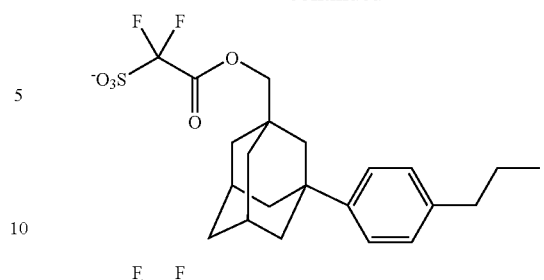
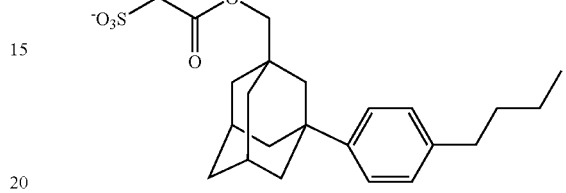
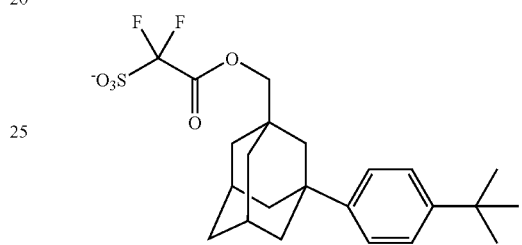
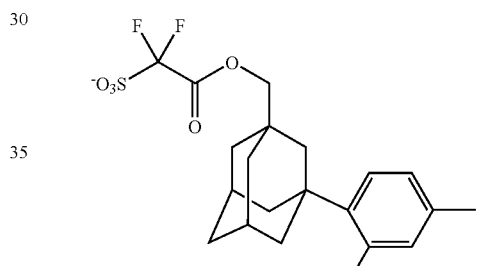
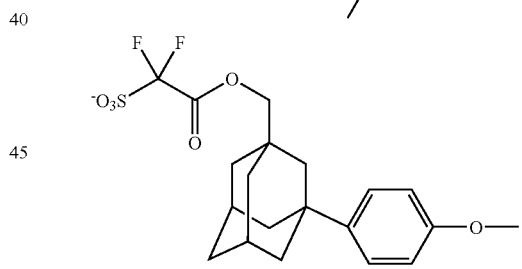
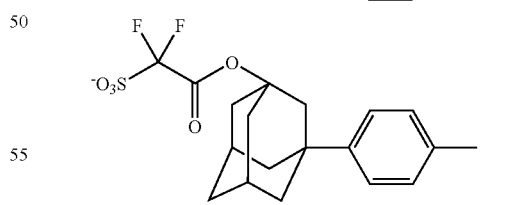
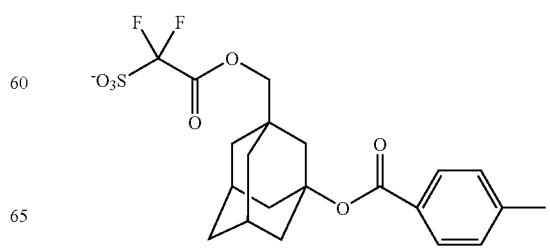

107
-continued
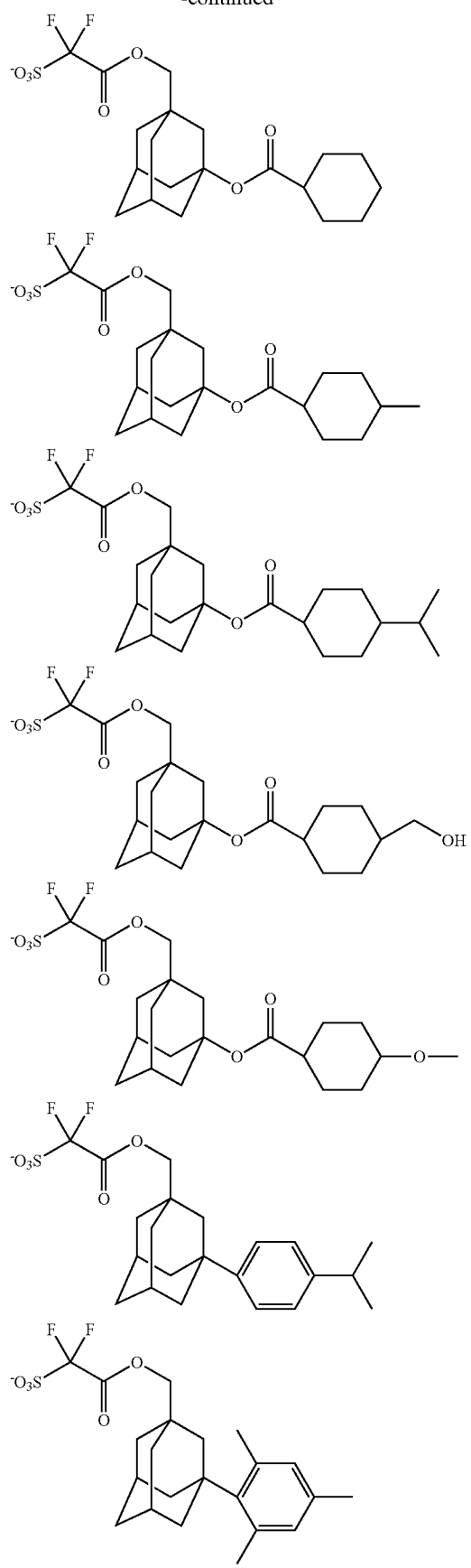
108
-continued
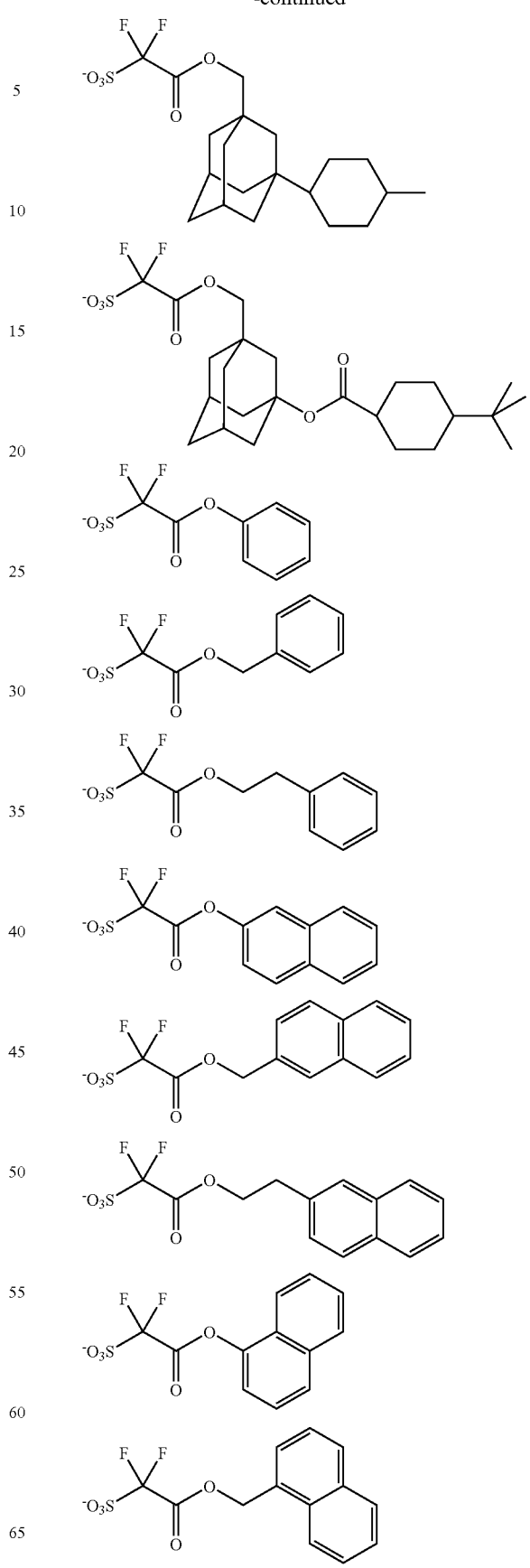

109
-continued
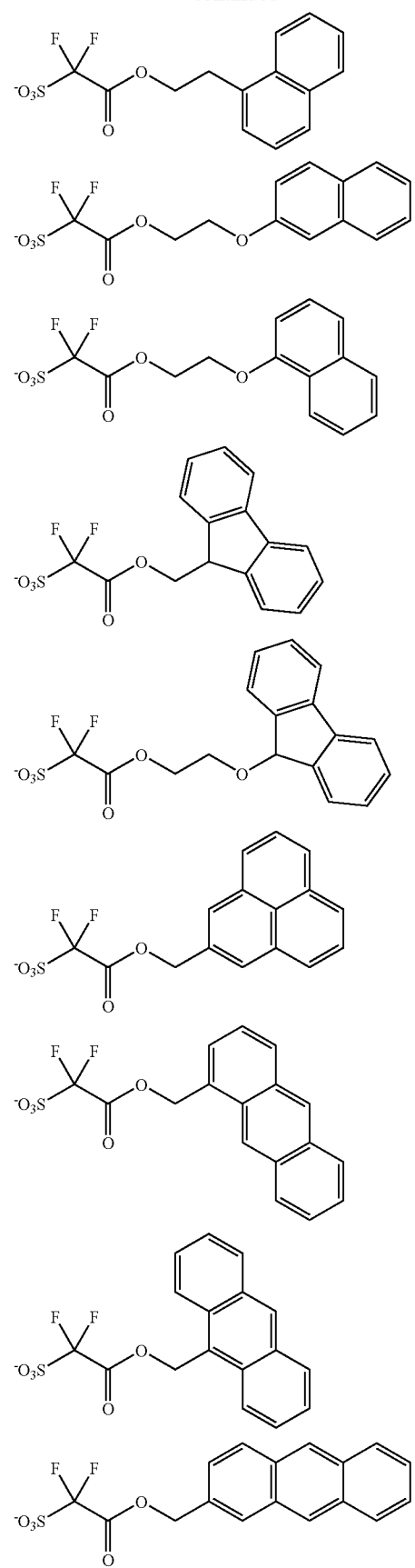
110
-continued
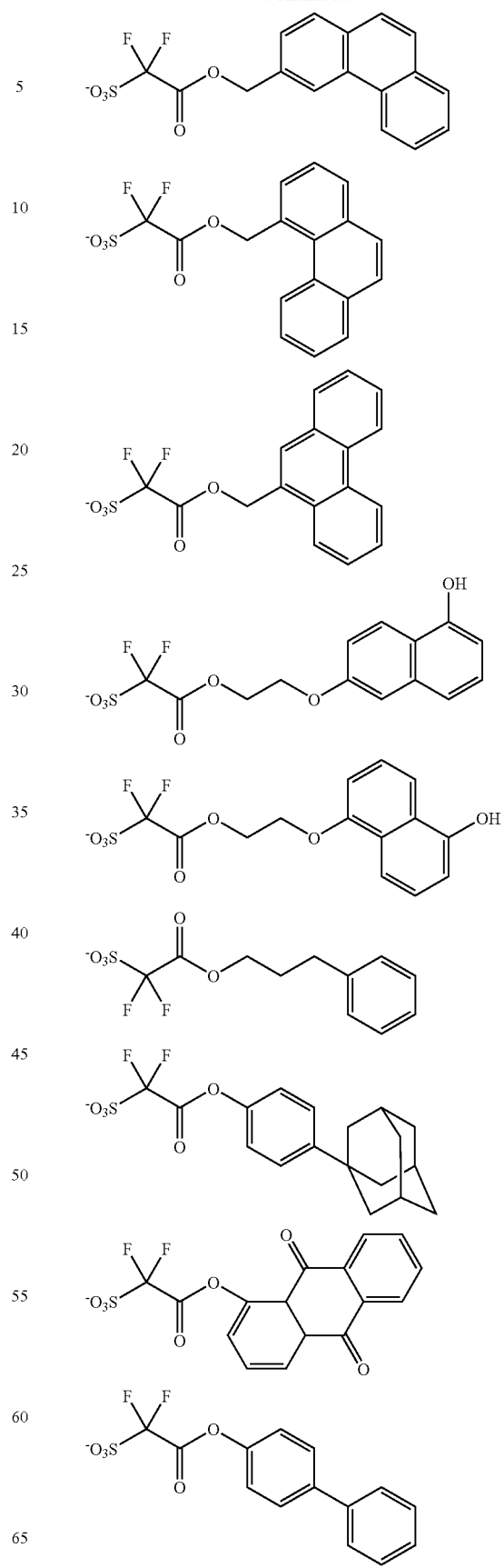

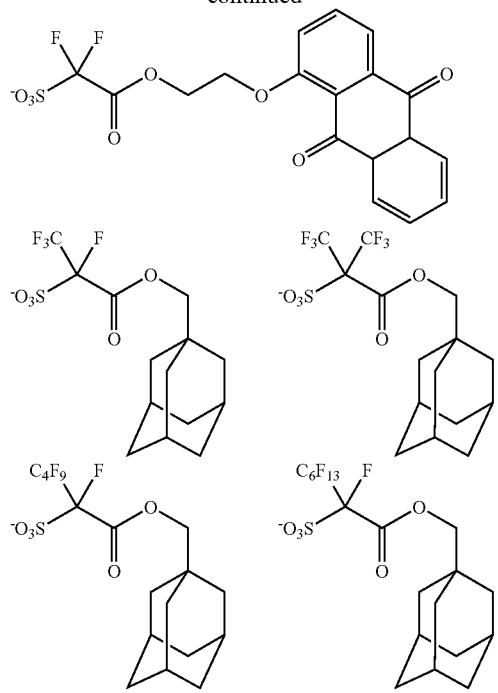

The acid generator is preferably one represented by the following formula (VI).

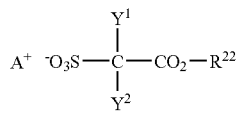   (VI)

wherein $R^{22}$ represents an optionally substituted $C_1$ to $C_{20}$ liner or branched chain hydrocarbon or an optionally substituted $C_3$ to $C_{30}$ cyclic hydrocarbon group, in which at least one methylene group may be optionally substituted with a carbonyl group or an oxygen atom. $A^+$ represents an organic counterion, and $Y^1$ and $Y^2$ independently represent a fluorine atom or a C1 to C6 perfluoroalkyl group.

The acid generator represented by the following formula (IX) or formula (X) will give chemically amplified resist compositions affording better resolution and patterning, and are therefore especially preferable.

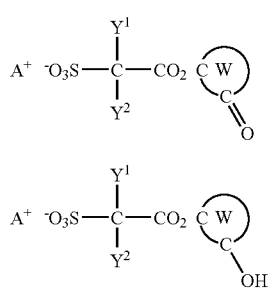

wherein the ring W represents an optionally substituted $C_3$ to $C_{30}$ monocyclic or polycyclic hydrocarbon group, $A^+$ represents an organic counterion, and $Y^1$ and $Y^2$ independently represent a fluorine atom or a C1 to C6 perfluoroalkyl group.

Examples of the ring W in the formula (IX) and formula (X) include a $C_4$ to $C_8$ cycloalkyl skeleton, an adamantane skeleton, and a norbornane skeleton.

The ring W may be substituted with substituents such as a $C_1$ to $C_6$ alkyl group, a $C_1$ to $C_6$ alkoxy group, a $C_1$ to $C_4$ perfluoroalkyl group, a $C_1$ to $C_6$ hydroxyalkyl group, a hydroxyl and cyano group.

Examples of the organic counterion in the acid generator represented by the formula (II) and formula (VI) include a sulfonium cation, and an iodonium cation.

Specific examples include cations represented by the following the formulae (VIIa), (VIIb), (VIIc) and (VIId).

The followings are cations of the formula (VIIa).

   (VIIa)

wherein $P^1$ to $P^3$ independently represent a $C_1$ to $C_{30}$ alkyl group or a $C_3$ to $C_{30}$ cyclic hydrocarbon group. When $P^1$ to $P^3$ are alkyl groups, they may have at least one substituent selected from the group consisting of a hydroxyl group, a $C_1$ to $C_{12}$ alkoxy group, and a $C_3$ to $C_{12}$ cyclic hydrocarbon group, when $P^1$ to $P^3$ are cyclic hydrocarbon groups, they may have at least one substituent selected from the group consisting of a hydroxyl group, a $C_1$ to $C_{12}$ alkyl group, and a $C_1$ to $C_{12}$ alkoxy group.

The followings are cations of the formula (VIIb).

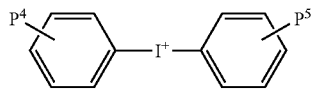   (VIIb)

wherein $P^4$ and $P^5$ independently represent a hydrogen atom, a hydroxyl group, a $C_1$ to $C_{12}$ alkyl group or a $C_1$ to $C_{12}$ alkoxy group.

The followings are cations of the formula (VIIc).

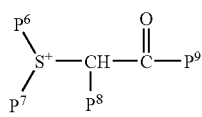   (VIIc)

wherein $P^6$ and $P^7$ independently represent a $C_1$ to $C_{12}$ alkyl group or a $C_3$ to $C_{12}$ cycloalkyl group, or $P^6$ and $P^7$ are bonded to form a divalent $C_3$ to $C_{12}$ hydrocarbon group, $P^8$ is a hydrogen atom and $P^9$ represents a $C_1$ to $C_{12}$ alkyl group, a $C_3$ to $C_{12}$ cycloalkyl group, or an optionally substituted aromatic cyclic group, or $P^8$ and $P^9$ are bonded to form a divalent $C_3$ to $C_{12}$ hydrocarbon group.

Examples of the divalent hydrocarbon group formed when $P^6$ and $P^7$ or $P^8$ and $P^9$ are bonded together include the same ones given as examples above, and a $C_3$ to $C_{12}$ alkylene group is suitable.

Here, at least one methylene group included in the divalent hydrocarbon group represented by the formula (VIIc) may be optionally substituted with a carbonyl group, an oxygen atom, or a sulfur atom.

The followings are cations of the formula (VIId).
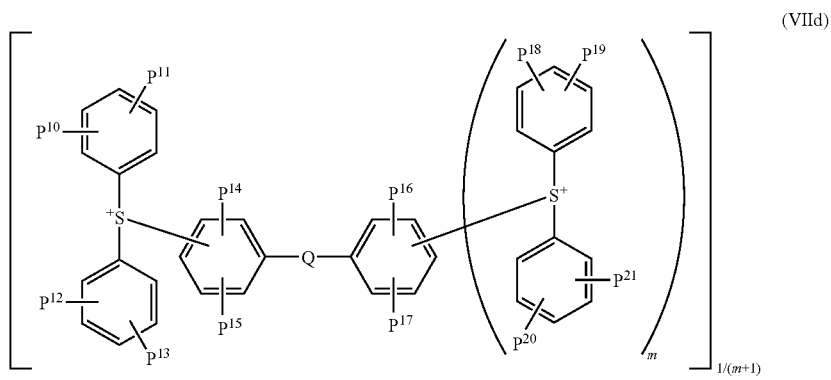
wherein $P^{10}$ to $P^{21}$ independently represent a hydrogen atom, a hydroxyl group, a $C_1$ to $C_{12}$ alkyl group or a $C_1$ to $C_{12}$ alkoxy group, Q represents a sulfur atom or an oxygen atom, and m represents 0 or 1.
Specific examples of the cation of the formula (VIIa) include cations represented by the following formulae.
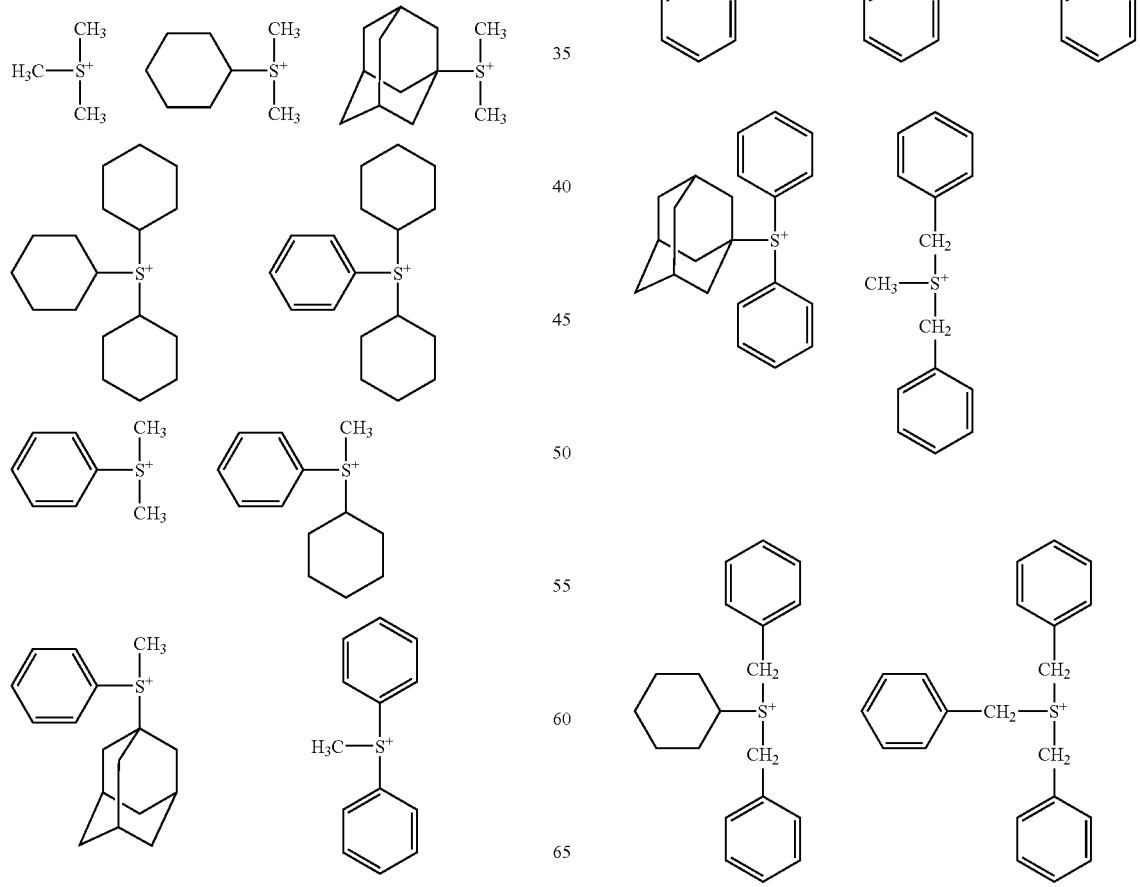
-continued

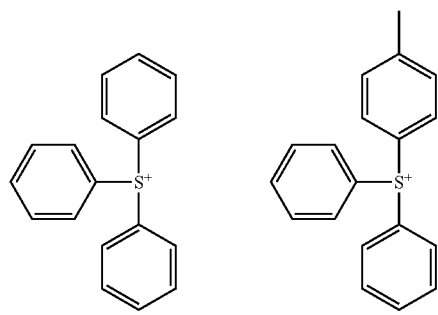
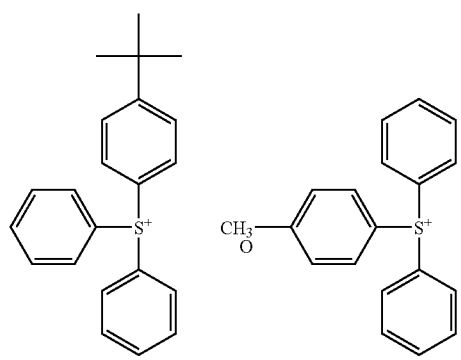
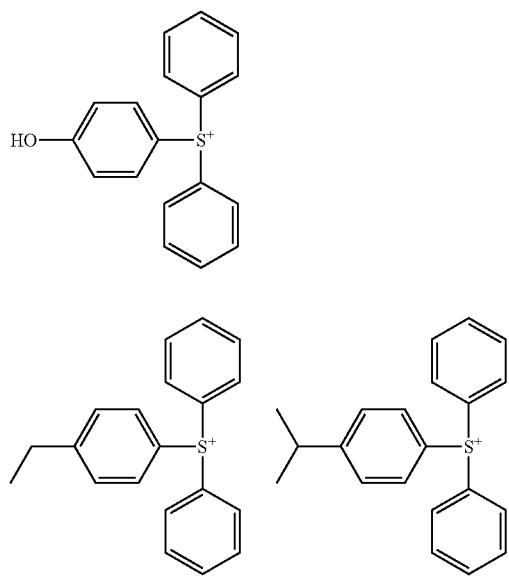
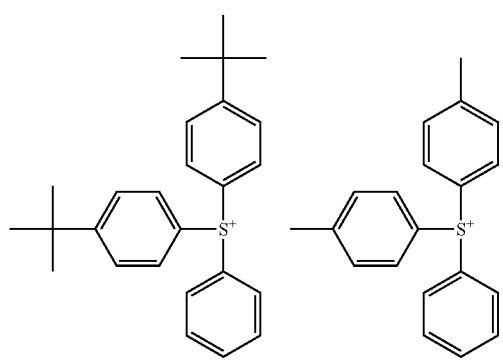
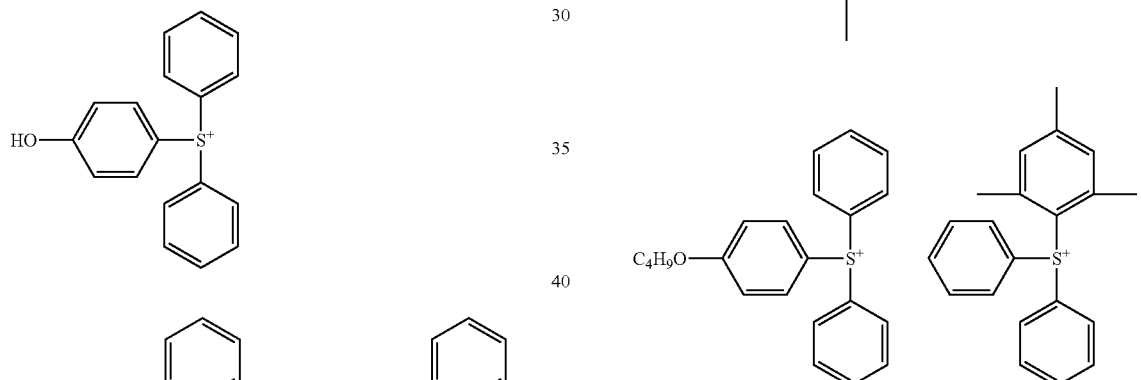

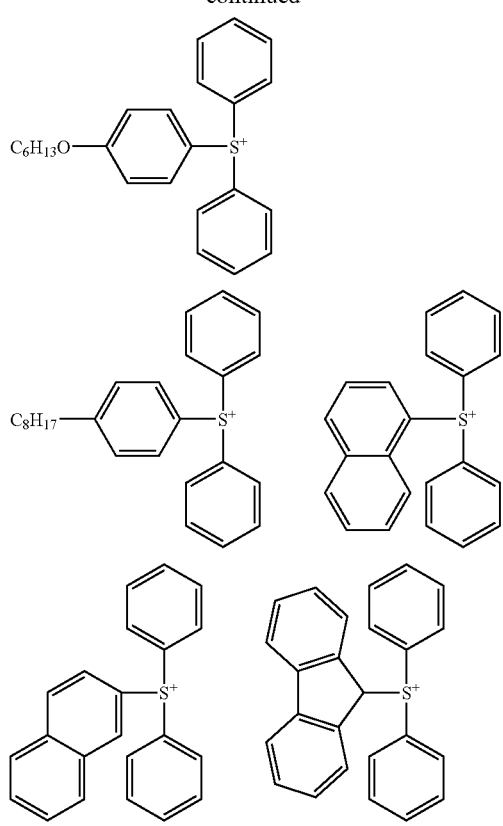
Specific examples of the cation of the formula (VIIb) include cations represented by the following formulae.
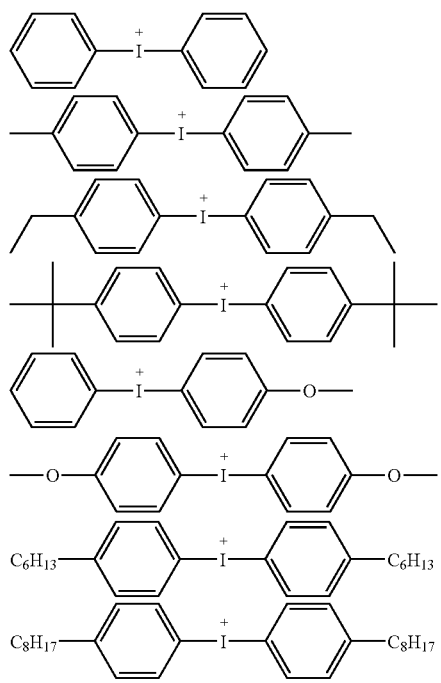
Specific examples of the cation of the formula (VIIc) include cations represented by the following formulae.
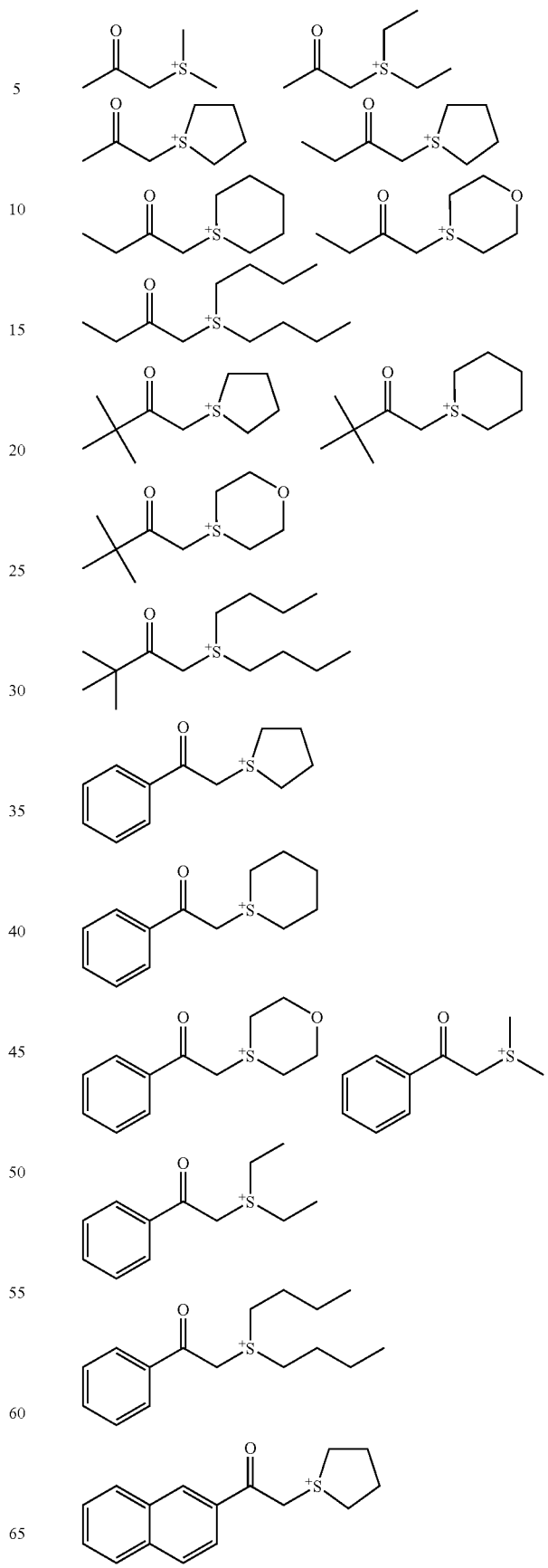

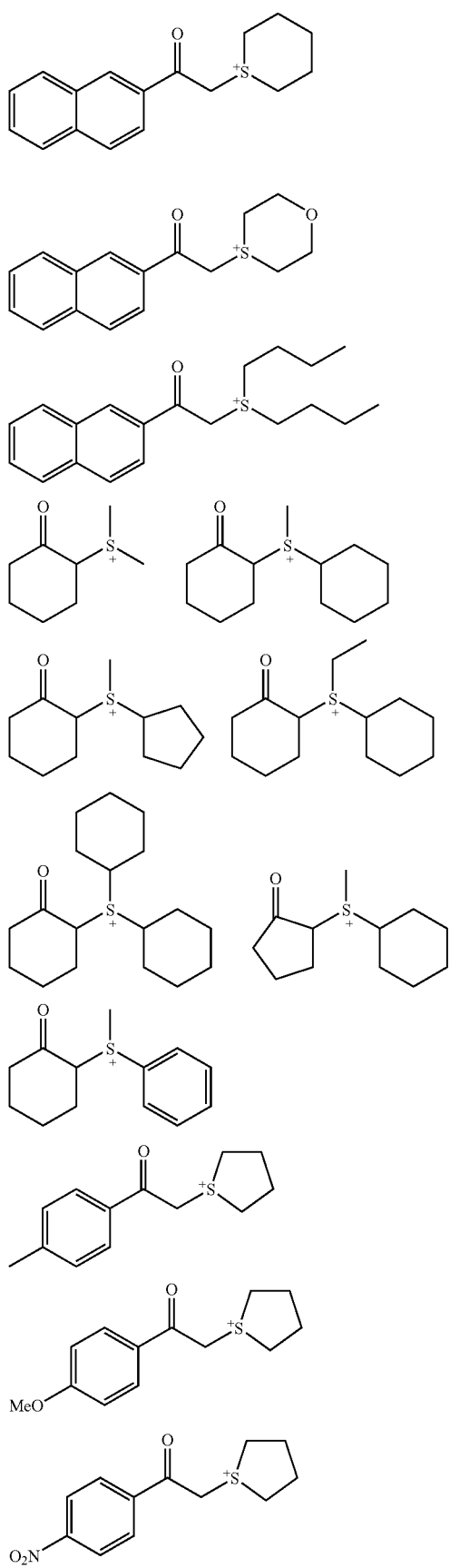
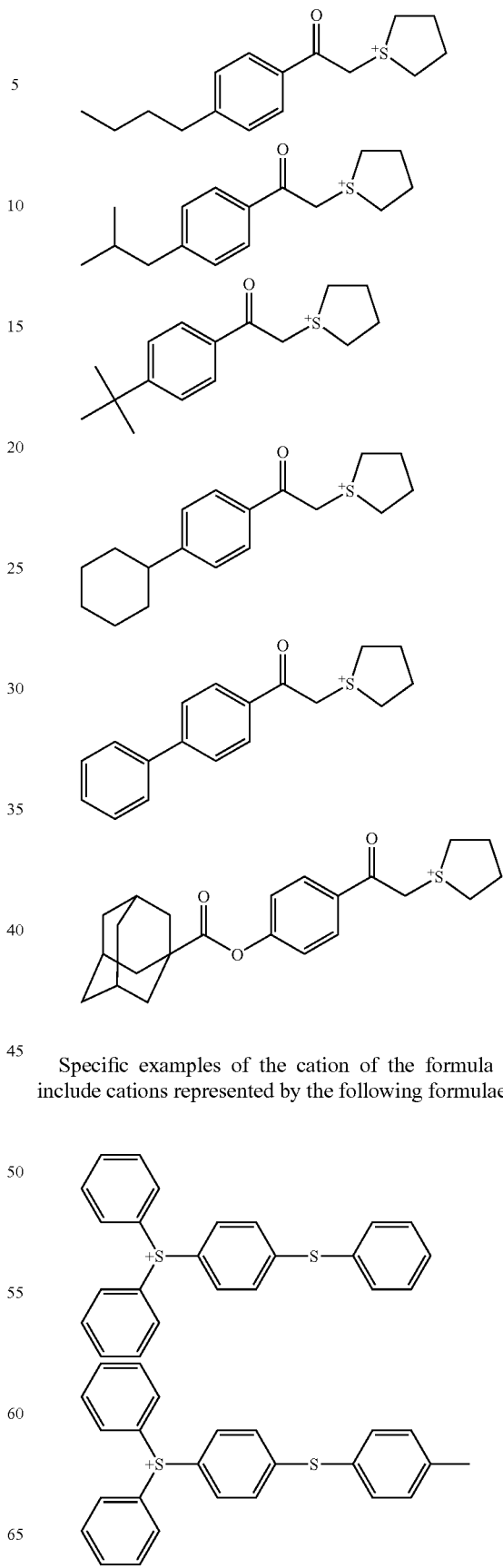
Specific examples of the cation of the formula (VIId) include cations represented by the following formulae.

121
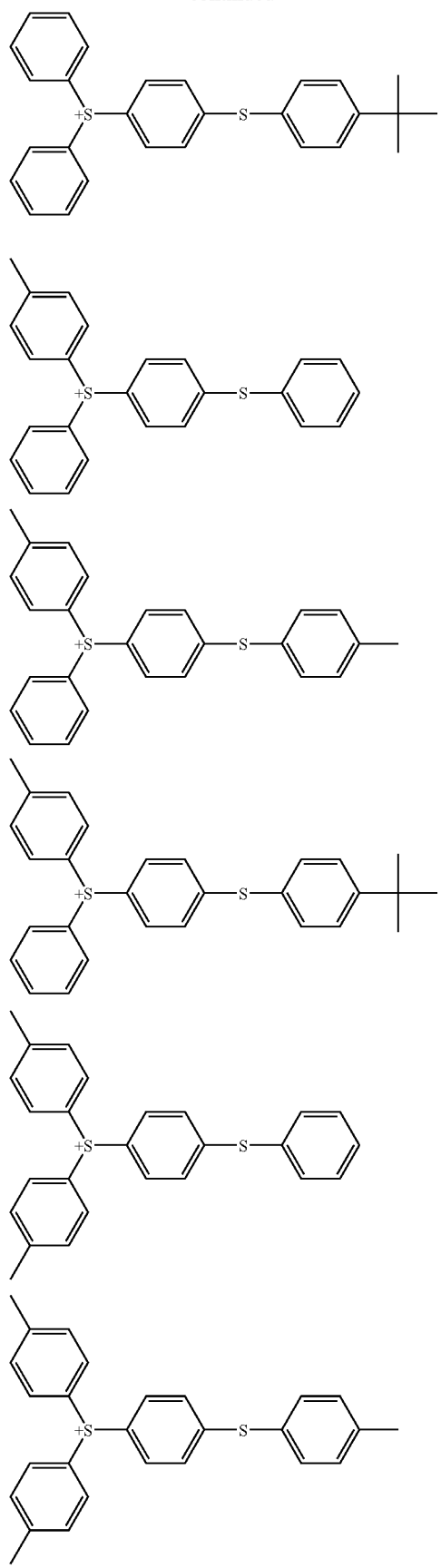
122
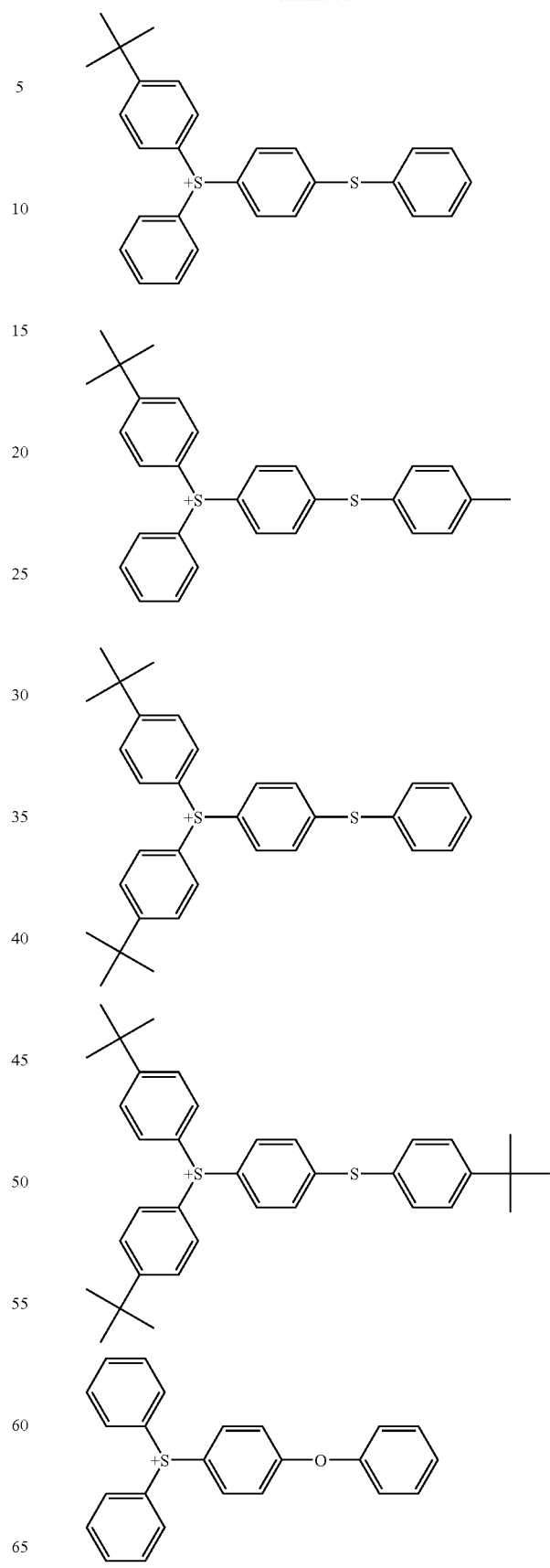

123
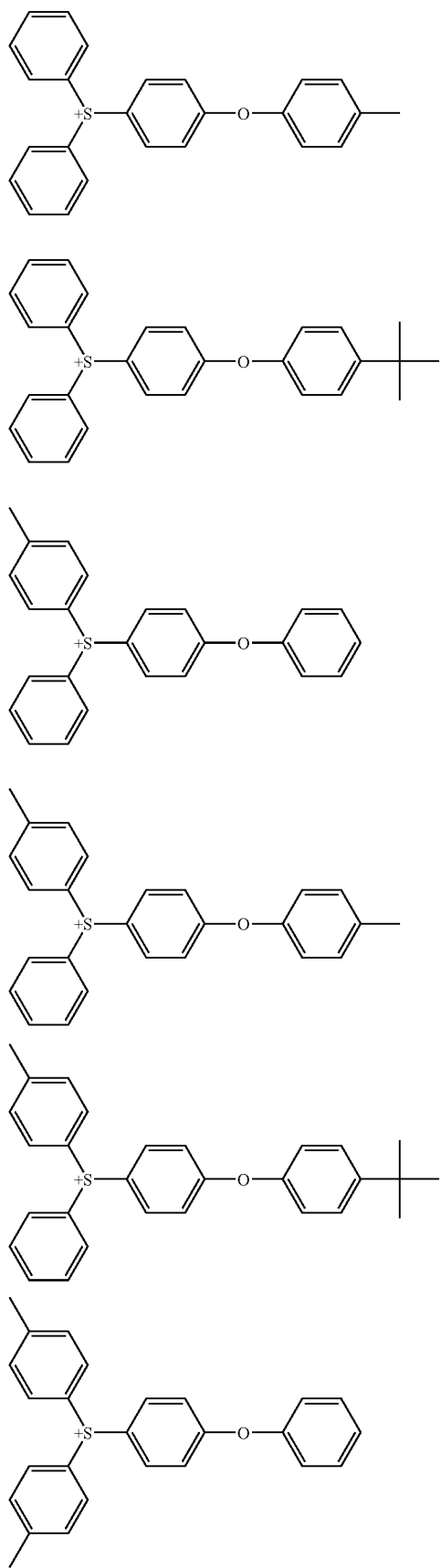
124
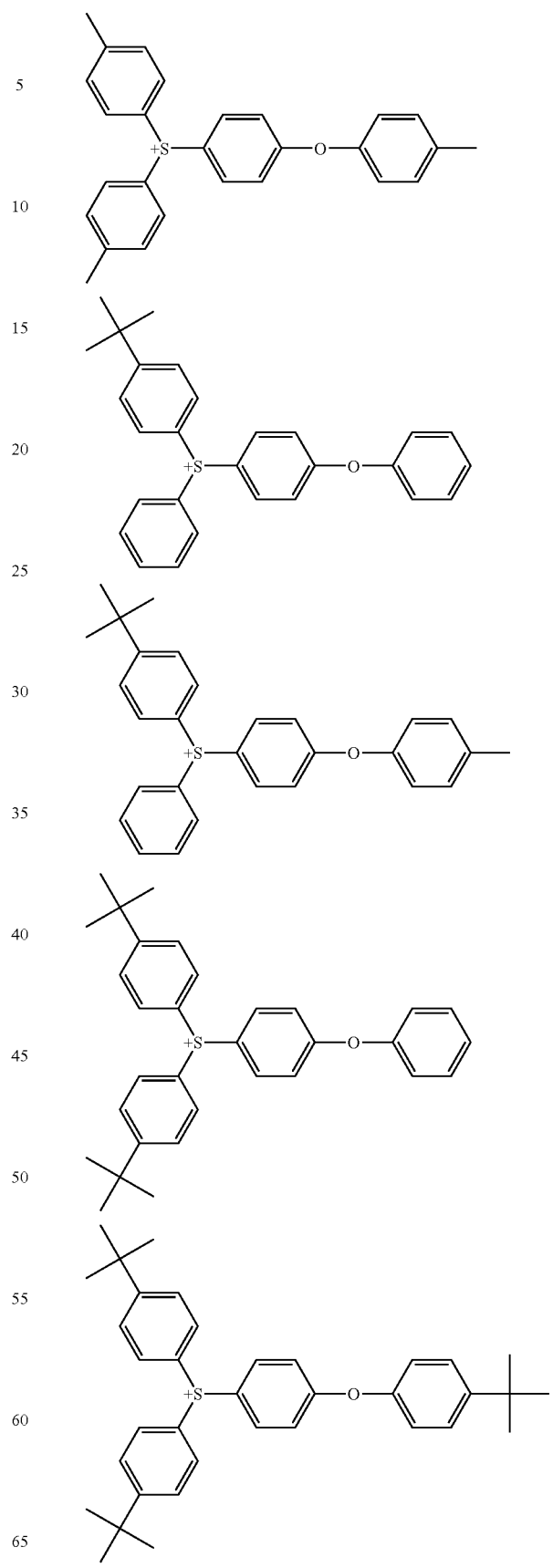

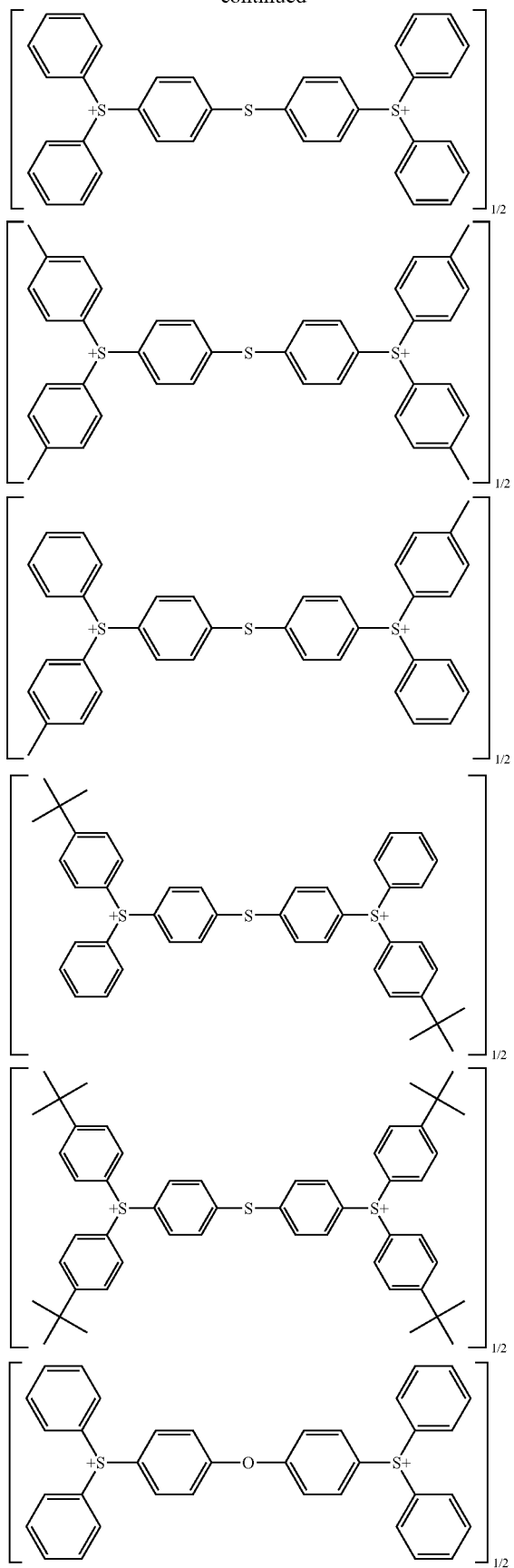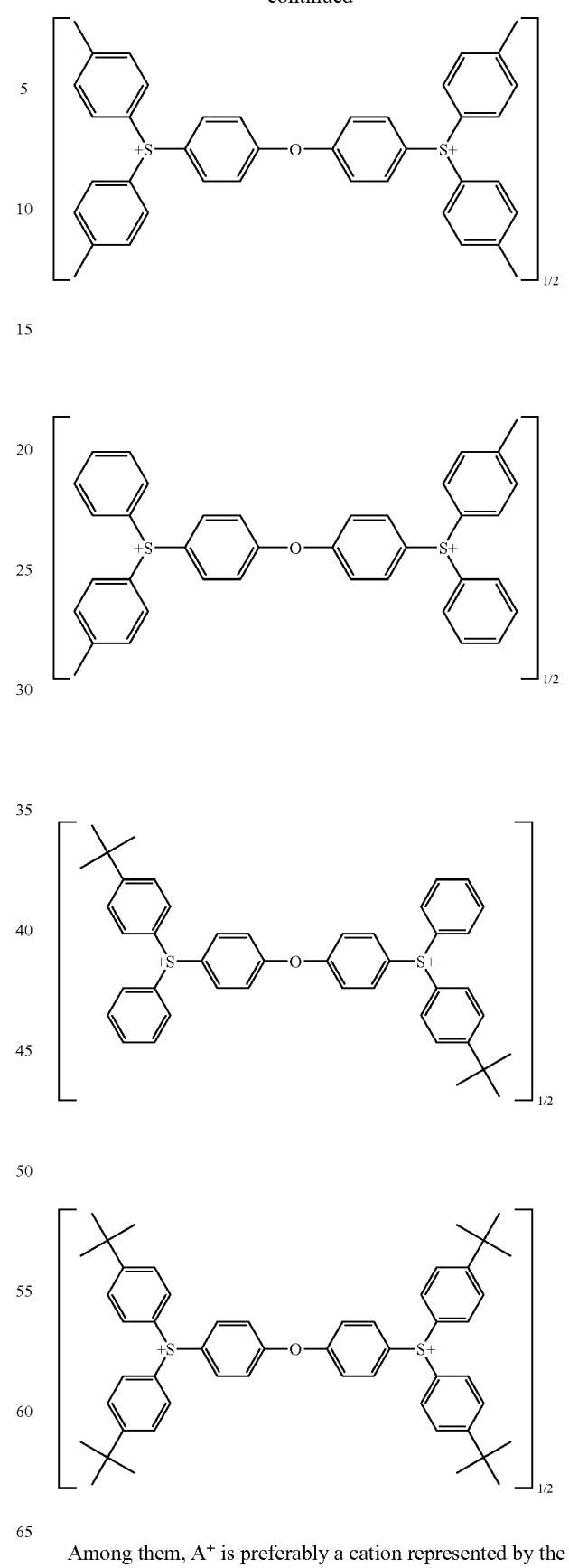
Among them, $A^+$ is preferably a cation represented by the formula (VIIe), the formula (VIIf), or the formula (VIIg).

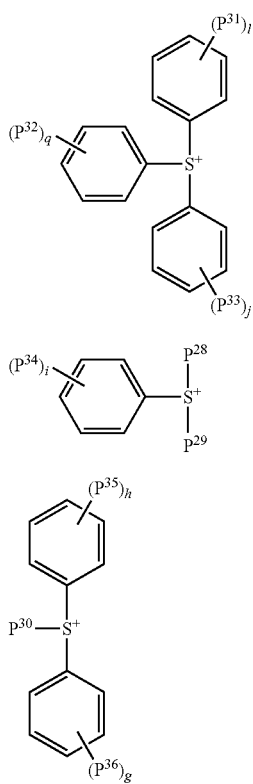

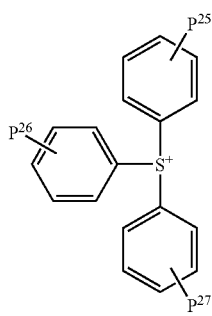

wherein $P^{28}$ to $P^{30}$ independently represent a $C_1$ to $C_{20}$ alkyl group or a $C_3$ to $C_{30}$ cyclic hydrocarbon group other than phenyl. When $P^{28}$ to $P^{30}$ are alkyl groups, they may have at least one substituent selected from the group consisting of a hydroxyl group, a $C_1$ to $C_{12}$ alkoxy group, and a $C_3$ to $C_{12}$ cyclic hydrocarbon group, and when $P^{28}$ to $P^{30}$ are cyclic hydrocarbon groups, they may have at least one substituent selected from the group consisting of a hydroxyl group, a $C_1$ to $C_{12}$ alkyl group, and a $C_1$ to $C_{12}$ alkoxy group, $P^{31}$ to $P^{36}$ independently represent a hydroxyl group, a $C_1$ to $C_{12}$ alkyl group, a $C_1$ to $C_{12}$ alkoxy group, or a $C_3$ to $C_{12}$ cyclic hydrocarbon group, and l, q, j, I, h and g independently represent an integer of 0 to 5.

$A^+$ is more preferably a cation represented by the formula (VIIh).

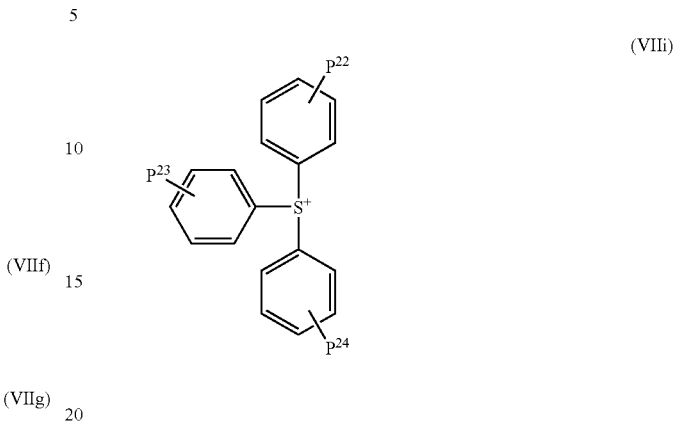

wherein $P^{25}$ to $P^{27}$ independently represent a hydrogen atom, a hydroxyl group, a $C_1$ to $C_{12}$ alkyl group, or a $C_1$ to $C_{12}$ alkoxy group.

$A^+$ is even more preferably a cation represented by the formula (VIIi).

(VIIi)

wherein $P^{22}$ to $P^{24}$ independently represent a hydrogen atom, or a $C_1$ to $C_4$ alkyl group.

When such acid generator is used in the resist composition, the acid generators may be used alone or in mixtures of two or more.

The acid generator represented by the formula (IX) or the formula (X) can be produced, for example, by allowing a salt, represented by the formula (1) or the formula (2) and an onium salt represented by the formula (3) to be reacted by being stirred in an inert solvent such as acetonitrile, water, or methanol at a temperature in the range of about 0° C. to 150° C., and preferably 0° C. to 100° C.

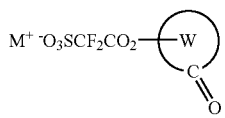

(1)

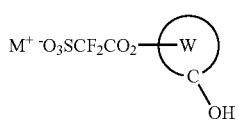

(2)

wherein W represents the same meaning as defined above, and M represents Li, Na, K or Ag.

(3)

wherein $A^+$ represents the same meaning as defined above, and Z represents F, Cl, Br, I, $BF_4$, $AsF_6$, $SbF_6$, $PF_6$ or $ClO_4$.

The onium salt of the formula (3) is generally used in an amount of about 0.5 to 2 mol per 1 mol of the salt represented by the formula (1) or the formula (2). The compound represented by the formula (IX) or the formula (X) may be purified by recrystallization, or washing.

The salt represented by the formula (1) or the formula (2) that is used to produce the acid generator represented by the formula (IX) or the formula (X) can be produced, for example, by first bringing about an esterification reaction between an alcohol represented by the formula (4) or the formula (5) and a carboxylic acid represented by the formula (6).

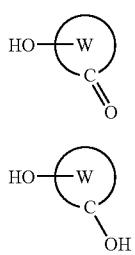  (4)

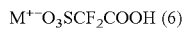  (5)

wherein W represents the same meaning as defined above.

M⁺⁻O₃SCF₂COOH  (6)

wherein M represents the same meaning as defined above.

Alternatively, the salt can be also produced, for example, by first bringing about an esterification reaction between an alcohol represented by the formula (4) or the formula (5) and a carboxylic acid represented by the formula (7) and then hydrolyzing with MOH wherein M represents Li, Na, K or Ag.

  (7)

The esterification reaction may usually be carried out by stirring the ingredients in an aprotic solvent such as dichloroethane, toluene, ethyl benzene, monochlorobenzene and acetonitrile at a temperature in the range of about 20° C. to 200° C., and preferably about 50° C. to 150° C. An organic acid such as p-toluenesulfonic acid and/or an inorganic acid such as sulfuric acid is usually added as an acid catalyst during the esterification reaction.

The esterification reaction is also preferably carried out along with dehydration using a Dean-Stark device, etc., because the reaction time tends to be shorter.

The carboxylic acid represented by the formula (6) in the esterification reaction is generally used in an amount of about 0.2 to 3 mol, and preferably about 0.5 to 2 mol, per 1 mol of the alcohol represented by the formula (4) or the formula (5). The amount of the acid catalyst in the esterification reaction may be a catalytic amount or an amount corresponding to the solvent, and is usually about 0.001 to 5 mol.

There are also methods for obtaining salts represented by the formula (X) or the formula (2) by reducing salts represented by the formula (IX) or the formula (1).

The reducing reaction can be brought about using a reducing agent, including borohydrides such as sodium borohydride, zinc borohydride, lithium tri-sec-butyl borohydride and borane; aluminum hydrides such as lithium tri-t-butoxyaluminum hydride and diisobutylaluminum hydride; organosilicon hydrides such as Et₃SiH and Ph₂SiH₂; or organotin hydrides such as Bu₂SnH, in a solvent such as water, alcohol, acetonitrile, N,N-dimethyl formamide, diglyme, tetrahydrofuran, diethyl ether, dichloromethane, 1,2-dimethoxyethane, or benzene. The reaction may be brought about while stirred at a temperature in the range from about −80° C. to 100° C., and preferably about −10° C. to 60° C.

The content of the acid generator in the chemically amplified resist composition is usually in the range of about 0.1 to 20 wt %, based on the total amount of solids in the composition.

The chemically amplified resist composition of the present invention may include a basic compound along with the acid generator and resin for the chemically amplified resist composition. As the basic compounds, basic nitrogenous organic compounds are preferable and, amines and ammonium salts are more preferable. The basic compound can be added as a quencher to prevent performance from being compromised by the inactivation of the acid while the material is standing after exposure, or to prevent performance from being compromised by too much acid diffusion during post-exposure heat treatment.

Specific examples of such basic compounds include compounds such as those represented by the following formulae.

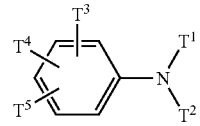  (a)

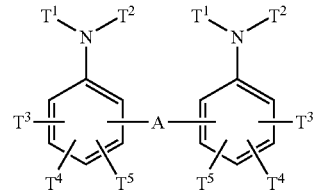  (b)

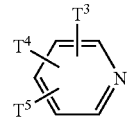  (c)

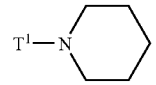  (d)

  (e)

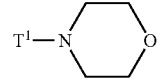  (f)

  (g)

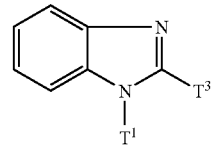  (h)

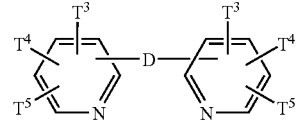  (i)

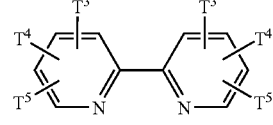  (j)

-continued

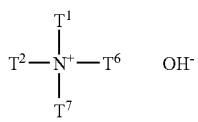

(k)

wherein $T^1$, $T^2$, and $T^7$ independently represent a hydrogen atom, an optionally substituted alkyl group, an optionally substituted cycloalkyl group, or an optionally substituted aryl group, $T^3$, $T^4$, and $T^5$ independently represent a hydrogen atom, an optionally substituted alkyl group, an optionally substituted cycloalkyl group, an optionally substituted aryl group, or an optionally substituted alkoxy group, and $T^6$ represents an optionally substituted alkyl group or an optionally substituted cycloalkyl group, D represents an alkylene group, a carbonyl group, an imino group, a sulfide group, or a disulfide group.

These alkyl, cycloalkyl, aryl, and alkoxy groups are the same as above, although alkyl and alkoxy groups with about 1 to 6 carbons are preferred, cycloalkyl group with about 5 to 10 carbons is preferred, and aryl group with about 6 to 10 carbons is preferred.

The substituent of these alkyl, cycloalkyl, aryl, and alkoxy groups independly a hydroxy group, an amino group which are substituted with an alkyl group with about 1 to 4 carbons, or an alkoxy group with about 1 to 6 carbons is preferred.

The alkylene group with about 2 to 6 carbons is preferred.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methylmidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-(trifluoromethyl)phenyltrimethylammonium hydroxide, and choline.

Furthermore, hindered amine compounds with a piperidine skeleton such as those disclosed in JP-A-H11-52575 can be used as a quencher.

The use of compounds represented by the formula (k) as the quencher in particular is preferable for the purposes of better resolution.

Specific examples include tetramethylammonium hydroxide, tetrabutylammonium hydroxide, tetrahexylammonium hydroxide, tetraoctylammonium hydroxide, phenyltrimethylammonium hydroxide, and 3-trifluoromethyl-phenyl trimethylammonium hydroxide.

In the present chemically amplified resist composition, the content of the resin for the chemically amplified resist composition is usually in the range of about 80 to 99.9 wt %, and the content of the acid generator is usually in the range of about 0.1 to 20 wt %, based on the total amount of solids.

The content of the basic compound serving as a quencher in the chemically amplified resist composition, if used, is usually in the range of about 0.01 to 1 wt %, based on the total amount of solids in the composition.

The chemically amplified resist composition can also include small amounts of various additives such as sensitizers, dissolution inhibitors, other resins, surfactants, stabilizers, and dyes, as needed.

The resist composition of the present invention is usually a resist solution, with the various ingredients above dissolved in a solvent, and is applied onto a substrate such as a silicon wafer.

The solvent used here can be any solvent that is commonly used in the field and that dissolves the ingredients, dries at a suitable rate, and results in a smooth, uniform film after evaporating off.

Examples thereof include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as y-butyrolactone. These solvents can be used alone or in combination of two or more.

The resist film that results after being applied onto the substrate and dried is exposed to light for patterning, is then heated to facilitate the deprotection reaction, and is then developed with an alkali developer.

The alkali developer used here can be a variety of alkaline aqueous solutions used in the field and, in general, an aqueous solution of tetramethylammonium hydroxide or (2-hydroxyethyl)trimethylammonium hydroxide (commonly known as choline) is often used.

The chemically amplified resist composition of the present invention can also be used in immersion lithography.

Because the structural unit represented by the formula (I) and the structural unit represented by the formula (V) have a hydroxyl group and are highly hydrophilic, and because the acid-labile group contained in the resin is also highly hydrophobic, the proportion of these structural units and the hydrophobic substituents in the resin can be adjusted to bring about photoresist surface hydrophobicity suitable for immersion lithography.

Embodiments of the invention were illustrated above, but the embodiments of the invention shown above are only examples, and the scope of the invention is not limited to these embodiments. The scope of the invention is shown by the claims, and furthermore includes all modifications within the sense and scope equivalent to what is stated in the Claims.

EXAMPLES

The chemically amplified resist composition of the present invention will be described more specifically by way of examples, which are not construed to limit the scope of the present invention.

All percentages and parts expressing the content or amounts used in the examples and comparative examples are based on weight, unless otherwise specified.

The weight average molecular weight is a value determined by gel permeation chromatography (Toso Co. ltd. HLC-8120GPC type, coulum:three of TSK gel Multipore HXL-M, solvent: tetrahydrofuran) using polystyrene as the standard product.

The structures of the compounds were verified by NMR (Nippon electric, GX-270 type or EX-270 type) and mass analysis (LC:Agilent 1100 type, MASS:Agilent LC/MSD type or LC/MSD TOF type).

Acid generator Synthesis Example 1

Synthesis of triphenylsulfonium 4-oxo-1-adamantyloxycarbonyl difluoromethanesulfonate (Acid generator B1)

(1) To 100 parts of methyl difluoro(fluorosulfonyl)acetate ester and 250 parts of ion-exchanged water, 230 parts of 30% sodium hydroxide aqueous solution was added in the form of drops in an ice bath. The resultant mixture was refluxed for 3 hours at 100° C., cooled, and then neutralized with 88 parts concentrated hydrochloric acid. The resulting solution was concentrated, giving 164.8 parts of sodium difluorosulfoacetate (containing inorganic salt: 62.6% purity).

(2) 5.0 parts of the sodium difluorosulfoacetate (62.8% purity), 2.6 parts of 4-oxo-1-adamantanol, and 100 parts of ethylbenzene were mixed, and 0.8 part of concentrated sulfuric acid was added thereto, and the resultant mixture was heated to reflux for 30 hours. The reaction mixture was cooled, and filtered to obtain solids. The solids were washed with tert-butyl methyl ether, giving 5.5 parts of sodium salt of difluorosulfoacetic acid-4-oxo-1-adamantyl ester. $^1$H-NMR analysis revealed a purity of 35.6%.

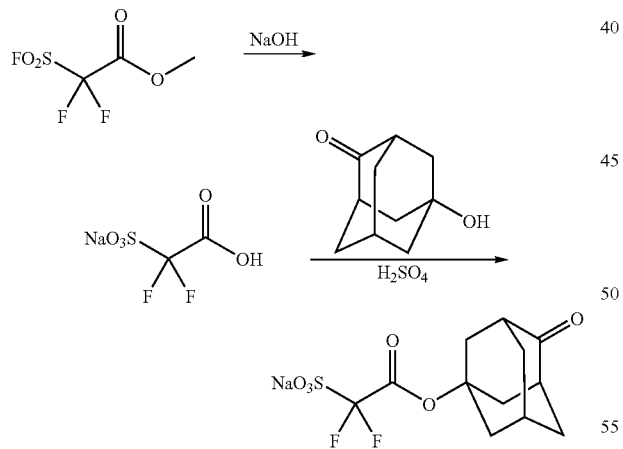

$^1$H-NMR (dimethyl sulfoxide-$d_6$, internal standard material: tetramethylsilane): δ (ppm) 1.84 (d, 2H, J=13.0 Hz); 2.00 (d, 2H, J=11.9 Hz); 2.29-2.32 (m, 7H); 2.54 (s, 2H).

(3) To 5.4 parts (35.6% purity) of the sodium salt of difluorosulfoacetic acid-4-oxo-1-adamantyl ester, a mixture of 16 parts of acetonitrile and 16 parts of ion-exchanged water was added. To the mixture, a solution of 1.7 parts of triphenylsulfonium chloride, 5 parts of acetonitrile, and 5 parts of ion-exchanged water was added. The resultant mixture was stirred for 15 hours, then concentrated, and extracted with 142 parts of chloroform. The organic layer was washed with ion-exchanged water, and the resulting organic layer was concentrated. The concentrate was washed with 24 parts of tert-butyl methyl ether, giving 1.7 parts of triphenylsulfonium 4-oxo-1-adamantyloxycarbonyldifluromethanesulfonate (B1) in the form of a white solid.

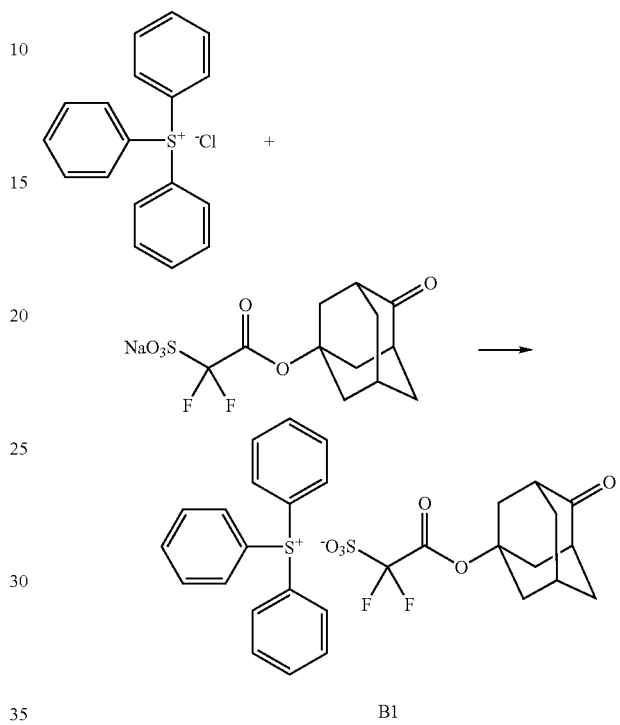

B1

$^1$H-NMR (dimethyl sulfoxide-$d_6$, internal standard material: tetramethylsilane): δ (ppm) 1.83 (d, 2H, J=12.7 Hz); 2.00 (d, 2H, J=12.0 Hz); 2.29-2.32 (m, 7H); 2.53 (s, 2H); 7.75-7.91 (m, 15H).

MS(ESI($^+$) Spectrum):M$^+$263.2 ($C_{18}H_{15}S^+$=263.09)

MS(ESI($^-$) Spectrum):M$^-$323.0 ($C_{12}H_{13}F_2O_6S^-$=323.04)

The monomers used in examples below are follows.

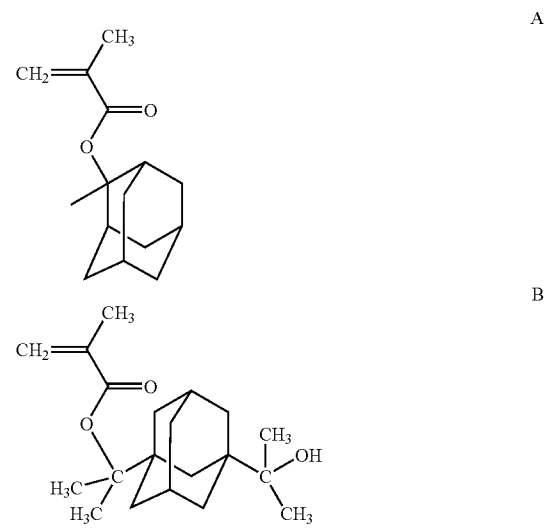

-continued

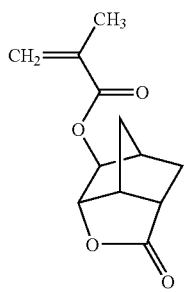

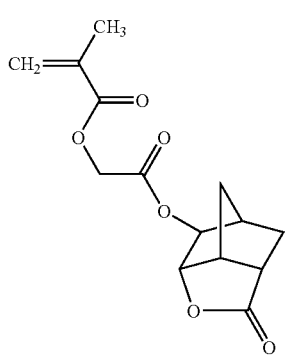

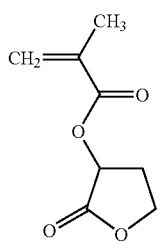

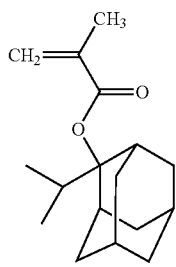

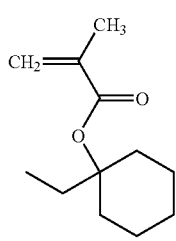

-continued

D

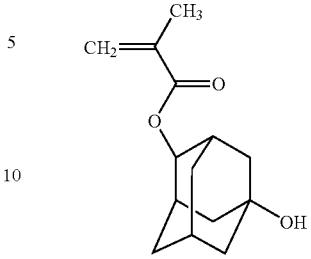

E

Resin Synthesis Example 1

Resin A1

8.70 g of monomer A, 11.90 g of monomer B, 6.94 g of monomer E, and 4.21 g of monomer F were mixed (molar ratio 30:30:20:20), and dioxane was added thereto in an amount equal to 2.6 weight times of the total amount of monomers, giving a solution. Azobisisobutyronitrile was added as an initiator thereto in an amount of 2.5 mol % with respect to the entire amount of monomers, and the resultant mixture was heated for about 5 hours at 84° C. After being cooled, the reaction solution was poured while stirred into a mixture of 330 g of methanol and 83 g of ion-exchanged water, and the precipitated resin was collected by filtration. The resin was introduced into 206 g methanol, and the mixture was stirred, and then the resin was collected by filtration. These operations were repeated two more times. The resin was then dried at reduced pressure, giving 24.0 g (76% yield) of copolymer having a weight average molecular weight of about 15,300. This copolymer, which had the structural units of the following formulae, was designated Resin A1.

G

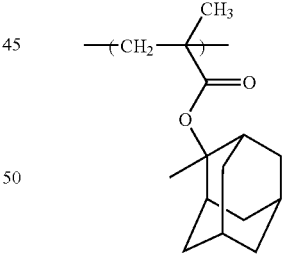

H

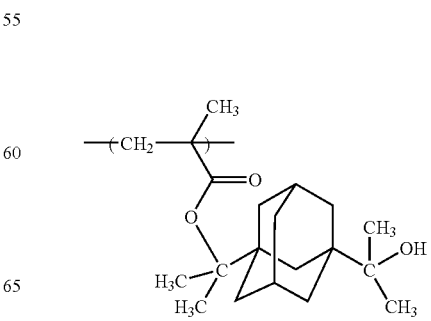

-continued

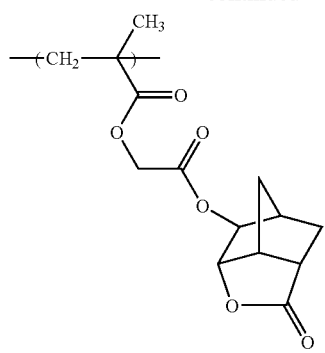

Resin Synthesis Example 2

Resin A2

9.10 g of monomer A, 12.45 g of monomer B, 5.75 g of monomer D, and 4.41 g of monomer F were mixed (molar ratio 30:30:20:20), and dioxane was added thereto in an amount equal to 2.6 weight times of the total amount of monomers, giving a solution. Azobisisobutyronitrile was added as an initiator thereto in an amount of 2.5 mol % with respect to the entire amount of monomers, and the resultant mixture was heated for about 5 hours at 84° C. After being cooled, the reaction solution was poured while stirred into a mixture of 330 g of methanol and 82 g of ion-exchanged water, and the precipitated resin was collected by filtration. The resin was introduced into 206 g of methanol, and the mixture was stirred, and then the resin was collected by filtration. These operations were repeated two more times. The resin was then dried at reduced pressure, giving 24.7 g (75% yield) of copolymer having a weight average molecular weight of about 14,700. This copolymer, which had the structural units of the following formulae, was designated Resin A2.

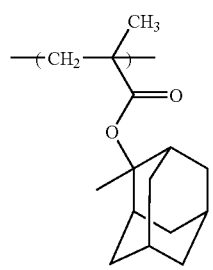

-continued

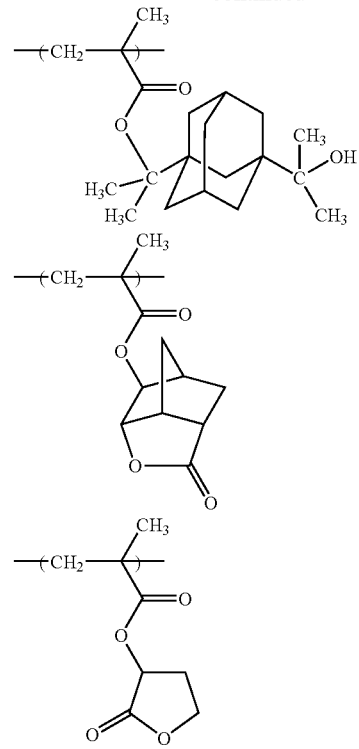

Resin Synthesis Example 3

Resin A3

15.00 g of monomer A, 12.31 g of monomer B and 4.36 g of monomer F were mixed (molar ratio 50:30:20), and dioxane was added thereto in an amount equal to 2.6 weight times of the total amount of monomers, giving a solution. Azobisisobutyronitrile was added as an initiator thereto in an amount of 2.5 mol % with respect to the entire amount of monomers, and the resultant mixture was heated for about 5 hours at 84° C. After being cooled, the reaction solution was poured while stirred into a mixture of 329 g of methanol and 82 g of ion-exchanged water, and the precipitated resin was collected by filtration. The resin was introduced into 206 g of methanol, and the mixture was stirred, and then the resin was collected by filtration. These operations were repeated two more times. The resin was then dried at reduced pressure, giving 22.3 g (71% yield) of copolymer having a weight average molecular weight of about 14,800. This copolymer, which had the structural units of the following formulae, was designated Resin A3.

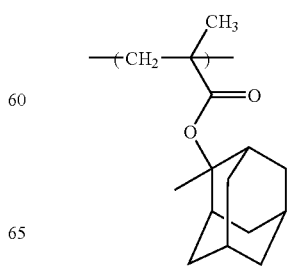

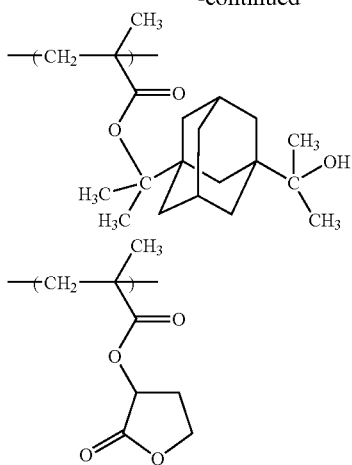

Resin Synthesis Example 4

Resin A4

A mixture solution of 8.45 parts of monomer B, 11.93 parts of monomer E, 26.60 parts of monomer G, 3.98 parts of monomer H, and 2.87 parts of monomer I, 0.33 parts of azobisisobutyronitrile, and 1.51 parts of azobis-2,4-dimethylvaleronitrile and 40.38 parts of 1,4-dioxane was added to 13.46 parts of 1,4-dioxane which was heated at 73 °C., in the form of drops for 1 hour, giving a mixture solution. The resulting mixture was kept for about 5 hours at 73° C. After being cooled, the reaction solution was diluted with 86.14 parts of 1,4-dioxane. The resulting solution was poured while stirred into a mixture of 560 parts of methanol and 140 parts of ion-exchanged water, and the precipitated resin was collected by filtration. There operations were repeated two more times. The resulting resin was then dried at reduced pressure, giving 39.3 parts (73% yield) of copolymer having a weight average molecular weight of about 8,600. This copolymer, which had the structural units of the following formulae, was designated Resin A4.

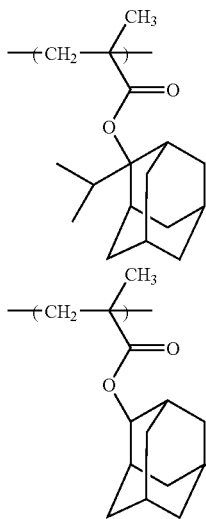

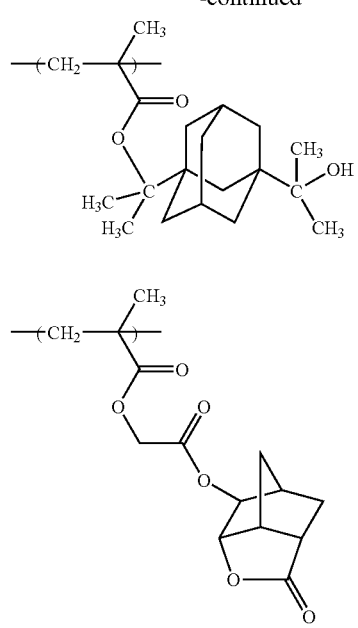

Resin Synthesis Example 5

Resin A5

A mixture solution of 14.49 parts of monomer E, 3.97 parts of monomer F, 17.50 parts of monomer G, 2.45 parts of monomer H, and 2.96 parts of monomer I, 0.27 parts of azobisisobutyronitrile, and 1.24 parts of azobis-2,4-dimethylvaleronitrile and 37.23 parts of 1,4-dioxane was added to 24.82 parts of 1,4-dioxane which was heated at 72 °C., in the form of drops for 1 hour, giving a mixture solution. The resulting mixture was kept for about 5 hours at 72° C. After being cooled, the reaction solution was diluted with 45.51 parts of 1,4-dioxane. The resulting solution was poured while stirred into a mixture of 430 parts of methanol and 108 parts of ion-exchanged water, and the precipitated resin was collected by filtration. The resulting resin was mixed with 269 parts of methanol, and then the resin was collected by filtration. There operations were repeated two more times. The resulting resin was then dried at reduced pressure, giving 29.9 parts (72% yield) of copolymer having a weight average molecular weight of about 8,300. This copolymer, which had the structural units of the following formulae, was designated Resin A5.

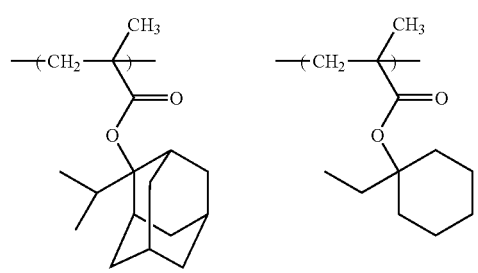

-continued

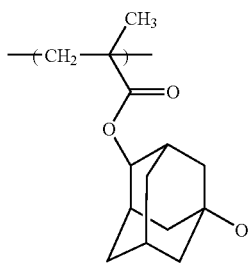

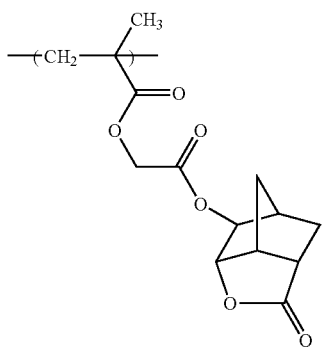

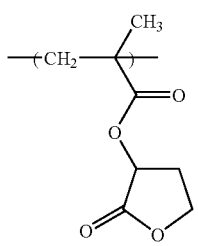

Examples 1 and 2, and Comparative Example 1

The ingredients shown in Table 1 were mixed and dissolved, and were furthermore filtered with a fluororesin filter having a pore diameter of 0.2 μm to prepare resist liquids.

| Q1: 2,6-diisopropyl aniline, Solvent: Y1 | |
|---|---|
| Propylene glycol monomethyl ether acetate | 120 parts |
| 2-heptanone | 35.0 parts |
| Propylene glycol monomethyl ether | 20 parts |
| γ-butyrolactone | 3.5 parts |

"ARC-29" which is a composition for an organic antireflective film, by Nissan Chemical Industries, Ltd., was applied onto silicon wafers and baked for 60 seconds at 205° C. to form a 780 Å (78 nm) thick organic antireflective film.

The above resist liquids were then applied thereon by spin coating to a dry film thickness of 0.15 μm.

The wafers were then pre-baked for 60 sec on a direct hot plate at the temperatures given in the "PB" column in Table 1.

Line and space patterns were then exposed through stepwise changes in exposure quantity using an ArF excimer stepper ("FPA5000-AS3" by Canon: NA=0.75 ⅔ annular) on the wafers on which resist films had thus been formed.

The exposure was followed by 60 seconds of post-exposure baking on a hot plate at the temperatures given in the "PEB" column in Table 1.

This was followed by 60 sec of puddle development with 2.38 wt % tetramethylammonium hydroxide aqueous solution.

Table 1 also gives the results of scanning electron microscopy of the developed dark field pattern on the organic antireflective film substrate.

The dark field pattern referred to here is a pattern in which the resist layer remains around the line and space pattern following exposure and development, as obtained by exposure and development through a reticle in which lines based on a chrome layer (light-blocking layer) were formed on the outside of a glass surface (the component through which the light is transmitted).

TABLE 1

| Ex. No. | Resin (parts) | Acid Generator (parts) | Quencher (parts) | Solvent | PB/PEB | Resolution (nm) |
|---|---|---|---|---|---|---|
| Ex. 1 | A1/10 | B1/0.75 | Q1/0.06 | Y1 | 100° C./100° C. | 90 |
| Ex. 2 | A2/10 | B1/0.75 | Q1/0.06 | Y1 | 100° C./100° C. | 90 |
| Comp. Ex. 1 | A3/10 | B1/0.75 | Q1/0.06 | Y1 | 100° C./100° C. | 95 |

The comparative example clearly shows that the resolution was inadequate in the resin resist composition lacking the structural unit with a polycyclic lactone structure.

The examples of the invention, on the other hand, were confirmed to provide adequate effective sensitivity and resolution. The invention can thus be used in ArF excimer laser lithography as well as in ArF excimer laser immersion lithography with water media, and thereby provide high-performance resist patterns.

Examples 3 & 4 and Comparative Example 2 & 3

The ingredients shown in Table 2 were mixed and dissolved, and were furthermore filtered with a fluororesin filter having a pore diameter of 0.2 μm to prepare resist liquids.

TABLE 2

| Ex. No. | Resin (parts) | Acid Generator (parts) | Quencher (parts) | Solvent |
|---|---|---|---|---|
| Ex. 3 | A4/10 | B1/0.5 | Q1/0.012 | Y3 |
| Ex. 4 | A4/10 | B1/0.5 | Q1/0.065 | Y4 |
| Comp. Ex. 2 | A5/10 | B1/0.5 | Q1/0.1 | Y3 |
| Comp. Ex. 3 | A5/10 | B1/0.5 | Q1/0.065 | Y4 |

Q1: 2,6-diisopropyl aniline,
Solvents Y3 and Y4:
Y3:

| | |
|---|---|
| Propylene glycol monomethyl ether acetate | 80 parts |
| 2-heptanone | 35 parts |
| Propylene glycol monomethyl ether | 20 parts |
| γ-butyrolactone | 3 parts |

Y4:

| | |
|---|---|
| Propylene glycol monomethyl ether acetate | 250 parts |
| 2-heptanone | 35 parts |
| Propylene glycol monomethyl ether | 20 parts |
| γ-butyrolactone | 3 parts |

"ARC-29A-8" which is a composition for an organic antireflective film, by Brewer, was applied onto silicon wafers and baked for 60 seconds at 205° C. to form a 780 Å (78 nm) thick organic antireflective film.

The above resist liquids were then applied thereon by spin coating to a dry film thickness given in the "Thickness" column in Table 3.

The wafers were then pre-baked for 60 sec on a direct hot plate at the temperatures given in the "PB" column in Table 3.

The wafers on which resist films had thus been formed were then exposed under the exposure condition given in Table 3 using an ArF excimer stepper ("FPA5000-AS3" by Canon: NA=0.75), respectively. The resist films in Example 3 and Comparative Example 2 were exposed a hole pattern using a mask of a hole pattern (pitch: 210 nm, hole: 130 nm), the resist films in Example 4 and Comparative Example 3 were exposed a line pattern using a mask of a 1:1 line pattern (pitch: 170 nm).

The exposure was followed by 60 seconds of post-exposure baking at the temperatures given in the "PEB" column in Table 3.

This was followed by 60 sec of puddle development with 2.38 wt % tetramethylammonium hydroxide aqueous solution.

Tables 4 and 5 give the results of scanning electron microscopy of the resulting pattern.

TABLE 3

| Ex. No. | Thickness (nm) | PB | PEB | Condition of Exposure |
|---|---|---|---|---|
| Ex. 3 | 200 | 110 | 90 | σ = 0.8, Conventional |
| Ex. 4 | 95 | 100 | 95 | 3/4 Annular |
| Comp. Ex. 2 | 200 | 110 | 90 | σ = 0.8, Conventional |
| Comp. Ex. 3 | 95 | 100 | 95 | 3/4 Annular |

TABLE 4

| Ex. No. | EL (nm · cm²/mJ) | MEEF | Iso/Dense Bias | DOF (μm) |
|---|---|---|---|---|
| Ex. 3 | 4.0 | 4.13 | −87 | 0.3 |
| Comp. Ex. 2 | 7.2 | 4.23 | −69 | 0.1 |

Table 4:
Exposure Latitude (EL) was shown as an inclination of a hole size to an exposure energy. The nearer zero the value, the better the pattern.

MEEF was shown as an inclination of a hole size to a mask size (127 nm to 134 nm) having a pitch of 210 nm. The value smaller, the better the pattern.

Iso/Dense Bias was shown as an inclination of a hole size to the natural logarithm of a pitch size (205 nm to 235 nm) having 130 nm of a mask size. The value smaller, the better the pattern.

Depth of Focus (DOF) was shown as a focus width being 120 nm to 110 nm of a hole size on the resist after exposing using a halftone mask (pitch: 210 nm and mask size: 130 nm) and developing. The value larger, the better the pattern.

TABLE 5

| Ex. No. | Resolution (nm) | EL (nm · cm²/mJ) | MEEF |
|---|---|---|---|
| Ex. 4 | 76 | −4.1 | 3.69 |
| Comp. Ex. 3 | 86 | −4.5 | 4.24 |

Table 5:
Exposure Latitude (EL) was shown as an inclination of a line width of a resist film to an exposure energy. The nearer zero the value, the better the pattern.

MEEF was shown as an inclination of the line width of the resist film to a mask size (83 nm to 87 nm) having a pitch of 170 nm. The value smaller, the better the pattern.

The chemically amplified resist composition of the present invention exhibits high resolution and can therefore be used as a chemically amplified resist composition as well as an immersion lithography chemically amplified resist composition which are suitable for ArF, KrF, or other excimer laser lithography as well as ArF immersion lithography.

This application claims priority to Japanese Patent Application No. 2008-052069. The entire disclosure of Japanese Patent Application No. 2008-052069 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A chemically amplified resist composition, comprising:
a resin which includes
a structural unit having an acid-labile group in a side chain,
a structural unit represented by the formula (I):

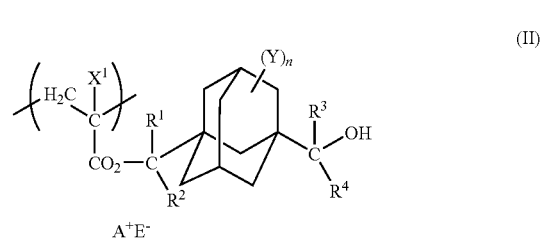

wherein $X^1$ represents a hydrogen atom, a $C_1$ to $C_4$ alkyl group, or a $C_1$ to $C_4$ perfluoroalkyl group, Y in each occurrence independently represent a hydrogen atom or an alkyl group, and n is an integer of 1 to 14, $R^1$, $R^2$, $R^3$ and $R^4$ independently represent a hydrogen atom, an alkyl group, or a haloalkyl group, and a structural unit having a polycyclic lactone structure, and which is soluble in an organic solvent and insoluble or poorly soluble in an alkali aqueous solution but rendered soluble in an alkali aqueous solution by the action of an acid; and an acid generator represented by the formula (II):

$$A^+E^- \quad (II)$$

wherein $A^+$ represents an organic counterion, $E^-$ represents $CF_3SO_3^-$, $C_2F_5SO_3^-$, $C_4F_9SO_3$, $N(SO_2C_2F_5)_2^-$, $N(SO_2C_4F_9)_2^-$, $N(SO_2C_6H_5)_2^-$, $C(SO_2CF_3)_3^-$, $R^{21}O(CO)C(Y^1)(Y^2)SO_3^-$ wherein $R^{21}$ represents an optionally substituted $C_1$ to $C_{30}$ hydrocarbon group, in which at least one methylene group may be optionally substituted with a carbonyl group or an oxygen atom, and $Y^1$ and $Y^2$ independently represent a fluorine atom or a $C_1$ to $C_6$ perfluoroalkyl group; and wherein the structural unit having the polycyclic lactone structure is at least one structual unit selected from the group consisting of a structual units represented by the formulae (IVa), (IVb) and (IVc),

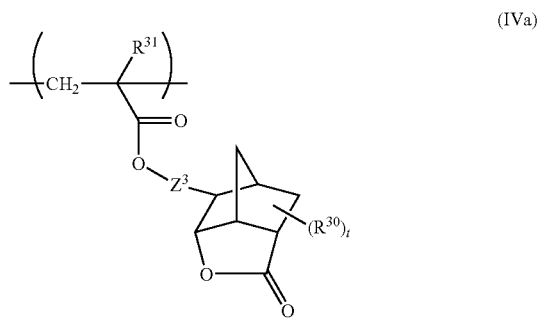

(IVa)

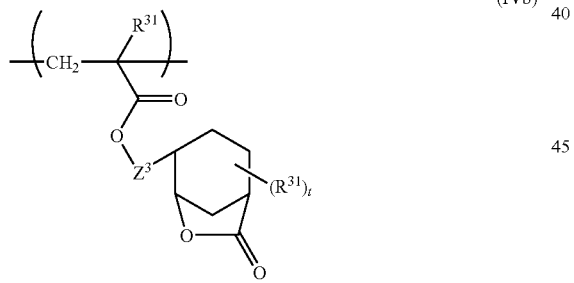

(IVb)

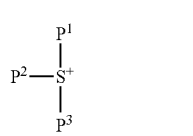

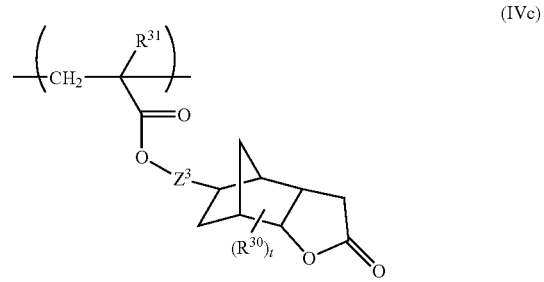

(IVc)

wherein $R^{30}$ in each occurrence represent a $C_1$ to $C_4$ alkyl, a carboxyl group or a cyano group, $R^{31}$ represents a $C_1$ to $C_4$ alkyl group, t represents an integer of 0 to 3, $Z^3$ represents a single bond or a —[$CH_2$]$_k$—COO— group, and k represents an integer of 1 to 4.

2. The chemically amplified resist composition of claim 1, wherein the acid generator is at least one compound selected from the group consisting of a compound represented by the formula (VI),

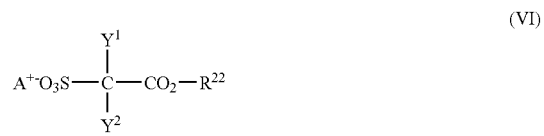

(VI)

wherein $R^{22}$ represents an optionally substituted $C_1$ to $C_{20}$ linear or branched chain hydrocarbon group or an optionally substituted $C_3$ to $C_{30}$ cyclic hydrocarbon group, wherein at lest one methylene group in the hydrocarbon group and the cyclic hydrocarbon group may be optionally substituted with a carbonyl group or an oxygen atom, $A^+$ represents an organic counterion, and $Y^1$ and $Y^2$ independently represent a fluorine atom or a $C_1$ to $C_6$ perfluoroalkyl group.

3. The chemically amplified resist composition of claim 1, wherein the $A^+$ of the formula (II) is at least one cation selected from the group consisting of a cation represented by the formulae (VIIa), (VIIb), (VIIc) and (VIId);

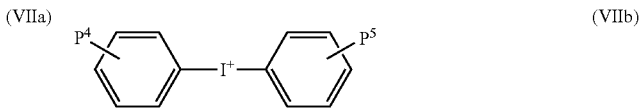

(VIIa) (VIIb)

(VIIc)

-continued

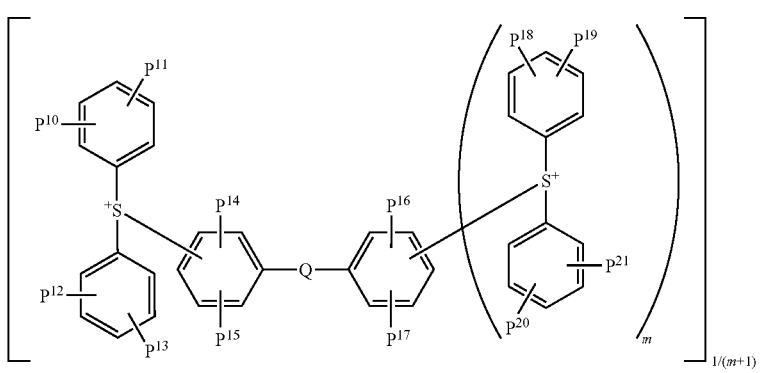
(VIId)

wherein $P^1$ to $P^3$ independently represent a $C_1$ to $C_{30}$ alkyl group or a $C_3$ to $C_{30}$ cyclic hydrocarbon group, and when $P^1$ to $P^3$ are alkyl groups, they may have at least one substituent selected from the group consisting of a hydroxyl group, a $C_1$ to $C_{12}$ alkoxy group, and a $C_3$ to $C_{12}$ cyclic hydrocarbon group, and when $P^1$ to $P^3$ are cyclic hydrocarbon groups, they may have at least one substituent selected from the group consisting of a hydroxyl group, a $C_1$ to $C_{12}$ alkyl group, and a $C_1$ to $C_{12}$ alkoxy group;

$P^4$ and $P^5$ independently represent a hydrogen atom, a hydroxyl group, a $C_1$ to $C_{12}$ alkyl group or a $C_1$ to $C_{12}$ alkoxy group, $P^6$ and $P^7$ independently represent a $C_1$ to $C_{12}$ alkyl group or a $C_3$ to $C_{12}$ cycloalkyl group, or $P^6$ and $P^7$ are bonded to form a divalent $C_3$ to $C_{12}$ hydrocarbon group, $P^8$ is a hydrogen atom and $P^9$ represents a $C_1$ to $C_{12}$ alkyl group, a $C_3$ to $C_{12}$ cycloalkyl group, or an optionally substituted aromatic cyclic group, or $P^8$ and $P^9$ are bonded to form a divalent $C_3$ to $C_{12}$ hydrocarbon group;

$P^{10}$ to $P^{21}$ independently represent a hydrogen atom, a hydroxyl group, a $C_1$ to $C_{12}$ alkyl group or a $C_1$ to $C_{12}$ alkoxy group, Q represents a sulfur atom or an oxygen atom, m represents 0 or 1.

4. The chemically amplified resist composition of claim 1, wherein the $A^+$ of the formula (II) is at least one cation selected from the group consisting of a cation represented by the formulae (VIIe), (VIIf) and (VIIg);

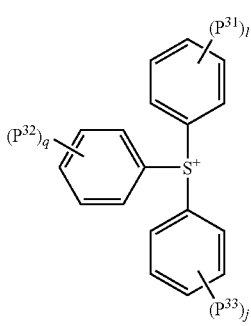
(VIIe)

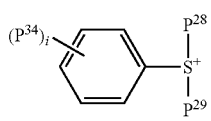
(VIIg)

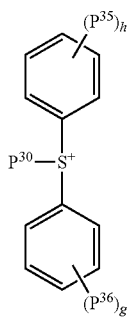
(VIIf)

wherein $P^{28}$ to $P^{30}$ independently represent a $C_1$ to $C_{20}$ alkyl group or a $C_3$ to $C_{30}$ cyclic hydrocarbon group other than phenyl, and when $P^{28}$ to $P^{30}$ are alkyl groups, they may have at least one substituent selected from the group consisting of a hydroxyl group, a $C_1$ to $C_{12}$ alkoxy group, and a $C_3$ to $C_{12}$ cyclic hydrocarbon group, and when $P^{28}$ to $P^{30}$ are cyclic hydrocarbon groups, they may have at least one substituent selected from the group consisting of a hydroxyl group, a $C_1$ to $C_{12}$ alkyl group, and a $C_1$ to $C_{12}$ alkoxy group, $P^{31}$ to $P^{36}$ independently represent a hydroxyl group, a $C_1$ to $C_{12}$ alkyl group, a $C_1$ to $C_{12}$ alkoxy group, or a $C_3$ to $C_{12}$ cyclic hydrocarbon group, and l, q, j, i, h and g independently represent an integer of 0 to 5.

5. The chemically amplified resist composition of claim 1, wherein the $A^+$ of the formula (II) is a cation represented by the formula (VIIh);

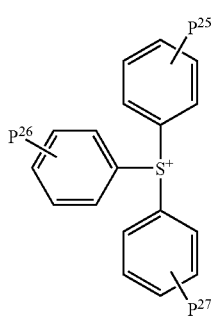
(VIIh)

wherein $P^{25}$ to $P^{27}$ independently represent a hydrogen atom, a hydroxyl group, a $C_1$ to $C_{12}$ alkyl group, or a $C_1$ to $C_{12}$ alkoxy group.

6. The chemically amplified resist composition of claim 1, wherein the $A^+$ of the formula (II) is a cation represented by the formula (VIIi);

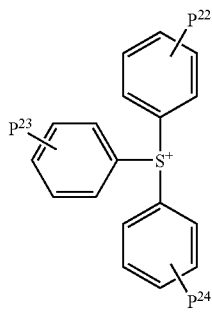

(VIIi)

wherein $P^{22}$ to $P^{24}$ independently represent a hydrogen atom, or a $C_1$ to $C_4$ alkyl group.

7. The chemically amplified resist composition of claim 1, wherein the resin further comprises a structural unit represented by the formula (V),

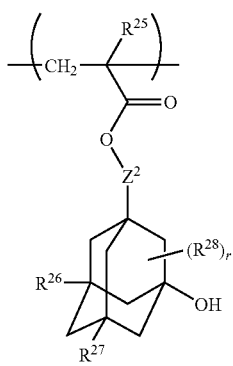

(V)

wherein $R^{25}$ represents a hydrogen atom or a methyl group, $R^{26}$ and $R^{27}$ independently represent a hydrogen atom, a methyl group, or a hydroxyl group, $R^{28}$ represents a methyl group, r represents an integer of 0 to 12, $Z^2$ represents a single bond or a —$[CH_2]_k$—COO— group, and k represents an integer of 1 to 4.

8. The chemically amplified resist composition of claim 1, which further contains a basic compound.

9. A chemically amplified resist composition for immersion lithography comprising a chemically amplified resist composition of claim 1.

10. An immersion lithography method that utilizes therein a chemically amplified resist composition of claim 1.

11. The chemically amplified resist composition of claim 1, wherein the structural unit having a polycyclic lactone structure is represented by the formula (IVa),

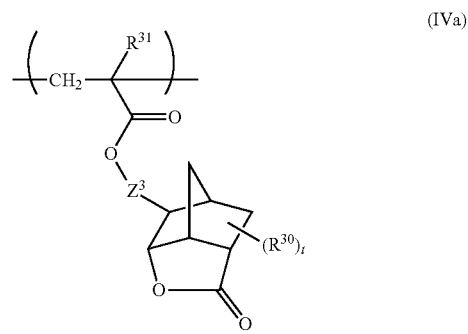

(IVa)

wherein $R^{30}$, $R^{31}$, t and $Z^3$ have the same meanings as defined above.

12. The chemically amplified resist composition of claim 1, wherein the resin further includes a structural unit having at least one monocyclic lactone structure selected from the group consisting of structural units represented by the formulae (VIIIa) to (VIIIc),

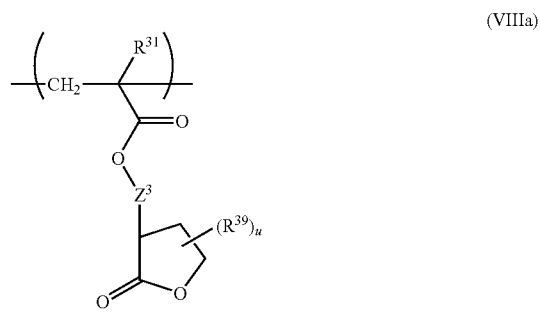

(VIIIa)

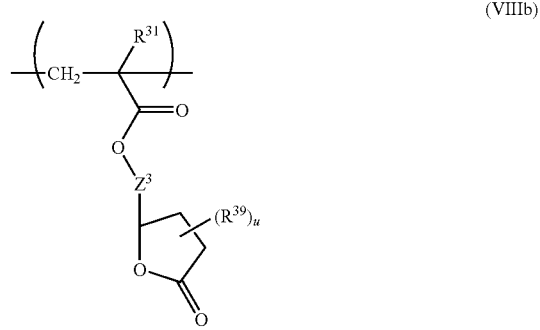

(VIIIb)

(VIIIc)

wherein $R^{31}$ represents a hydrogen atom or a methyl group, and $R^{39}$ represents a methyl group, u represents an integer of 0 to 5, t represents an integer of 0 to 3, and t' represents an integer of 0 to (2t +2), $Z^3$ represents a single bond or a —$[CH_2]_k$—COO— group, and k represents an integer of 1 to 4.

* * * * *